United States Patent
Perera et al.

(10) Patent No.: US 8,093,582 B2
(45) Date of Patent: Jan. 10, 2012

(54) DUAL BAND PHOTODETECTOR

(75) Inventors: A. G. Unil Perera, Mableton, GA (US); Steven George Matsik, Chamblee, GA (US)

(73) Assignee: Georgia State University Research Foundation, Inc., Atlanta, GA (US)

(*) Notice: Subject to any disclaimer, the term of this patent is extended or adjusted under 35 U.S.C. 154(b) by 0 days.

(21) Appl. No.: 12/907,518

(22) Filed: Oct. 19, 2010

(65) Prior Publication Data

US 2011/0049566 A1    Mar. 3, 2011

Related U.S. Application Data

(62) Division of application No. 11/585,048, filed on Oct. 23, 2006, now Pat. No. 7,838,869.

(60) Provisional application No. 60/729,163, filed on Oct. 21, 2005.

(51) Int. Cl.
    *H01L 29/06*     (2006.01)

(52) U.S. Cl. ....... 257/21; 257/184; 257/440; 250/338.4; 250/339.02; 250/372

(58) Field of Classification Search .............. 257/9–39, 257/183–201, 431–466, 613–615
See application file for complete search history.

(56) References Cited

U.S. PATENT DOCUMENTS

| | | | |
|---|---|---|---|
| H000101 H | 8/1986 | Walker | |
| 5,063,419 A | 11/1991 | Glaser et al. | |
| 5,281,205 A | 1/1994 | McPherson | |
| 5,296,720 A | 3/1994 | Wen et al. | |
| 5,352,904 A | 10/1994 | Wen et al. | |
| 5,510,627 A | 4/1996 | Snow | |
| 5,528,051 A | 6/1996 | Nuyen | |
| 5,563,423 A | 10/1996 | Wu et al. | |
| 5,951,512 A | 9/1999 | Dalton | |
| 5,989,216 A | 11/1999 | Johnson et al. | |
| 6,130,466 A * | 10/2000 | Schneider et al. | 257/440 |
| 6,137,123 A * | 10/2000 | Yang et al. | 257/184 |
| 6,184,538 B1 | 2/2001 | Bandara et al. | |
| 6,213,973 B1 | 4/2001 | Eliasen et al. | |
| 6,265,727 B1 | 7/2001 | Kozodoy et al. | |
| 6,407,439 B1 * | 6/2002 | Hier et al. | 257/440 |
| 6,642,537 B1 | 11/2003 | Gunapala et al. | |
| 6,674,091 B2 | 1/2004 | Gunapala et al. | |

(Continued)

FOREIGN PATENT DOCUMENTS

WO      02/33757      4/2002

(Continued)

OTHER PUBLICATIONS

Adachi, S. "GaAs, AlAs, and $Al_xGa_{1-x}As$: Material parameters for use in research and device applications."J. Appl. Phys. 5(3):R1-R29 (1985).

(Continued)

*Primary Examiner* — Kiesha Bryant
*Assistant Examiner* — Eric Ward
(74) *Attorney, Agent, or Firm* — Thomas, Kayden, Horstemeyer & Risley, LLP

(57) ABSTRACT

A dual band photodetector for detecting infrared and ultraviolet optical signals is disclosed. Aspects include homojunction and heterojunction detectors comprised of one or more of GaN, AlGaN, and InGaN. In one aspect ultraviolet/infrared dual-band detector is disclosed that is configured to simultaneously detect UV and IR.

17 Claims, 25 Drawing Sheets

U.S. PATENT DOCUMENTS

| | | | |
|---|---|---|---|
| 6,875,975 B2 | 4/2005 | Faska et al. | |
| 7,253,432 B2 | 8/2007 | Perera et al. | |
| 7,329,895 B2 | 2/2008 | Cole et al. | |
| 7,381,966 B2 | 6/2008 | Starikov et al. | |
| 7,566,942 B2 | 7/2009 | Viens et al. | |
| 2005/0205857 A1 | 9/2005 | Sundaram et al. | |
| 2005/0258415 A1 | 11/2005 | Perera et al. | |
| 2006/0108528 A1* | 5/2006 | Qiu | 250/338.4 |

FOREIGN PATENT DOCUMENTS

WO   WO 02/33757   *   4/2002

OTHER PUBLICATIONS

Amtout A. et al. "Theoretical modeling and experimental characterization of InAsIInGaAs quantum dots in a well detector." J. Appl. Phys. 96:3782 (2004).

Ariyawansa, G. et al., "GaNIAlGaN heterojunction infrared detector responding in 8-14 and 20-70 pm ranges," Applied Physics Letters, 89(15), pp. 1-1-1-3, (2006).

Arivawansa. G. et al.. "GaNIAlGaN ultravioletlinfrared dual-band detector," Applied Physics Letters, 89(9), pp. 091 113-1-091 113-3, (2006).

Ariyawansa, G. et al., "Near- and far-infrared p-GaAs dual-band detector," Applied Physics Letters, 86(14), pp. 1435 10-1-1435 10-3, (2005).

Ariyawansa, G. et al., "Characteristics of a Si dual-band detector responding in both near- and vely-long-wavelength-infrared regions," Applied Physics Letters, 89(6), pp. 061 112-1-061 112-3, (2006).

Bergman, D. and Stockman, M. "Surface Plasmon Amplification by Stimulated Emission of Radiation: Quantum of Generation of Coherent Surface Plasmons in Nanosystems." Phys. Rev. Lett. 90(2):027402-1-4 (2003).

Binet, F. et al. "Mechanisms of recombination in GaN photodetectors." Appl. Phys. Lett. 69(9): 1202-1204 (1996).

Bogusawski, P. "Amphoteric properties of substitutional carbon impurity in GaN and A1N Appl." Phys. Lett. 69:233 (1996).

Bougrov, V. et al. Properties of Advanced Semiconductor Materials GaN, AlN, InN, BN, Sic, SiGe, edited by M. E. Levinshtein, S. L. Rumyantsev, and M. S. Shur, p. 1-30 (Wiley, NewYork, 2001).

Chakrabarti, S. et al. Characteristics of a Multicolor InGaAs-GaAs Quantum-Dot Infrared Photodetector IEEE Photon. Technol. Lett. 17(1):178-180 (2005).

Craig. J. "Finding the Light: Professor's tiny ultraviolet and infrared detectors could improve defense, health care." Article—GSU Magazine Winter 2010.

Dean, P. et al. "Valley-orbit splitting of the indirect free exciton in silicon" Phys. Rev. 184(3):837-843 (1969).

Esaev, D. et al. "High performance single emitter homojunction interfacial work function infrared detectors." J. Appl. Phys. 95(2):512-519 (2004).

Esaev, D. et al. "Design and optimization of GaAsIAlGaAs heterojunction infrared detectors." J. Appl. Phys. 96 (8):4588-4597 (2004).

Gmachl, C. et al. "Intersubbandabsorption at IE1.55 mm in well- and modulation-doped G~NOA~Gm~uNlt iple quantum wells with superlattice barriers." Appl. Phys. Lett. 77(23):3722-3724 (2000).

Goldberg, A. et al. Detection of buried land mines using a dual-band LWIRILWIRQWIP focal plane array: ZnfaredPhysics & Technology 44:42737 (2003).

Haller, E. et al. "Ge:Ga photoconductors in low infrared backgrounds." Appl. Phys. Lett. 34(8):495-497 (1979).

Hawkins, A. "Silicon heterointerface photodetector." Appl. Phys. Lett. 68(26): 3692-3694 (1996).

Huberman, M. et al. "Optical absorption by free holes in heavily doped GaAs." Phys. Rev. B 44(3):1128-1133 (1991).

Kane, M. et al. "Electron mobilities and photoelectron lifetimes in AlGaAsIGaAs andBnGaAs1GaAs quantum-well infrared detectors." J. Appl. Phys. 73(11):7966-7968 (1993).

Kawashima, T. et al. "Optical properties of hexagonal GaN."J. Appl. Phys. 82(7):3528-35 (1997).

Keller et al. "Forcast: a facility 5-40 micron camera for SOFIA." Proceedings of SPIE Proc. 4014: 86-97 (2000).

Kimukin, I. and Ozbay, E. "High-speed GaAs-basedresonant-cavityenhanced 1.3 mm photodetector" Appl. Phys. Lett. 77(24):3890-3892 (2000).

Kirkman, F. "An infrared study of the shallow acceptor states in GaAs" J. Phys. C:Solid State Physics 11 :419-433 (1978).

Korotkov, A. et al. "Low dark current far infrared detector with an optical cavity architecture." Solid State Electronics 45:87-93 (2001).

Krishna, S. et al. "Two color InAsIInGaAs dots-in-a-well detector with background-limited performance at 91 K." Appl. Phys. Lett. 82 (16):2574-2576 (2003.

Krishna, S. et al. "Three-color ($A_{,,}$-3.8 wm, $A_{,,}$-8.5 wm, and y . . . Ap,-23.2 pm) InAsIInGaAs quantum-dots-in-a-well detector." Appl. Phys. Lett. 83(14): 2745-47 (2003).

Liu, H. "Dark current in quantum well infrared photodetectors." J. Appl. Phys. 73(4):2029-2031 (1993).

Liu, H. et al. "Low dark current dual band infrared photodetector using thin AlAs barriers and fi-X mixed intersubband transition in GaAs quantum wells." Appl. Phys. Lett. 64(4):475-477 (1994).

Matsik, S. et al. "20 pm cutoff heterojunction interfacial work function internal photoemission detectors." Appl. Phys. Lett. 84(1 8):3435-37 (2004).

Merlet, F. et al. "Experimental study of the Zeeman splitting of boron levels in silicom." Phys. Rev B 12 3297-3317 (1975).

Moore, W. et al. "Zeeman spectroscopy of shallow donors in GaN." Phys. Rev. B 56(19):12073-12076 (1997).

Mosca, R. et al. "Be diffusion in molecular beam epitaxy-grown GaAs stmctures."J. Appl. Phys. 93(12): 9709-16 (2003).

Onton, A. et al. "Spectroscopic Investigation of Group-I11 Acceptor States in Silicon." Phys. Rev. 163(3): 686-703 (1967).

Perera A. and Shen, W. GaAs homojunction interfacial workfunction internal photoemission (HIWIP) far-infrared detectors. Opto-Electronics Review 7(3): 153-180 (1999).

Perera, A. and Matsik, S. "GaAsIInGaAs quantum well infrared photodetector with a cutoff wavelength at 35pm." Appl. Phys. Lett 77(5):741-743 (2000).

Perera, A. "Homojunction internal photoemission far-infrared detectors: Photoresponse performance analysis." J. Appl. Phys. 77(2): 915-24 (1995).

Perera et al. "Heterojunction wavelength-tailorable far-infrared photodetectors with response out to 70mm" Appl. Phys. Letters 78(15):2241-2243 (2001).

Perera, A. "Physics and Novel Device Applications of Semiconductor Homo Junctions." Academic Press, The Physics ofThin Films, 21, 1, 1995.

Perera, A. et al. "Demonstration of Si homojunction far-infrared detectors." Appl. Phys. Lett. 72(18): 2307-09 (1998).

Perera, A. et al. "The effects of light-heavy hole transitions on the cutoff wavelengths of far infrared detectors."Znfared Phys. Technol. 44:347-353 (2003).

Perera, A. et al. "GaAs multilayer p'-i homojunction far-infrared detectors."J. Appl. Phys. 81:3316-3319 (1997).

Petroff, M. "Detection of individual 0.4-28 pm wavelength photons via impurity-impact ionization in a solid-state photomultiplier." Appl. Phys. Lett. 51(6):406-409 (1987).

Raghavan, S. "High-responsivity, normal-incidence long-wave infrared (p-7.2 pm) InAsIIn, ,,Ga, ,,As dots-in-a-well detector." Appl. Phys. Lett. 81(8):1369-1371 (2002).

Raissia, F. and Sheenib, N. "Highly sensitive near IR detectors using n-type porous Si." Sens. Actuators A 104: 117-120 (2003). Rosenthal et al. "16 ×25 Ge:Ga Detector Arrays for FIFI LS." SPIE Proc. 4014: 156-163(2000).

Saslow, W. "Ferromagnets with weak random anisotropy." Physical Review B 35(7): 3454-3460 (Mar. 1987).

Shepherd, Jr., F. "Infrared internal emission detectors." Invited Paper SPIE 1735:250 (1992).

Stockman, M. "Nanofocusing of optical energy in taperedplasmonic waveguides." Phys. Rev. Lett. 93(13):137404 (2004).

Sturge, M. "Optical absorption of gallium arsenide between 0.6 and 2.75eV." Physical Review 127(3):768-773 (1962).

Sumiya, M. "Dependence of impurity incorporation on the polar Wu, I. C. et al. "Ion-implanted extrinsic Ge photodetectors with direction of GaN film growth." Appl. Phys. Lett. 76(15): 2098-2100 extendedcutoffWavelength."Appl. Phy. Lett. 58: 143 1-1433 (1991). (2000).

Wang, et al, ~~Magneto-opticaslt udies of GaN and GaN, violet photodetector with high internal gain."Appl. Phys. Lett. AlxGaI2xN: Donor Zeeman svectroscovv and two dimensional electron gas cyclotron resonance."J Appl. Phys. 79:8007-8010 (1996).

Wu, I. C. et al. "Ion-implanted extrinsic Ge photodetectors with extendedcutoffWavelength."Appl. Phy. Lett. 58: 143 1-1433 (1991).

Zhang, S. et al. "Backilluminated GaNOAlGaN heterojunction ultra-violet photodetector with high internal gain." Appl. Phys. Lett. 81(25):4862-4864 (2002).

* cited by examiner

DUAL BAND PHOTODETECTOR

CROSS-REFERENCE TO RELATED PATENT APPLICATION

This is a divisional patent application which claims priority to U.S. patent application Ser. No. 11/585,048, filed Oct. 23, 2006, entitled "Dual Band Photodetector," which is hereby incorporated by reference in its entirety, and also claims benefit to U.S. Provisional Patent Application Ser. No. 60/729,163, filed Oct. 21, 2005, entitled "Heterojunction Photodetector," which application is hereby incorporated by reference in its entirety and made a part hereof.

STATEMENT REGARDING FEDERALLY SPONSORED RESEARCH OR DEVELOPMENT

This invention was made with government support under one or more of Grants ECS-0140434, ECS-0553051 and DBI: 0352324 awarded by the National Science Foundation (NSF); and Grants No. FA9453-05-M-0106 awarded by the U.S. Air Force Small Business Innovation Research Program (SBIR). The government has certain rights in the invention.

BACKGROUND OF THE INVENTION

1. Field of the Invention

The present invention generally relates to a photodetector. More particularly, the present invention relates to a far infrared photodetector utilizing a mechanism of detection based on free carrier absorption and internal photoemission over the bandgap offset of a heterojunction. Still more particularly, the present invention is directed to heterojunction based terahertz detectors covering the range of from 1-60 THz. Further, the present invention is directed to a near- and far-infrared p-GaAs dual band detector, a near- and very-long-wavelength-infrared Si dual band detector, and GaN/GaN, GaN/AlGaN and InGaN/InGaN ultraviolet/infrared dual-band detectors that, in various embodiments, capable of detecting both UV and IR, simultaneously detecting UV and IR, and UV, IR or visible light.

2. Description of the Related Art

Far infrared (hereinafter "FIR") detectors are of interest for various astronomy applications such as the Stratospheric Observatory For Infrared Astronomy (SOFIA) program and Explorer missions. Stressed Ge[1] (hereinafter "[n]" referring to the nth reference in the attached list of references at the end of the specification) and blocked impurity band[2] detectors have been studied for almost 20 years as FIR detectors without being successful in making large arrays. Due to the material constraints in Ge that limit their use in arrays Si and GaAs homojunction interfacial workfunction internal photoemission infrared photodetectors (hereinafter "HIWIP") have been studied as an alternative detector structure.[3, 4] HIWIP detectors include successive highly doped emitter layers and undoped barrier layers. Detection takes place by free carrier absorption in the emitter layers followed by the internal photoemission of photoexcited carriers across the barrier and collection.[5] The threshold wavelength ($\lambda_0$) is determined by the workfunction at the interface which is due to the bandgap narrowing caused by the doping in the emitter. By adjusting the device parameters, mainly the doping concentration in the emitter region, the threshold wavelength may be tailored to the desired range.

HIWIP detectors have shown high responsivity and good detectivity in this range. The workfunction in HIWIPs is due to the bandgap narrowing effect in the highly doped emitter regions. High density theory, where only the dopant type (n or p) is considered but not the specific impurities, has been used to calculate the workfunction associated with doping concentration.[5]

There is a need to develop a new type of far infrared photodetectors based on a new detection mechanism, giving high quantum efficiency. In a further aspect, terahertz imaging, in part due to its ability to differentiate between different non-metallic materials, is finding a wide range of applications from security applications to quality control in manufacturing. This makes the THz radiation imaging for screening for materials such as plastic explosives which would not show up on conventional x-ray screening. In another example, it also would allow inspection of computer chips for internal defects after processing. It is also contemplated that there are numerous potential medical applications ranging from, for example, cavity detection to scanning for skin cancers. THz radiation can even be used to enhance the recognition of watermarks for applications such as currency scanners.

Because many organic compounds have absorption features in the THz range, the identification of drugs and other compounds is another potential area of application. Another potential biological application is in using THz radiation to identify DNA structures. A further aspect of exemplary biological application is the extension of FTIR difference techniques to the 4-36 THz region to allow for the direct study of amino acids involved in metal binding in biological systems. This aspect impacts many studies of bio-molecular reactions, particularly in FTIR studies of pigment-protein systems that have been well characterized in the 36-60 THz spectral regions. For example, the visual protein rhodopsin, the proton pump bacteriorhodopsin, the respiratory cytochrome oxidases, ATPases, the iron containing proteins, hemoglobin and myoglobin, as well as a whole range of Cu, Ca, Ni, Fe, Mn, Mg, Zn, metal containing enzymes can be studied. Most of these metal containing complexes are involved in mammalian life processes, thus improved fast THz detectors could impact many areas of medical and biological research. Potential applications for biological monitoring include measuring water content in leaves, studies of tissue, identification of chemical compounds in samples, and the like. Currently known systems typically use pulsed systems. Thus, the development of continuous wave systems will potentially lead to cheaper alternatives for scanning applications.

All the presently available detectors in this spectral range have limitations on their operation. Conventional Schottky diode detectors have a high sensitivity on the order of $10^{-10}$ W/Hz$^{1/2}$. However, typical intensity limits of 1 W restrict applications. Similarly, known Golay cells, which detect vibrations in a gas cell, are very sensitive to any type of mechanical vibrations and require additional vibration isolation. Thus, such Golay cell are not readily extended to array formats. In addition, being thermal detectors, they will have very slow response times. Further, although a Keating meter, which has a typical area of 30 cm$^2$, will provide an absolute calibration, it is slow, requires a modulated signal (10-50 Hz), and cannot be converted into an array format with high resolution. While commercial thermopile detectors covering the THz range are available, they typically do not have D*>$10^{10}$ Jones. And, while bolometer detectors can achieve high sensitivities (>$10^5$ V/W) by cooling to low temperatures, they are not very fast. Even microbolometers will have time constants on the order of milliseconds making them much slower than desired. Further, known Si blocked impurity band detectors operate at the high frequency end of this range (>7 THz) and stressed Ge:Ga detectors can operate as low as 1.5 THz. However, the stress requirements of the Ge:Ga detectors make them relatively unsuited for use in array formats. Recently, the range of Quantum Well Infrared Photodetectors (QWIPs) has also been extended to the high THz frequencies. Thus, although several THz detectors are available in the market, each has its limitations.

Thus, there is a need for a new photodetector.

SUMMARY OF THE INVENTION

In one aspect the photodetector according to the invention is a dual band homojunction photodetector that comprises at least N barriers, with N being an integer greater than or equal to one. Each barrier being a layer of a material comprised of one or more Group III elements or Group V elements, or combinations thereof, and each of the barriers characterized by a bandgap. The photodetector further comprises at least one emitter and if N is greater than one then N emitters, each emitter being a layer of emitter material comprised of the same material as said at least N barriers doped with one or more of a Group III, Group IV, or Group V element to cause free carriers in the emitter to be responsive to optical signals. The emitter is also characterized by a bandgap that is different from that of the barriers. Each emitter is substantially adjacent to at least one of the barriers so as to form a homojunction at each interface between an emitter and a barrier. The photodetector is configured for responsivity in at least a first and second spectral bands of where said first spectral band includes light having a wavelength in the ultraviolet (UV) range, and the second spectral band includes light having a wavelength in the infrared (IR) range. In one aspect the barriers are comprised of GaN and the emitters are comprised of GaN.

In one aspect, the photodetector further comprises a first contact to form a $p^+$-i-$p^+$ detector structure, wherein the first contact is magnesium doped to $5 \times 10^{18}$ cm$^{-3}$, and the barriers are comprised of a approximately 1 μm thick GaN layer which is followed by an emitter comprised of another highly p-doped GaN contact layer. In one aspect, the photodetector has UV response that is due to interband transition in the GaN barrier layer and has a threshold UV wavelength is approximately 385 nm. In another aspect the photodetector has IR response that is due to intraband transition giving rise to IR response of up to approximately 50 μm.

Another embodiment according to the present invention is a dual band heterojunction photodetector comprised of at least N barriers, with N being an integer greater than or equal to one. Each barrier is comprised of a layer of one or more Group III elements or Group V elements, or combinations thereof, and each of the barriers characterized by a bandgap. The photodetector has at least one emitter and if N is greater than one then N emitters. Each emitter is comprised of a layer of one or more Group III or Group V elements, or combinations thereof, doped with one or more Group II, Group IV, or Group VI elements to cause free carriers in the emitter responsive to optical signals and the emitter is characterized by a bandgap different from that of the barriers. Each emitter is comprised of material different from that of the barriers and the emitters are substantially adjacent to at least one of the barriers so as to form a heterojunction at each interface between an emitter and a barrier. The photodetector is configured for responsivity in at least a first and second spectral bands of where said first spectral band includes light having a wavelength in the ultraviolet (UV) range, and said second spectral band includes light having a wavelength in the infrared (IR) range.

In one aspect, the dual band heterojunction photodetector's barriers are comprised of AlGaN and said at least one emitter is comprised of GaN.

In one aspect, the emitter of the dual band heterojunction photodetector is n-doped with Si. In one aspect, it may be doped to a doping concentration of $5 \times 10^{18}$ cm$^{-3}$.

In one aspect, the barriers of the dual band heterojunction photodetector are comprised of $Al_{0.026}Ga_{0.974}N$.

In one aspect, the dual band heterojunction photodetector has responsivity in the first spectral band which includes light having a UV threshold wavelength of 360 nanometers (nm). In one aspect, the responsivity in the second spectral band includes light having an IR range beginning at eight μm and goes to 14 μm, beginning and ending values included.

Yet another embodiment according to the present invention is a dual band photodetector comprised of an ultraviolet (UV) region and an IR region. The UV region comprises a UV barrier substantially between a top contact and a middle contact. The top contact and the middle contact are comprised of materials selected from the group consisting of GaN and InGaN and said UV barrier is comprised of materials selected from the group consisting of AlGaN and InGaN. The top contact and said middle contact further comprise electrical connections. The IR region is comprised of a plurality of N IR barriers and N emitters, with N being an integer greater than one. The IR barriers and emitters are located substantially between the middle contact and a bottom contact. The middle contact is substantially in contact with one of the N IR barriers and the bottom contact is substantially in contact with one of the N IR barriers such that the bottom contact functions as one of the emitters. Each of the N IR barriers are comprised of a layer of AlGaN and further characterized by a bandgap, and each emitter comprised of a layer of GaN n-doped with one or more Group IV elements to cause free carriers in the emitter to be responsive to optical signals. Each emitter is characterized by a bandgap that is different from that of the N IR barriers. Each of the N IR barrier is substantially adjacent to at least one of the emitters so as to form a heterojunction at each interface between an emitter and an IR barrier. The bottom contact is comprised of GaN and has an electrical connection. The dual band photodetector is further comprised of a substrate substantially in contact with a side of the bottom contact that is not in contact with the one of said N IR barriers. The photodetector is configured for responsivity in at least a first and second spectral bands of where the first spectral band includes light having a wavelength in the ultraviolet (UV) range, and said second spectral band includes light having a wavelength in the infrared (IR) range.

In one aspect, the dual band photodetector is configured for simultaneous responsivity in the first and second spectral bands of where the first spectral band includes light having a wavelength in the ultraviolet (UV) range, and the second spectral band includes light having a wavelength in the infrared (IR) range.

In one aspect, each emitter of the dual band photodetector is n-doped with Si. In one aspect, they are doped to a doping concentration of $5 \times 10^{18}$ cm$^{-3}$.

In one aspect, the IR barriers of the dual band photodetector are comprised of $Al_{0.07}Ga_{0.93}N$. In one aspect, each barrier is 1000 Angstroms thick and each emitter is 300 Angstroms thick.

In one aspect, the photodetector is configured for responsivity to the first spectral band which includes light having a UV threshold wavelength of 360 nm and the second spectral band which includes light having an IR range beginning at five μm and goes to 14 μm, beginning and ending values included. In another aspect, the photodetector is configured for simultaneous responsivity to the first spectral band which includes light having a UV threshold wavelength of 360 nm and the second spectral band which includes light having an IR range beginning at five μm and goes to 14 μm, beginning and ending values included.

Yet another embodiment according to the present invention is a dual band photodetector comprised of an ultraviolet/visible (UV/VIS) region and an IR region. The UV/VIS region comprises a UV/VIS barrier substantially between a top contact and a middle contact. The top contact and the middle contact are comprised of InGaN and the UV/VIS barrier is comprised of InGaN. The top contact and said middle contact further comprise electrical connections. The IR region comprises a plurality of N barriers and N emitters, with N being an integer greater than one. The IR barriers and emitters are located substantially between the middle contact and a bottom contact. The middle contact is substantially in contact with one of the N IR barriers and said bottom contact is substantially in contact with one of said N IR barriers and functions as one of the emitters. Each of the IR barriers are comprised of a layer of AlGaN and further characterized by a bandgap. Each emitter is comprised of a layer of GaN n-doped with one or more Group IV elements to cause free carriers in the emitter to be responsive to optical signals and each said emitter characterized by a bandgap different from that of the IR barriers. Each of the IR barriers is substantially adjacent to at least one of the emitters so as to form a heterojunction at each interface between an emitter and a barrier. The bottom contact is comprised of GaN and has an electrical connection. The photodetector further comprises a substrate substantially in contact with a side of the bottom contact that is not in contact with the one of the IR barriers. The photodetector is configured for responsivity in at least a first and second spectral bands of where said first spectral band includes light having a wavelength in the ultraviolet (UV) range or visible (VIS) range, and said second spectral band includes light having a wavelength in the infrared (IR) range.

In one aspect, the photodetector is configured for simultaneous responsivity in the first and second spectral bands of where said first spectral band includes light having a wavelength in the ultraviolet (UV) range or visible (VIS) range, and said second spectral band includes light having a wavelength in the infrared (IR) range.

Additional advantages of the invention will be set forth in part in the description which follows, and in part will be obvious from the description, or may be learned by practice of the invention. It is to be understood that both the foregoing general description and the following detailed description are exemplary and explanatory only and are not restrictive of the invention.

BRIEF DESCRIPTION OF THE DRAWINGS

The accompanying drawings, which are incorporated in and constitute a part of this specification, illustrate several embodiments according to the present invention and together with the description, serve to explain principles of the present invention:

FIG. 21 is an exemplary illustration of dark IV characteristics of the detector shown in FIG. 20a;

FIG. 24b illustrates an exemplary band diagram for the advanced dual band detector of FIG. 24a;

FIG. 24c illustrates another embodiment of an exemplary band diagram for a dual band detector using InGaN in the UV region to extend the range into the visible;

FIG. 32a is an exemplary embodiment of a GaN/AlGaN HEIWIP structure that is comprised of a n-doped GaN emitter layer, an undoped $Al_xGa_{1-x}N$ barrier layer, and a n-doped GaN bottom contact layer;

FIG. 32b illustrates a band diagram that shows the conduction band profile for the exemplary photodetector of FIG. 32a;

DETAILED DESCRIPTION OF THE INVENTION

Figure 1:
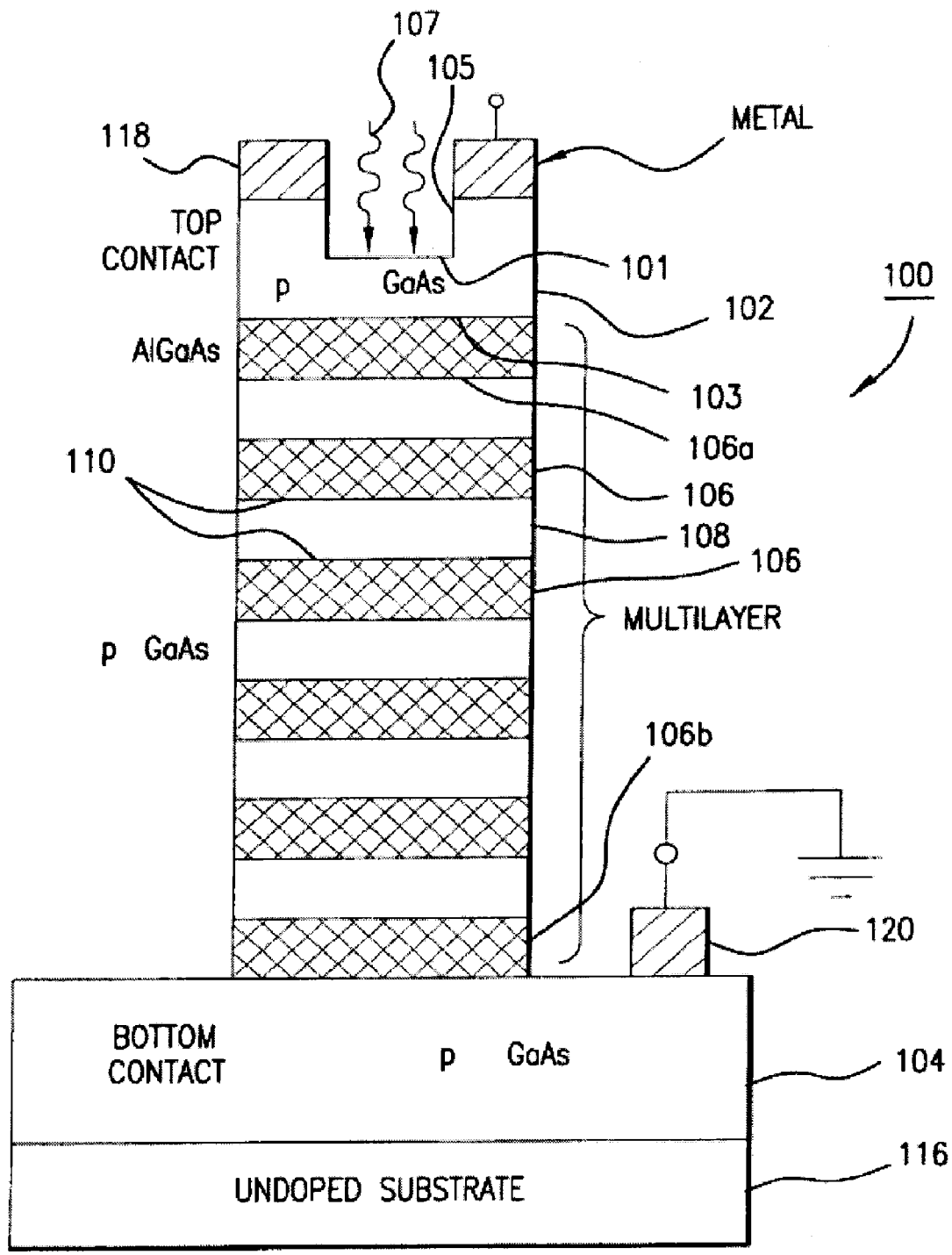
FIG. 1 is a cross-sectional view of a photodetector showing a mesa with a window etched in the top contact layer inside the metallic ring contact in one embodiment of the invention.

Several embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Additionally, as used in the description herein and throughout the claims that follow as known to people skilled in the art, a homojunction means a junction formed by two different electrical types of the same (band-gap) material. For example, a silicon p-n junction is a homojunction. A heterojunction means a junction formed by two different electrical types of two chemically different materials, each having a band-gap different from that of the other. An example of a heterojunction is a GaAs/Al(x)Ga(1-x)As junction, where x is a number satisfying 0<x<1.

In one embodiment, referring generally to FIGS. 1-8 and in particular to FIG. 1 now, in one aspect, the present invention provides a photodetector 100. In one embodiment of the present invention as schematically shown in FIG. 1, the photodetector 100 has a plurality of barriers 106. The total number of the plurality of barriers is N, where N is an integer greater than 1. For the embodiment shown in FIG. 1, N=6. Each barrier 106 is a layer of a material made from a first and a second group III elements and a first group V element and characterized by a band gap.

Figure 2:
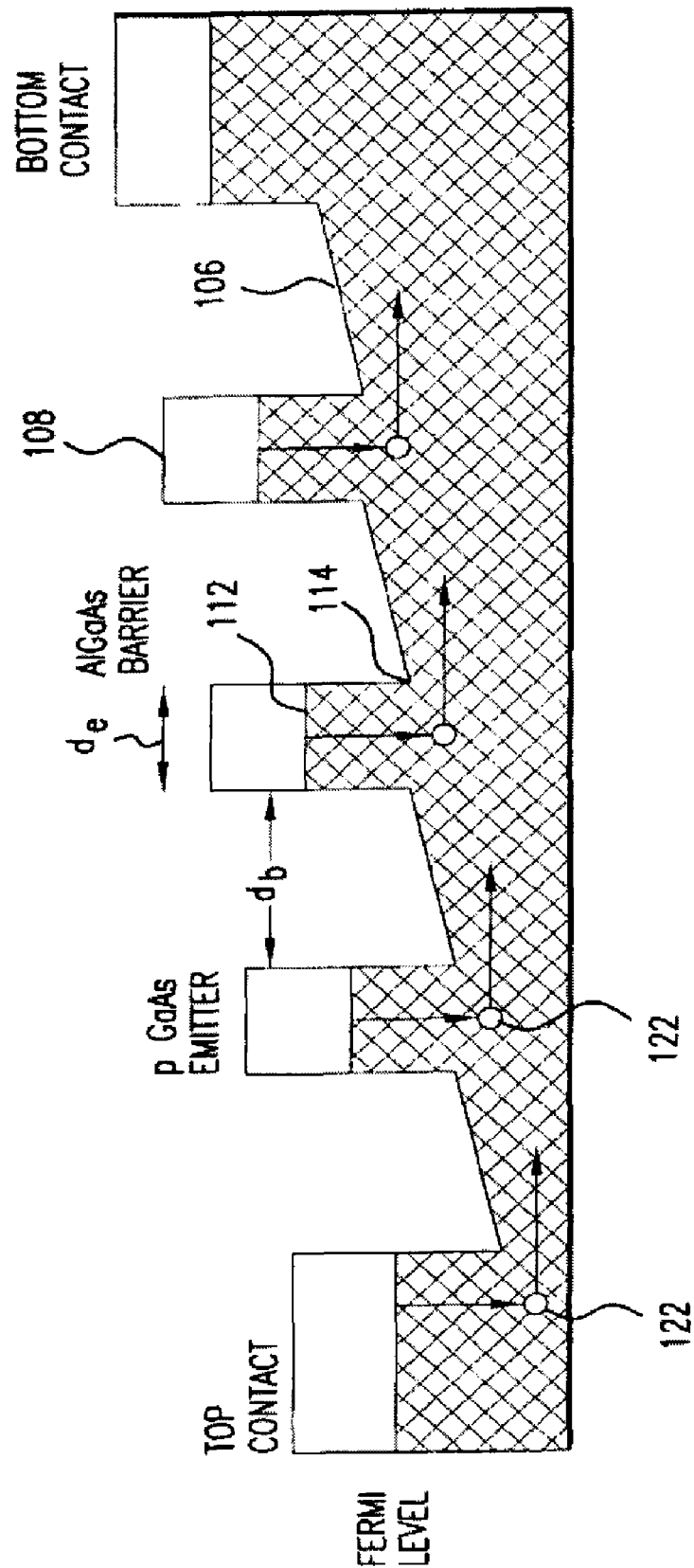
FIG. 2 illustrates a partial band diagram for the photodetector as shown in FIG. 1.

In one embodiment of the present invention, the first group III element is Al, the second group III element is Ga, and the first group V element is As. The concentration of the first group III element Al is characterized by a normalized amount x, x being in the range of 0 to 1, and the concentration of the second group III element Ga is characterized by a normalized relative amount 1-x. The thickness of each barrier layer, identified as $d_b$ in FIG. 2, is at least 600 Angstroms. For example, the thickness of each barrier layer can be chosen in the range of 600 to 1000 Angstroms. In Samples #2282 and #2283, each sample being a photodetector in an embodiment of the present invention, the thickness of each barrier layer is chosen as 800 Angstroms. The photodetector 100 further has a plurality of emitters 108. The total number of emitters may be N (assuming the top contact is considered as an emitter). Each emitter 108 is a layer of material made from a third group III element and a second group V element and characterized by a bandgap different from that of the barriers and having at least one free carrier responsive to optical signals, wherein each emitter 108 is located between two barriers 106 so as to form a heterojunction at each interface 110 between an emitter 108 and a barrier 106. Moreover, each emitter 108 is doped with a first group II, IV or VI element to cause free carriers in the emitter 108, wherein at least one construction parameter of each emitter 108 causes at least one free carrier to occupy a range of substantially continuously distributed energies characterized by a three dimensional Fermi level 112 as shown in FIG. 2 and respond to optical signals having wavelength in the range of 25 to 50 μm with significant absorption.

The construction parameters of each emitter 108 are chosen from the group consisting of chemical identities of the third group III elements, the first group II, IV or VI element and the second group V element, thickness of the emitter layer 108, doping concentration of the first group II, IV or VI element, the bandgap of the emitters 108, and the total number of the emitters 108.

In one embodiment of the present invention, the third group III element is Ga, the first group II element is Be, and the second group V element is As. The thickness of each emitter layer, is identified as $d_e$ in FIG. 2, is at least 150 Angstroms. For example, the thickness of each emitter layer 108 is in the range of 150 to 500 Angstroms. The doping concentration of Be is no more than $5 \times 10^{18}$ cm$^{-3}$. As an example, the doping concentration of Be is in the range of $1 \times 10^{16}$ cm$^{-3}$ to $5 \times 10^{18}$ cm$^{-3}$. The bandgap of each emitter 108 is characterized by a workfunction substantially in the range of 20 to 22 meV for each heterojunction. The workfunction of each emitter 108 is defined as the difference between the three dimensional Fermi level 112 of the emitter 108 and the conduction band 114 of a corresponding barrier 106 as shown in FIG. 2. Additionally, the total number of the emitters 108 is no smaller than 5. For example, the total number of the emitters 108 can be chosen as an integer in the range of 5 to 50. In FIG. 1, the total number of the emitters 108 equals to N=6. Note that, in another embodiment (not shown), a single emitter positioned between two barriers is workable.

At least one construction parameter of each barrier 106 causes a sharp interface 110 between any pair of neighboring emitter 108 and barrier 106 and a dark current at least 100 times less than that of a comparable HIWIP at a given temperature. Likewise, the construction parameters of each barrier 106 are chosen from the group consisting of chemical identities of the first and second group III elements and the first group V element, thickness of the barrier layer, relative concentration of the first and second group III elements, the bandgap of the barriers, and the total number of the barriers.

Figure 4:
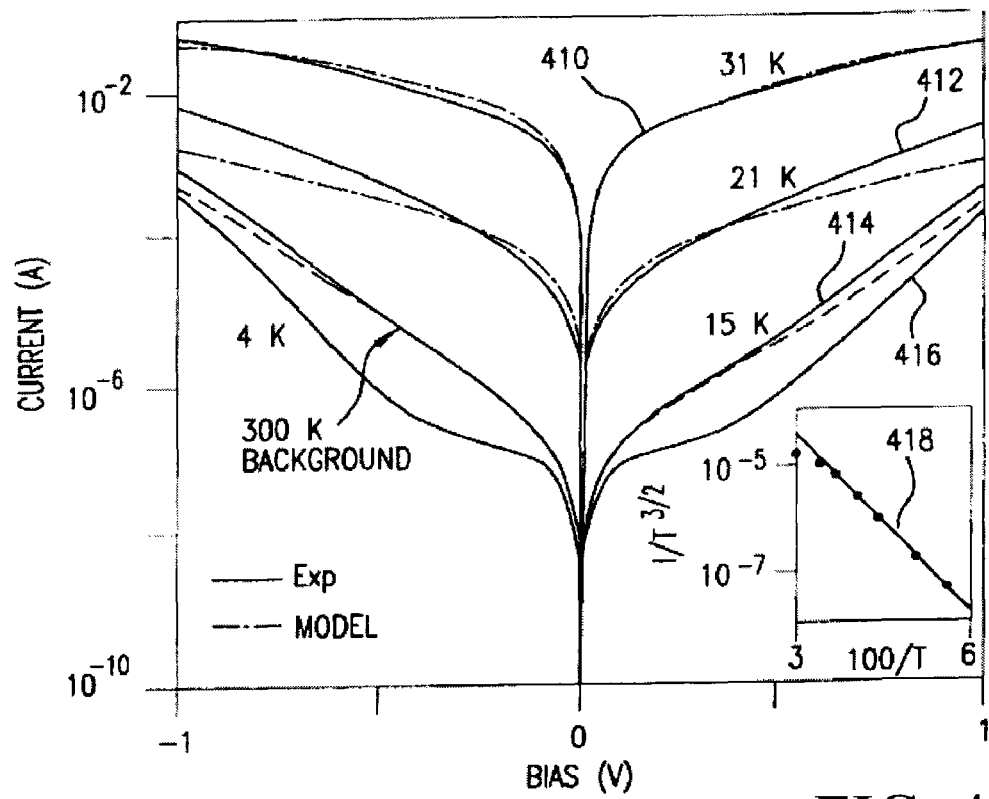
FIG. 4 illustrates dark current at various temperatures and data for related activation energy for the photodetector #2283 identified in FIG. 3.

In one embodiment of the present invention, the first group III element is Al. Moreover, the bandgap of each barrier 106 is characterized by an activation energy in the range of 18 to 20 meV. For example, the bandgap of each barrier is characterized by an activation energy substantially in the range of 18.5 to 19.5 meV. As shown in FIG. 4, curve 418 is utilized to get an activation energy of 19±1 meV for Sample #2283. Note that in this embodiment, the thickness of each barrier layer $d_b$ is greater than the thickness of each emitter layer $d_e$.

Furthermore, referring now to FIG. 1, the photodetector 100 has a first contact layer 102 in contact with one outmost barrier 106a, wherein the first contact layer 102 is made from a material substantially identical to the material from which emitters 108 are made. The first contact layer 102 has a first surface 101 and an opposite second surface 103, and an opening 105 defined in the first surface 101 to receive optical signals 107, the second surface 103 being in contact with one outmost barrier 106a. The opening 105 may be formed by partially etching the first surface 101 of the first contact layer 102. The photodetector 100 also has a second contact layer 104 opposite the first contact layer 102, wherein the second contact layer 104 is made from a material substantially identical to the material from which emitters 108 are made. The photodetector 100 further has a substrate 116 in contact with the second contact layer 104, wherein substrate 116 is made from a material substantially identical to the material from which emitters 108 made but being undoped. Moreover, conductive contacts 118, 120 located at the first and second contact layers 102, 104, respectively, can be utilized for measuring the response of the photodetector 100 to the optical signals 107.

The comparison between the HEIWIP photodetector of this embodiment of the present invention and the photodetector of prior art can now be made. Among other things, differences between the HEIWIP and QWIP (quantum well infrared photodetectors) detectors lie in the difference in the width of the various layers and the detection mechanism. In QWIP detectors, the absorption takes place between states with specific energies that occur in narrow wells. The size (quantum) effects of the well determine exact energy of the states. Typical QWIP detectors have wells with thicknesses of 50 to 100

Angstroms. This absorption mechanism has the disadvantage that the absorption probability decreases as the wavelength increases making QWIP detectors unsuitable for FIR detectors. It also means that only a narrow range of light wavelengths will be detected in a QWIP detector. In contrast, the HEIWIP photodetector of the present invention uses thicker (larger than 140 Å) emitter layers. In these thicker layers the carriers are not in states with specific energies but rather occupy a wide range of energies. The absorption mechanism (free carrier absorption) in the HEIWIP photodetector of the present invention is different from the QWIP absorption and occurs for light with a wide wavelength range without decreasing at longer wavelengths. The free carrier absorption strength increases as wavelength squared up to about 40 μm and then remains almost constant. Thus, the HEIWIP photodetector of the present invention detectors at least has an advantage in terms of response strength and the wavelength range that can be covered in a single detector over a QWIP detector.

Some embodiments of the present invention comprise a HEIWIP photodetector. Differences between the HEIWIP photodetector and a HIWIP detector are the material in the barrier layers between the emitter layers where absorption occurs and the level of doping in the emitter layers. In a HIWIP detector, the emitter and barrier layers are made of the same bandgap base material (homojunction) and the barrier is formed by the difference in allowed carrier energies in doped and undoped material. In contrast, in a HEIWIP photodetector, the emitter and barrier layers are made of different bandgap base materials (heterojunction) with the barrier produced by differences in allowed carrier energies for the different materials. The resulting structure may have sharp interfaces between the layers of material reducing dark current and detector noise.

Thus, the HEIWIP photodetector provides properties of both types of detectors: the improved response from the free carrier absorption mechanism of a HIWIP detector with the lower dark current observed in a QWIP detector due to lower doping concentration and sharper interfaces between layers.

Embodiments according to the present invention will be better understood by reference to the following illustrative samples and corresponding testing results, which are constructed and performed according to the present invention.

Making of a Heterojunction Photodetector and Testing Results

As discussed above, one embodiment according to an aspect of the present invention provides a far infrared detector, or more specifically, a Heterojunction Internal Workfunction Internal Photoemission (HEIWIP) far infrared detector where the workfunction is primarily due to an AlGaAs layer next to a doped GaAs (emitter) layer. As shown in FIG. 2, the emitters 108 are doped to a sufficiently high level so that the carriers 122 form a 3-dimensional distribution in the emitters 108 and detection is by free carrier absorption. The barriers 106 have a low Al fraction so that the workfunction (difference between the barrier conduction band 114 and the 3-D Fermi level 112 in the emitters 108) will be small allowing operation at FIR wavelengths. By adjusting the Al fraction (and/or to a lesser extent the emitter doping density) the threshold wavelength can be tailored to any desired wavelength. The doping in the emitters of the GaAs/AlGaAs structures in the current samples is kept low (<$10^{19}$ cm$^{-3}$) to reduce the dark current to levels comparable or lower than those of QWIPs, while the use of free carrier absorption in the emitter regions rather than the intersubband transition used in QWIPs will give the high responsivity observed in HIWIPs. Increasing the doping in the emitter region should increase the absorption in the emitters. The optimum doping of the emitter regions will have to be determined by balancing the dark current and absorption quantum efficiency in the emitter regions. Thus, HEIWIPs can combine the best properties of the QWIP and HIWIP detectors leading to improved operation.

Figure 3:
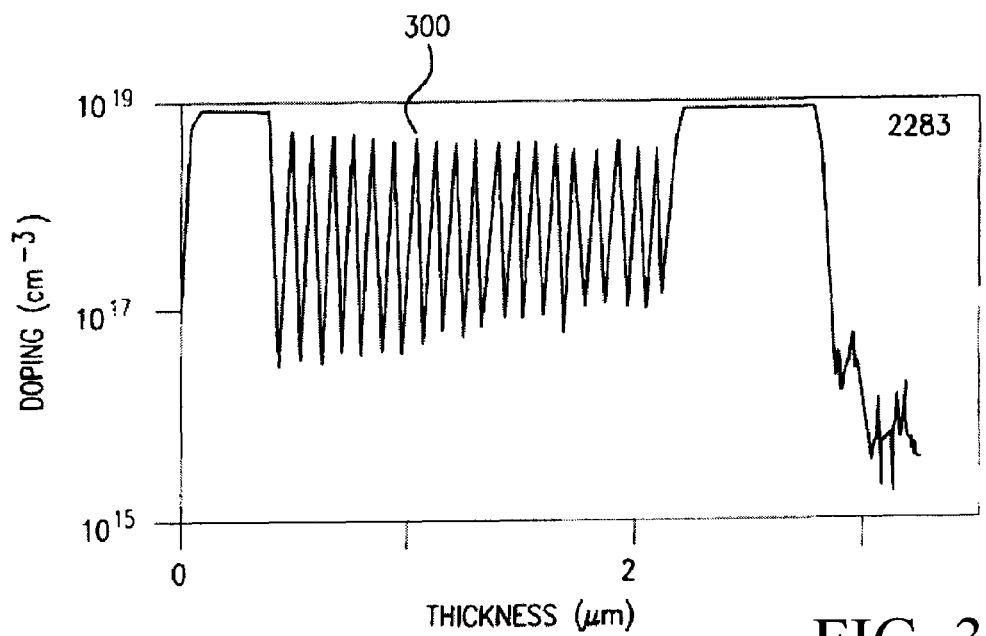
FIG. 3 shows SIMS data showing the doping concentrations and the multilayers in a sample similar to the photodetector as shown in FIG. 1 in principle, the sample photodetector being identified as Sample #2283.

The device structure (confirmed using SIMS as shown in FIG. 3) in one embodiment includes 158 Angstrom GaAs emitters and 800 Angstrom Al$_{0.02}$Ga$_{0.98}$As barriers. The emitters were doped with Be to $3\times10^{18}$ cm$^{-3}$. The top and bottom contacts were Be doped to $1\times10^{19}$ cm$^{-3}$ with thicknesses 0.4 μm and 0.8 μm respectively. Two samples were grown with 20 (sample #2283) and 14 (sample #2282) periods, respectively. The devices were fabricated by etching 400×400 and 600×600 μm² mesas using standard wet etching techniques and then evaporating Ti/Pt/Au ohmic contracts onto the top and bottom layers. A 260×260 μm or 460×460 μm window were opened respectively through the top contact to provide front illumination to the device.

Figure 5:
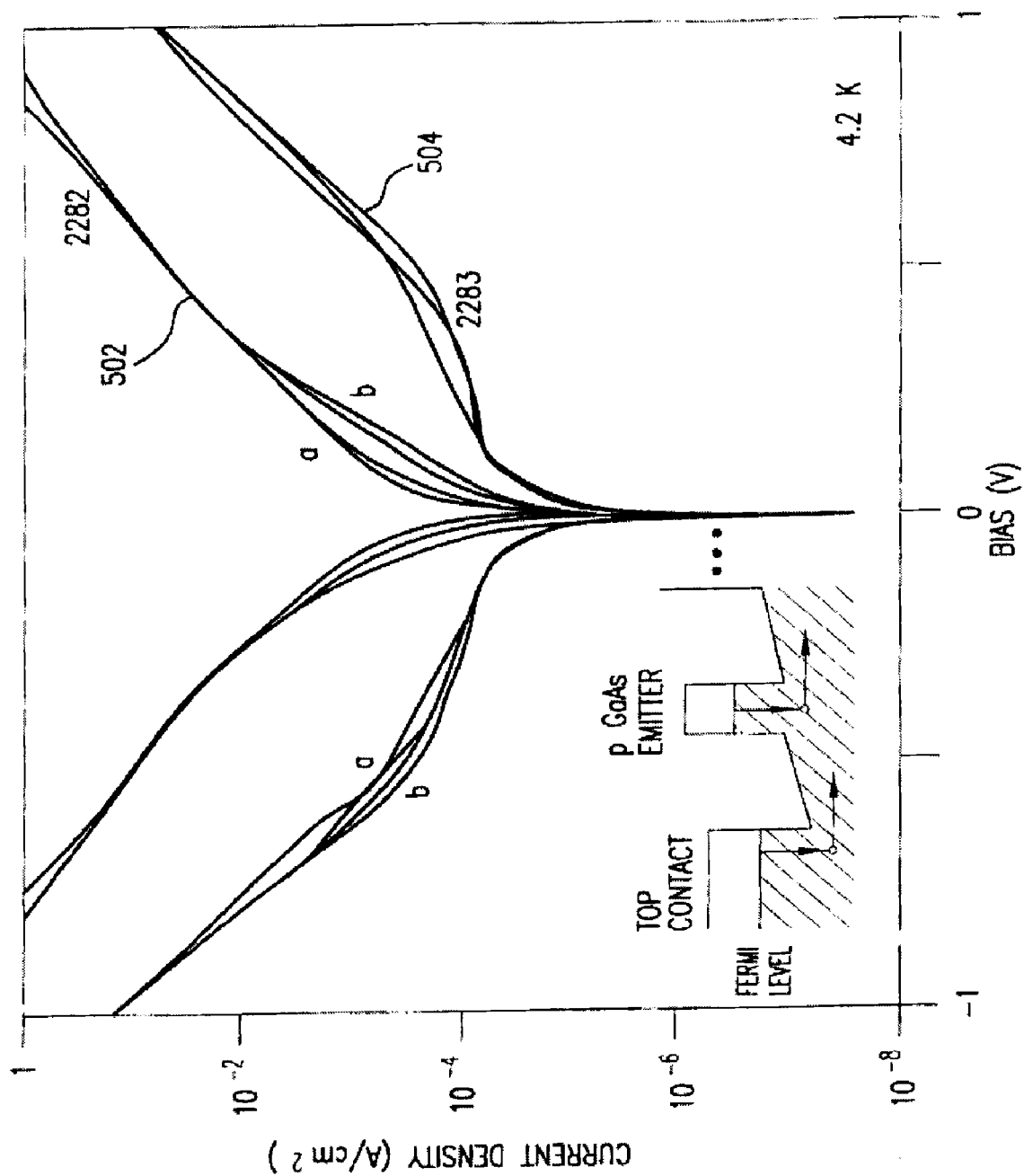
FIG. 5 illustrates dark current measurements on 4 different mesas (two mesas of 400×400 and two of 600×600 μm$^2$) for samples #2282 and #2283 showing good uniformity.

FIG. 4 shows the dark currents 410, 412, 414 and 416 for sample #2283 at various temperatures, respectively. Also shown is the 300 K background photocurrent (as dashed line) coinciding with the 15 K dark current giving the BLIP temperature of 15 K for the detector, where BLIP (Background Limited Infrared Performance) is the operating condition where the photocurrent produced by the background radiation exceeds the dark current. Under these conditions the detector performance is limited by the background rather than the detector dark current. Above 10 K the current is primarily thermionic and an Arrhenius plot 418 (inset in FIG. 4) gives an activation energy of 19±1 meV corresponding to a threshold wavelength ($\lambda_0$) of 65 μm. Based on the measured device parameters using SIMS data as seen in FIG. 3 the estimated work function including both the bandgap narrowing in the emitters and the AlGaAs bandgap offset was ~21 meV giving an expected $\lambda_0$ of 61 μm. The discrepancy from the predicted barrier from the Arrhenius result may be due to small variations in the doping concentration and/or in the bandgap narrowing in the emitters. Below 10 K the dark current was primarily due to tunneling and did not change with temperature with 4.2 K and 10 K curves being almost identical. The dark current at a given electric field is ~200 times less than for a HIWIP detector [7] with similar workfunction indicating the improvements in dark current provided by the present invention. The improved dark current should lead to improved specific detectivity due to associated reduction in the detector noise. FIG. 5 shows the dark current density 502, 504 for 4 mesas (of two different areas) from each sample at 4.2 K, respectively. The dark current is almost identical for the small mesas (two higher density curves labeled a in FIG. 5) from each sample indicating good uniformity. Even considering the factor of 2.25 difference in area to the other two mesas (labeled b in FIG. 5) the current densities are still very similar.

Figure 6:
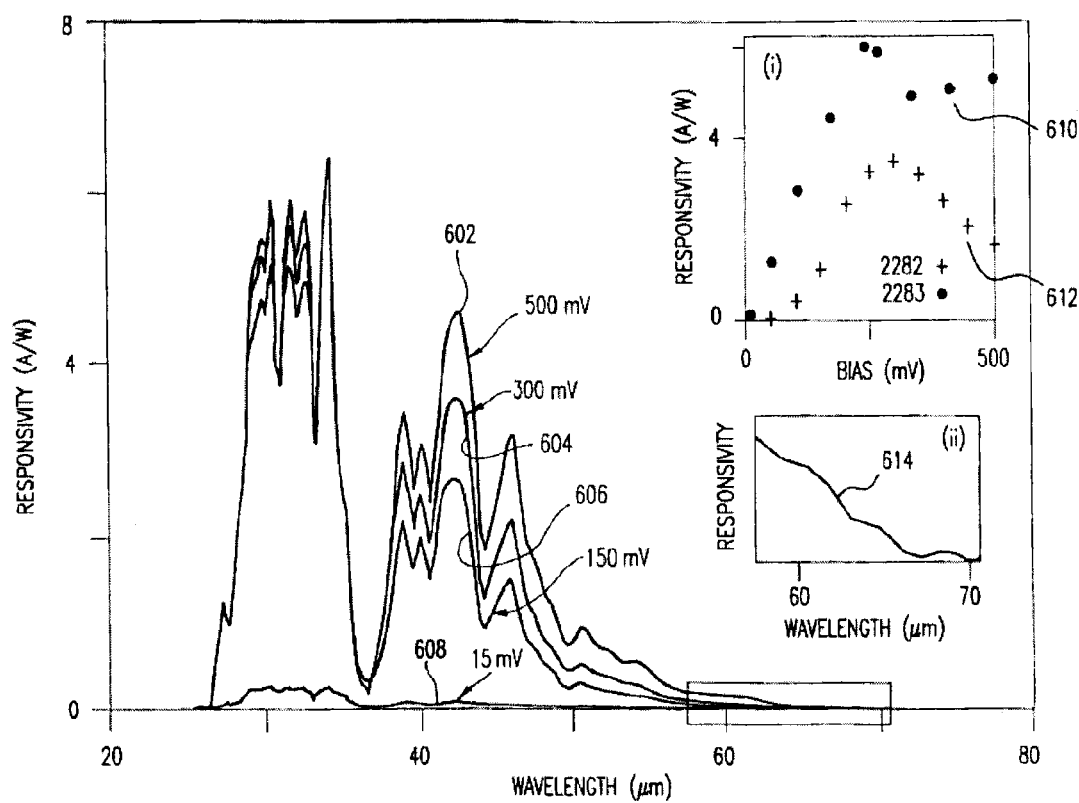
FIG. 6 shows responsivity spectra for sample #2283 at biases from 15 to 500 mV obtained at 4.2 K and the responsivity at 32.5 μm for Sample #2283 and at 25 μm for Sample #2282.

The responsivity of the detectors was measured using a Perkin-Elmer System 2000 FTIR with a Si composite bolometer as a reference detector. The results obtained for sample 2283 at various biases for 4.2 K as curves 602, 604, 606 and 608 corresponding to biases 500 mV, 300 mV, 150 mV and 15 mV, respectively, are shown in FIG. 6. The response increases with bias until a bias of ~200 mV (see inset curves 610, 612 to FIG. 6) after which it remains relatively constant. A strong response is observed for wavelengths shorter than 50 μm with $\lambda_c$ (zero response) of 70±5 μm. The peak responsivity was ~6 A/W at a wavelength of 32.5 μm. This is twice the highest responsivity obtained from HIWIP detectors[6] and an order of magnitude improvement on the 0.45 A/W obtained from QWIPs at 30 µm.[8] This confirms the expectation that the HEIWIP detectors will show the high responsivity seen in HIWIPs rather than the lower responsivity seen in QWIPs. The responsivity spectra of sample 2282 was similar to sample 2283 and the peak responsivity vs bias for both sample is also shown in inset (i) to FIG. 6. This shows that increasing the number of layers increases the responsivity as was observed for the HIWIP detectors, which could be attributed to the resonance cavity effect.[9] Spectra measured for different detector temperatures showed a decrease in responsivity between 10 and 16K which is consistent with the estimated BLIP from the photocurrent.

Noise was measured using a low-noise preamplifier (SR 560) and a fast Fourier transform (FFT) spectrum analyzer (SR780) for sample 2283 at 4.2 K. As was seen in the HIWIP detectors 1/f behavior was seen at low frequencies (<100 Hz) while at high frequencies the noise was relatively constant. For a bias of 225 mV the noise was $S_I \sim 2 \times 10^{-30}$ $A^2/Hz$, which is much lower than the HIWIP values indicating an improvement in device quality. Based on this noise value the detectivity (denoted as D*) was $\sim 2 \times 10^{13}$ cm $Hz^{1/2}$/W which is a significant improvement over $5.9 \times 10^{10}$ cm $Hz^{1/2}$/W obtained for a high performance HIWIP detector.[6] NEP for the detector was $1.4 \times 10^{-15}$ W/$Hz^{1/2}$ again about a factor of 100 better than for the HIWIP. The photocurrent efficiency for the detector was determined by dividing the photocurrent by the number of incident photons, resulting in a peak efficiency of 23% for the HEIWIP detector, double the best HIWIP result reported to date of 12.5%[6] for a sample with the same number of layers and similar thicknesses.

Figure 7:
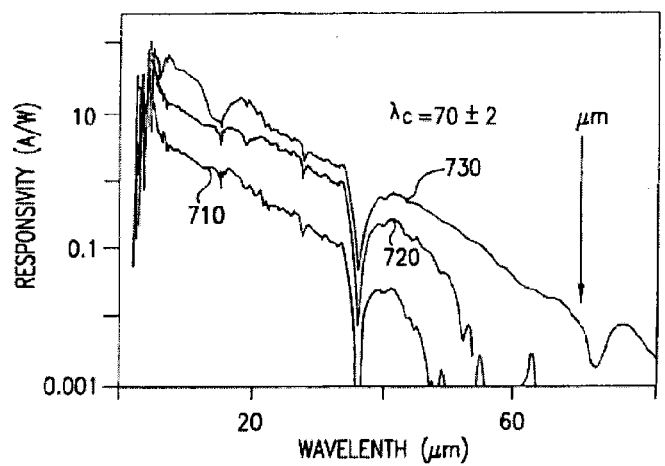
FIG. 7 shows responsivity spectra for sample #2283 at biases 0.5, 2.0 and 3.5 kV/cm (0.1, 0.4 and 0.7 curves respectively) obtained at 4.2 K, and the arrow indicates the threshold on the 3.5 kV/cm curve.
Figure 8:
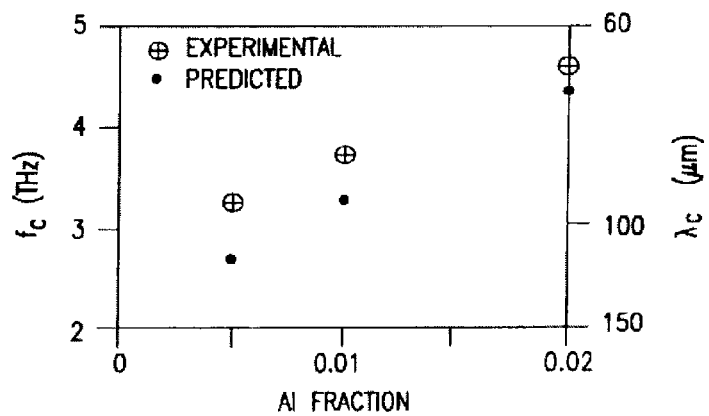
FIG. 8 illustrates the variation in threshold frequency with Al fraction x.

FIG. 7 further shows responsivity spectra for sample #2283 at biases 0.5, 2.0 and 3.5 kV/cm (curves 710, 720 and 730 respectively) obtained at 4.2 K. The arrow indicates the threshold on the 3.5 kV/cm curve. Note that significant responsivity can still be seen beyond 70 µm for curve 730, which has a D* ~$6 \times 10^{13}$ cm $Hz^{1/2}$/W at a wavelength of 6 µm. For curve 730, the peak responsivity was ~60 A/W at a wavelength of 6 µm. This is twenty times the highest responsivity obtained from HIWIP detectors[6] and a two order of magnitude improvement on the 0.45 A/W obtained from QWIPs at 30 µm.[8] This again confirms the expectation that the HEIWIP detectors will show the high responsivity seen in HIWIPs rather than the lower responsivity seen in QWIPs. Moreover, FIG. 8 illustrates the variation in threshold frequency with Al fraction x, where discrepancy between the experimental and predicted results corresponds to a variation of 1.5 meV in the barrier.

The increased D* compared to QWIPs can be understood by looking at the dark current and the absorption quantum efficiency. For the HEIWIP structure the dark current can be predicted by a 3D carrier drift model[10] given by $$j_H = 2e(\mu E)[1+(\mu E/v_{sat})^2]^{-1/2}(m_H k_B T/2\pi \hbar^2)^{3/2} \exp(-(\Delta - E\delta)/k_B T) \quad (1)$$

where µ is the mobility, E is the electric field, $v_{sat}$ is the saturated drift velocity, $m_H$ is the carrier effective mass,) is the activation energy, and δ is the effective interface thickness. The barrier lowering factor Eδ was chosen to correspond to uniform field in the emitters and barriers. Model results for sample 2283 at 21 and 31 K using µ=80 $cm^2/V\,S^{-1}$ and) of 19.5 meV for forward bias and 19.0 meV for reverse bias are shown in FIG. 4 indicating a reasonable fit. The small difference in barrier height for different polarities can be due to possible variations in the Al fraction at the two ends. For a QWIP structure the dark current is given by [11]

$$j_Q = ek_B T m_Q/(\pi \hbar^2 \tau) \exp(-(\Delta - E\delta)/k_B T) \quad (2)$$

where $m_Q$ is the carrier effective mass and τ is the time for a carrier to cross the well. Since the activation energy is primarily determined by the desired $\lambda_0$ for both detectors a comparison of the dark current effectively becomes a comparison of the pre-exponential factors. The small inhomogeneous broadening effect in QWIPs with bound-to-quasibound transitions would add a small reduction in the dark current which will be ignored. The ratio of the dark currents in the two detectors is then $$j_H/j_Q = (2\tau\mu E)[1+(\mu E/v_{sat})^2]^{-1/2}(k_B T/2\pi\hbar^2)^{1/2} m_H^{3/2}/m_Q. \quad (3)$$

For detectors operating at 4.2 K and using a typical transit time of τ=0.5 ps and µ=80 $cm^2/Vs^{-1}$, $j_H/j_Q$~0.01 for a p-type HEIWIP and an n-type QWIP for fields in the operating range. The dark current for a $\lambda_0$=28 µm QWIP was already larger than the dark current observed for the $\lambda_0$=65 µm HEIWIP detectors. This confirms that the HEIWIPs can be expected to have better dark current behavior than QWIPs for far infrared operation. Although the same result should be valid for HIWIPs, the experimentally observed dark current is ~2 orders of magnitude larger than for HEIWIPs, which could be due to the material quality associated with interchanging highly doped and intrinsic regions. At long wavelengths absorption quantum efficiency strongly favors the HEIWIP structure over the QWIP structure. The free carrier absorption coefficient is $\alpha \sim N_D \lambda^N$ where $N_D$ is the 3D doping density and N~2-3 for wavelengths shorter than ~30 µm and N~0 for longer wavelengths. For the QWIP $\alpha \sim N_D^{2D}$ with the 2D doping density $N_D^{2D}$ being chosen so that the Fermi energy is $k_B T$ to achieve the best $T_{BLIP}$. Since $T_{BLIP}$ will decrease as the desired wavelength range increases the absorption of QWIPs designed for long wavelengths will decrease. Thus both dark current and absorption favor the use of HEIWIPs over QWIPs for long wavelength detection.

Comparison of the first set of HEIWIP detectors (i.e., sample #2282 and #2283) to the current state of the art Si:As, Si:Sb and Ge:Ga detectors used in the far infrared range is also encouraging. Photocurrent quantum efficiency was 48% better than the 25% obtained for Si BIB detectors to be used in the FORCAST camera for SOFIA. [12] The responsivity and specific detectivity are also comparable to the values of 10-50 A/W for the stressed Ge:Ga detectors being developed for use in FIFI LS on SOFIA. [13] The HEIWIPs in accordance with the present invention can also lead to detectors that offer improved performance on the current state of the art.

In conclusion, results have been presented on the mechanism, structures and performance of HEIWIP detectors of the present invention. Responsivity was observed to be 60 A/W, with D*=$6 \times 10^{13}$ cm $Hz^{1/2}$/W, and the BLIP temperature was 15K which shows performance comparable to state of the art Si:As, Si:Sb or Ge:Gas detectors. As was expected HEIWIPs appear to combine some of the best properties of QWIPs and HIWIPs. At least because of this behavior HEIWIPs are an exciting new approach to FIR detection. Low Al fraction growth for the barriers and better determination of the Fermi level in the emitter may lead to longer threshold wavelength detectors with improved characteristics relative to the currently available detectors.

In another embodiment, referring to FIGS. 9A-15b, the detector is based on the workfunction occurring at the interface between a highly doped emitter layer and an undoped barrier layer. The HEIWIP detectors combine the valence band offset from the material difference at the emitter/barrier interface with the offset from the doping ($N_A$) in the emitters. The contribution from the doping (Δd) is substantially the same as for HIWIPs and its value is typically <10 meV for most materials and doping levels. One will appreciate that the material difference contribution Δx can be adjusted in theory to any value (positive or negative) with the band offset of the two materials forming the heterojunction. In use, the HEIWIP detectors of the present invention provide a sharper interface and a workfunction that is more widely and accurately tailorable than the HIWIP detectors.

Figures 9A, 9B:
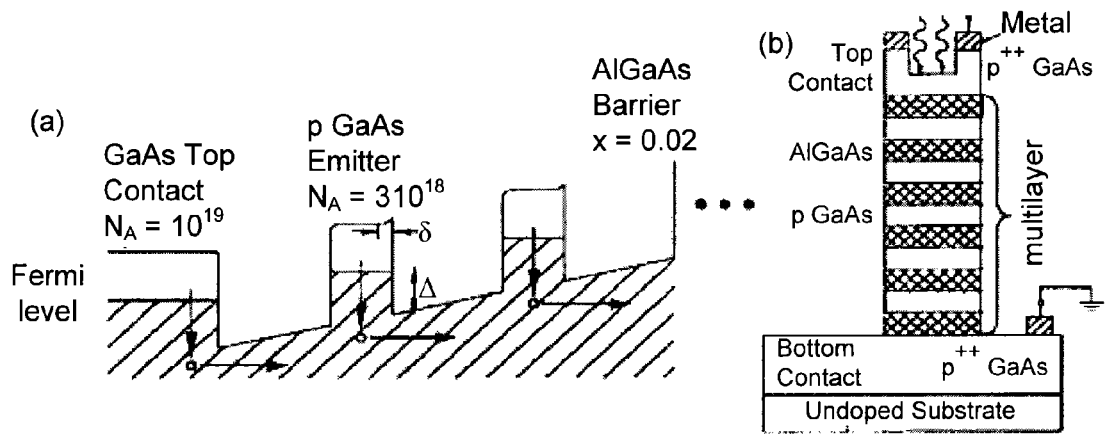
FIG. 9a shows a partial band diagram of the top two periods for a HEIWIP detector using doped GaAs as the emitter layer and undoped AlGaAs as the barrier with the workfunction Δ (the difference between the barrier energy and the Fermi energy) indicated, the effective width of the nonzero field region is indicated by δ and the emitter doping forms a 3-D carrier distribution where the device reported on has 3×10$^{18}$ cm$^{-3}$ Be doped 158 Angstrom emitters and 800 Angstrom Al$_x$Ga$_{1-x}$As barriers.
FIG. 9b shows a schematic of a HEIWIP detector after processing where a window is opened on the top side for frontside illumination.

A typical HEIWIP detector structure is comprised of a doped emitter (absorber) region followed by an undoped barrier region as shown in FIGS. 9A and 9B. Although the structure appears similar to a QWIP the emitter/absorber in a HEIWIP is thicker than the well of a QWIP. As a result, the carriers will scatter before they can cross the emitter, forming a 3-dimensional distribution in HEIWIPs rather than being in quantized states as in a QWIP. The basic HEIWIP response mechanism comprises three parts: i) free carrier absorption of the IR photon producing the photoexcited carriers; ii) internal photoemission of the excited carriers at the interface; and iii) sweep out and collection of the emitted carriers by the applied field.

The basic approach to calculating the responsivity for a HEIWIP detector is somewhat similar to that done previously for the HIWIP detector.[15] The difference between the two cases is the origin of the barrier height workfunction and the effect of space charge. The responsivity is given by $$R = q\eta/hf \quad (4)$$

where q is the electron charge, η is the total quantum efficiency of the detector, f is the frequency, and h is Planck's constant. The total quantum efficiency for the HEIWIP detector is the product of the photon absorption efficiency ($\eta_a$) and the internal quantum efficiency ($\eta_i$, the probability that photoexcited carriers undergo internal photoemission) $\eta=\eta_a\eta_i$. In the present aspect, in contrast to the HIWIP detectors, the collection efficiency can be assumed to be unity, as the maximum barrier height is at the interface due to the absence of space charge effects. This allows all carriers scattered after internal photoemission to be collected. This differs from HIWIP examples in which space charge causes the barrier maximum to be located away from the interface.

The photon absorption efficiency of a single layer is given by $$\eta_a = (F/F_0)^2(1-\exp(-\alpha W)) \quad (5)$$

where α is the wavelength dependent absorption coefficient, W is the emitter layer thickness, F is the optical electric field in the emitter layer, and $F_0$ is the optical electric field incident on the device. The factor $(F/F_0)^2$ involving the electric fields is included to account for reflection at the interfaces and any resonance effects which may occur in the device. The optical electric field inside the device can be calculated as in Ref. 17. For high frequency operation resonant cavity effects can be significant, while at lower frequencies they are generally less important. In one particular example, for the THz range, large device thicknesses required for cavity effects (typically in the order of about ~15 μm for 1 THz response) make the use of cavities unfeasible for devices to be produced by MBE growth. In one aspect, it is possible to enhance the optical electric field strength by using plasmons generated by the incident field in a nanoscale metal structure. These plasmons can have greatly enhanced fields depending on the geometry of the metal nanostructure. [18, 19] For frequencies greater than about ~38 THz (8 μm), the absorption is a combination of free carrier and intersubband absorptions [7] that varies as $1/f^2$. The absorption is nearly independent of frequency below about 38 THz (>8 μm).

The internal quantum efficiency can be calculated using the same model used for HIWIPs [15] with Δ replaced by the HEIWIP value. This approach uses an escape cone model to calculate the probability that an excited carrier will be able to pass the barrier. This probability is then multiplied by the probability the carrier does not scatter before escaping to obtain $\eta_i$. The internal quantum efficiency is zero at the threshold frequency $f_0$ and increases continually as the frequency is increased. The shape of $\eta_i$ varies with doping concentration shifting the response towards longer wavelengths as the doping is decreased with Δ held fixed by varying x. The threshold frequency can be determined directly from $f_0=\Delta/4.133$ where $f_c$ is in THz and the workfunction $\Delta=\Delta_d+\Delta_x$ is in meV, with $\Delta_d$ the contribution from the band gap offset due to doping and $\Delta_x$ the contribution from the material difference.

Ignoring cavity effects, the optical electric field strength is constant in the device and the high frequency end of the response is independent of the Al fraction as $\eta_i$ becomes almost constant. The wavelength for peak response will decrease by roughly the same factor as $\lambda_0$ as Δ is increased since the slope of the low frequency region varies weakly with x. If the cavity effect is significant, it can be used to shift the peak response significantly from the non-cavity case. Maximum peak response occurs when the device thickness causes the cavity peak to match the position predicted from the non-cavity response curve. The absolute magnitude of the response can be increased in three ways: increasing 1) the doping, 2) the thickness, and 3) the number of emitter layers. There is a practical limit to increasing the doping density of the emitters due to corresponding increases in the dark current. At typical doping levels of $10^{18}$-$10^{19}$ cm$^{-3}$ the dark current does not vary significantly with the doping. However, for higher doping, dopant migration will introduce defects that can increase the dark current. In addition, in one example, the doping density should be in a region where the band gap narrowing will vary slowly in order to achieve a high uniformity in the devices.

In one aspect, the optimum emitter thickness depends on the number of layers that can be inserted in the device. For a single emitter layer structure, an exemplified thickness is about ~700 Angstroms, while for multi-layer structures (>20 layers) the exemplified thickness of the individual emitter layers is reduced to about 150-250 Angstroms as most of the absorption that contributes to the response comes from within about ~150-200 Angstroms of the barrier. For example, a 3 μm thick detector with 1000 Angstroms thick barriers would be optimized with 26 layers with 153 Angstroms thick emitters. To obtain the desired thickness for multilayer structures, the device thickness is determined to obtain a resonant cavity enhancement at the desired peak wavelength. Next, the barrier thickness is determined from the desired dark current limits with thick enough barriers to reduce the tunneling current to the desired level. With these two values fixed the number of layers and the associated emitter thickness is then determined to obtain the desired responsivity, in one example, the maximum responsivity.

Heterojunction Terahertz Detectors

Figure 10:
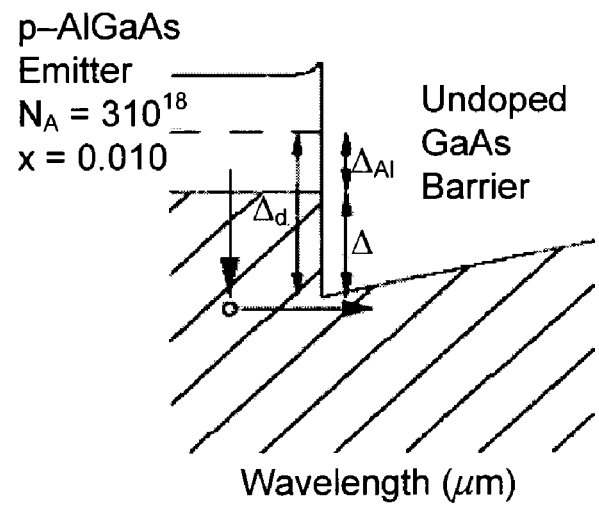
FIG. 10 shows a band diagram of the emitter/barrier interface for a device using doped AlGaAs as the emitter and GaAs as the barrier to extend f0 beyond 2.7 THz, and the parameters shown are for a device with f0=0.9 THz (λ0 about 335 μm) where the dashed line in the emitter indicates the Fermi level location if the emitter was GaAs and the contributions to Δ from the doping ($\Delta_d$) and Al fraction ($\Delta_x$<0) are indicated by the vertical arrows.

For exemplary GaAs/AlGaAs HEIWIP detectors, the doping level is typically in the range of about $10^{18}$-$10^{19}$ giving $\Delta_D$=9 meV. The band gap offset is given by $\Delta_x$=530δx where δx is the difference between the Al fraction in the barrier and emitter layers. For exemplary detectors with GaAs emitters and AlGaAs barriers, the Al fraction x can be reduced to x=0.005. Although x=0 is practical, the device will then no longer be considered a HEIWIP, and will instead be a HIWIP, which will have a reduced threshold for high doping, [21] and will have a ~9 meV offset for $N_A=3\times10^{18}$ cm$^{-3}$ giving $f_0$=2.17 THz. Further decreases in $f_0$ below 2.7 THz (i.e., beyond about ~110 μm) will require a change in the design due to the minimum $\Delta=\Delta_d$ from the band gap narrowing. One possible approach to avoid this limit is to use AlGaAs as the emitter and GaAs as the barrier. In such a device, the band gap narrowing in the doped AlGaAs will be partially offset by the band gap of the AlGaAs material relative to the GaAs (i.e., $\Delta_x<0$) as seen in FIG. 10. Measurements of the FIR absorption in AlGaAs films show the absorption is similar to GaAs, for low Al content. This indicates that AlGaAs emitter devices can be used to extend $f_0$ into the Hz region.

Exemplified GaAs Emitter Detectors

Three exemplified device structures were used to demonstrate the ability to tailor the threshold, each containing 30 periods of $3\times10^{18}$ cm$^{-3}$ Be doped 158 Angstroms GaAs emitters (W) and 800 Angstroms $Al_xGa_{1-x}As$ barriers giving 31 emitters with the etched top contact acting as an emitter. The Al fraction was varied, with x=0.02, 0.01 and 0.005 for samples #2409, 2410, and 2411 respectively, to adjust $f_0$. The expected barrier heights are 18, 13.5 and 11.2 meV respectively. The top and bottom contacts were Be doped to $1\times10^{19}$ cm$^{-3}$ with thicknesses 0.2 and 0.7 μm respectively. The devices were fabricated by etching 400×400 μm$^2$ mesas using standard wet etching techniques and then evaporating Ti/Pt/Au ohmic contacts onto the top and bottom contact layers. A 260×260 μm$^2$ window was opened through the top contact to provide front illumination to the device.

Figure 11:
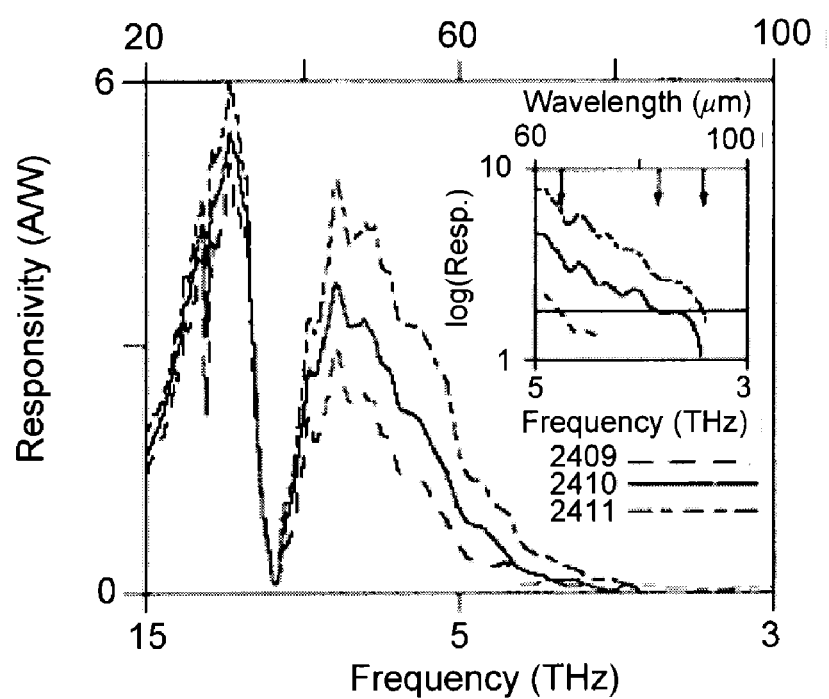
FIG. 11 shows experimental responsivity spectra for 2409, 2410 and 2411 at 3.5 kV/cm obtained at 4.2 K where the only difference in the samples was the Al fraction which was x=0.02, 0.01 and 0.005 for 2409, 2410 and 2411 respectively, the data shows a decrease in $f_0$ with decreasing x. The sharp decrease near 8 THz is due to the restrahlen effect. The inset shows a log plot of the raw response with all curves normalized to have the same noise level indicated by the horizontal line. The threshold (indicated by the arrows) variation, with $\lambda_0$=65, 84, and 92 μm for samples 2409, 2410 and 2411 respectively can be clearly seen.

The responsivity was measured using a Perkin-Elmer System 200 FTIR with a Si composite bolometer as a reference detector. The results obtained for all three samples at 3.5 kV/cm for 4.2 K are shown in FIG. 11 with a strong response for frequencies higher than 6 THz. The inset shows the raw response normalized so the noise determined from the deviation of multiple measurements was the same for all curves.

The threshold values were $f_0$=4.6±0.1, 3.9±0.1, and 3.6±0.1 THz (65, 84, and 92 μm) for samples 2409, 2410 and 2411 respectively as indicated by the arrows. The responsivity at 10 THz (30 μm) was ~5.6 A/W for samples #2409 and 2410 and 6.0 A/W for 2411. The cavity peak is expected near 8 THz (λ=42.5 μm) corresponding to thickness ~λ/4; but cannot be observed here as this is in the restrahlen region. The total quantum efficiency determined from the responsivity was 22% for #2409 and 2410 and 25% for 2411 at 10 THz (30 μm). The slight difference in response between the samples is probably due to a combination of the resonant cavity effect and the strong drop in absorption in the restrahlen region.

Figure 12A:
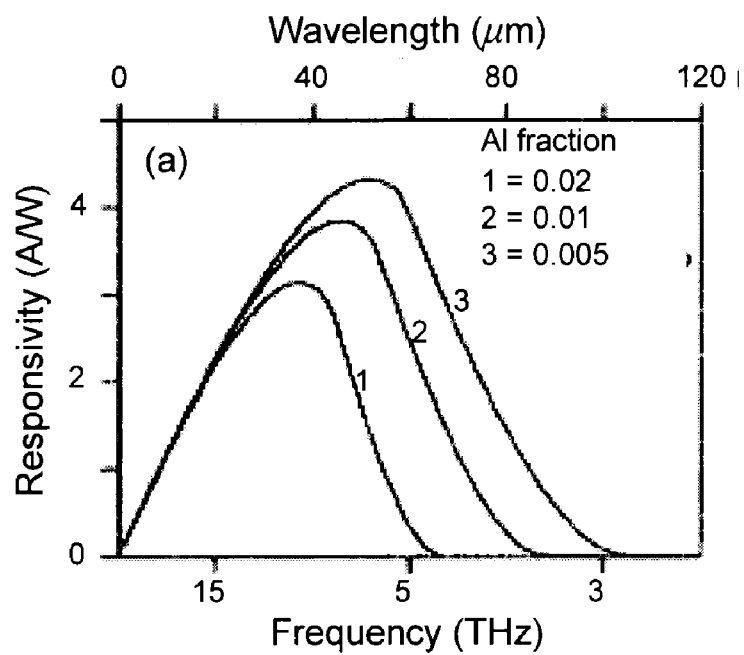
FIG. 12a shows a calculated spectra for 150 Angstrom, 3×10$^{18}$ cm$^{-3}$ p doped GaAs emitter with Al$_x$Ga$_{1-x}$As barrier forming a single layer detector with the electric field of 1000 V/cm for different Al fractions corresponding to the experimental samples.

The noise current of the detectors was measured using a spectrum analyzer and used to obtain D*, which was $4\times10^{10}$ Jones for #2409 and 2410 and $3.6\times10^{10}$ Jones for 2411 at 4.2 K. Internal photoemission is more efficient at lower frequencies, [15] with the free-carrier absorption expected to be proportional to $f^2$ causing the responsivity to increase as frequency decreases. Referring to FIG. 12A, calculated single layer responsivities are in good agreement with the experimental results. The experimental data shows increased response at low frequency with decreased Al fraction while the high frequency region showed similar response for all three samples. The model response was slightly lower than the experimental data due to gain effects, which are not included in the model. Further, the threshold variation showed good agreement between the value predicted from the design values, the value predicted from measurements of $\Delta$ using Arrhenius plots, and the measured data and shown in Table 1.

Figure 12B:
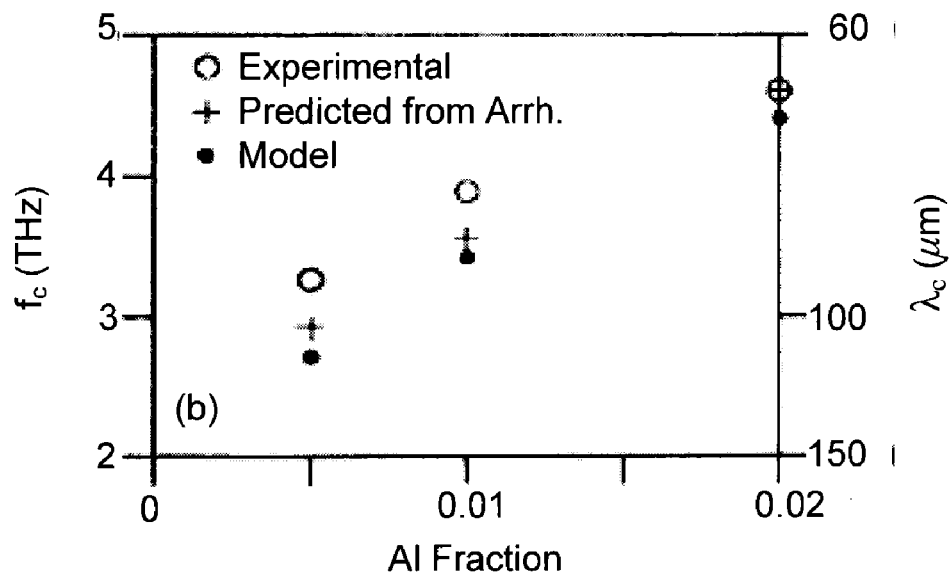
FIG. 12b graphically shows the variation in threshold frequency with Al fraction showing a comparison of the spectral threshold, the threshold predicted from the Arrhenius plot and the model result. The discrepancy between the experimental and predicted results is probably due to small variations in Al fraction.

The observed $f_0$ as well as the values predicted from a modified Arrhenius plot of dark current variation with temperature and the model for the three samples are shown in FIG. 12B and Table 1. The threshold frequency decreased ($\lambda_0$ increased) as the Al fraction was decreased. The difference in the experimental and model values corresponds to a variation of 1-2 meV in the barrier height which may be due to the deviation of the Al fraction from the nominal value or of the band gap narrowing. There is also a small difference between the spectral and Arrhenius values for $f_0$ that is probably due to inelastic scattering of photoexcited carriers before emission. [22]

Exemplified AlGaAs Emitter Detectors

To demonstrate the ability to extend the threshold below the limits achievable with GaAs emitters, a detector using AlGaAs emitters and GaAs barriers was used. This is possible because for very low (x<0.017) Al fraction, the bandgap of doped AlGaAs is less than the bandgap for undoped GaAs although this is not possible for higher values of x. The $Al_{0.005}Ga_{0.995}As/GaAs$ HEIWIP detector structure (V0207) was grown by MBE on a semi-insulating (100) GaAs substrate. The structure is comprised of 10 periods of $3\times10^{18}$ cm$^{-3}$ Be-doped 500 Angstroms thick $Al_{0.005}Ga_{0.995}As$ emitter and 2000 Angstroms thick GaAs barrier sandwiched between two contacts. The top and bottom contacts are $1\times10^{19}$ cm$^{-3}$ Be-doped 500 Angstroms and 7000 Angstroms thick $Al_{0.005}Ga_{0.995}As$ layers, respectively.

TABLE 1

| Sample | Δspec (meV) | ΔArrh (meV) | Δmodel (meV) | fspec (THz) | fArrh (THz) | fmodel (THz) | λspec (μm) |
|---|---|---|---|---|---|---|---|
| 2409 | 19.0 ± 0.1 | 19.0 ± 0.2 | 19.6 | 4.6 ± 0.1 | 4.6 ± 0.1 | 4.4 | 65 ± 1 |
| 2410 | 15.0 ± 0.1 | 14.5 ± 0.2 | 14.3 | 3.9 ± 0.1 | 3.5 ± 0.1 | 3.3 | 84 ± 1 |
| 2411 | 13.4 ± 0.1 | 12 ± 0.2 | 11.6 | 3.6 ± 0.1 | 2.9 ± 0.1 | 2.7 | 92 ± 1 |

Table 1 shows exemplary predicted model and measured (spectral and Arrhenius) barrier heights, threshold frequencies and wavelengths for the three samples showing the variation with the Al fraction in the barriers. The small variation between the model and spectral values is probably due to small deviations of the actual parameters from the design values.

The sample was processed using a similar procedure as the GaAs emitter samples. As the top contact is only 500 Angstroms thick, no etching was done to reduce the thickness. Thus, the top contact was included as a part of the first emitter in calculating hot carrier injection for the model response. This is the only difference from the previous devices which used thicker top contacts, and required a window to be etched for front illumination.[23]

Figure 13A:
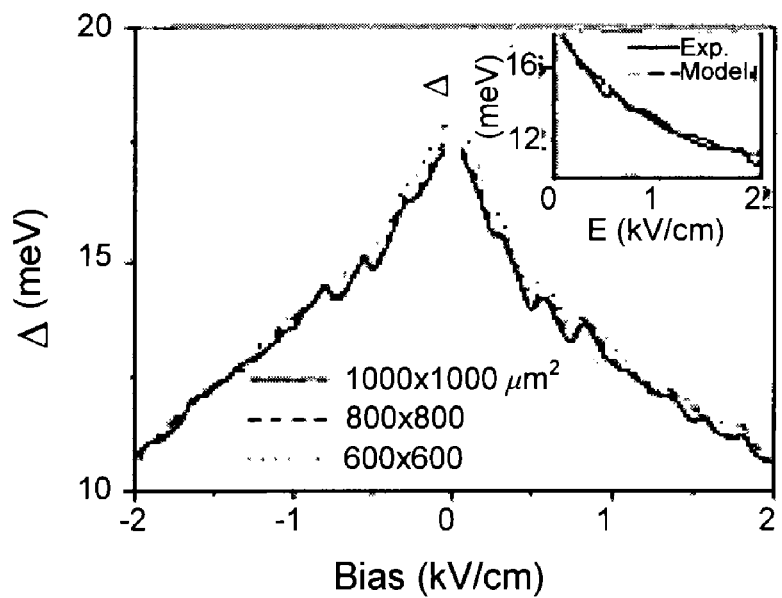
FIG. 13a graphically illustrates a variation of workfunction, Δ with the bias field for three mesas with different electrical areas for the AlGaAs emitter device. The workfunction at different bias fields were obtained using Arrhenius plots. The zero bias workfunction is ~17 meV for all the mesas. Inset shows the experimental and model variation of barrier height for the device with 1000×1000 μm$^2$ electrical area.
Figure 13B:
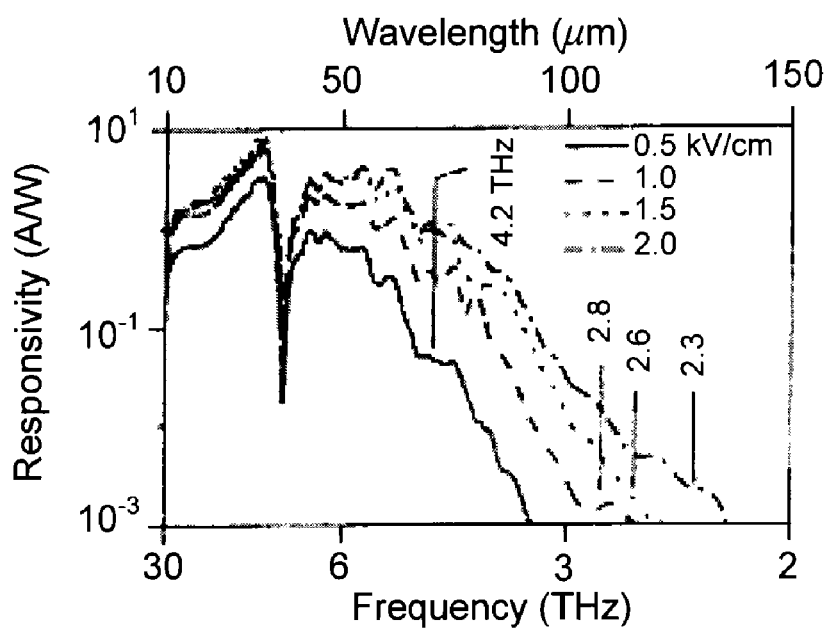
FIG. 13b graphically shows the variation of responsivity with applied field for sample V0207 at 4.8 K. The peak responsivity, 9 A/W at 9.6 THz, was obtained at 1.5 kV/cm. The increase in response with the field around $f_0$ is due to threshold shift with the bias. The sharp dip at ~8 THz is due to the interaction of radiation with GaAs-like TO phonons. The bias field decreases the effective work function pushing $f_0$ towards 2 THz with the increasing field.

The dark current at different temperatures were used to obtain $\Delta$ through Arrhenius plots. The variation of $\Delta$ with the bias field for three devices with different electrical areas are shown in FIGS. 13A and 13B. The uniform workfunction is an advantage for detector arrays in terms of spectral shape and detectivity. The $\Delta$ at zero bias is ~17 meV for all the mesas decreasing to 10.5 meV at 2 kV/cm. The source of this strong bias dependence may be the result of band bending in the barrier. The small periodic spikes seen on the curves may be due to resonant tunneling through defects in the structure.

This is possible because of the low temperature maintained during the growth to minimize the expected Be diffusion.[24]

The variation of responsivity with the bias field at 4.8 K is shown in FIG. 13B. For frequencies>6 THz, the responsivity increases with the field with a maximum of 9 A/W at 1.5 kV/cm. The lower frequency (<6 THz) response continues to increase with the field due to the reduction in Δ (see FIG. 13B). As expected, $\Delta_b$ decreases with the field, increasing the threshold to 2.3 THz for a bias field of 2.0 kV/cm as seen in FIGS. 13A and 13B. The increased noise at increased bias prevented of further increases in $f_0$ with bias. The threshold frequencies along with the peak responsivity, quantum efficiency and D* for different bias fields are shown in Table 2. For 2 kV·cm bias ($f_0$=2.3 THz), the peak response is at 9.6 THz (31 μm), where the responsivity, quantum efficiency, and dark current limited specific detectivity are 7.3 A/W, 29% and $5.3 \times 10^{11}$ Jones, respectively. Intrinsic dark noise levels used for D* were found by measuring four noise current components as in Ref. 12 using a signal analyzer. A dark current limited peak detectivity of $1.5 \times 10^{13}$ Jones, which is close to the shot noise limit, was obtained at the bias field of 1.5 kV/cm at 4.2 K. The differential resistance of the detector at bias fields<1.5 kV/cm is in the range of several giga ohms. At very high impedance, the measured noise was limited by the Johnson level of the load resistor. Further a BLIP temperature of 20 K for a 0.15 kV/cm bias field was recorded.

TABLE 2

| Bias field (kV/cm) | $\lambda_0$ (μm) | $f_0$ (THz) | $R_P$ (A/W) | $\eta_P$ (%) | $D_P^*$ (Jones) | $D_{Shot}$ (Jones) |
|---|---|---|---|---|---|---|
| 0.5 | 71.2 ± 0.3 | 4.21 ± 0.02 | 3.4 | 13 | — | — |
| 1.0 | 108.1 ± 0.6 | 2.77 ± 0.02 | 6.3 | 25 | — | — |
| 1.5 | 115 ± 6 | 2.6 ± 0.1 | 9.0 | 36 | $1.5 \times 10^{13}$ | $1.7 \times 10^{13}$ |
| 2.0 | 128 ± 9 | 2.3 ± 0.2 | 7.3 | 29 | $5.3 \times 10^{11}$ | $1.5 \times 10^{12}$ |

The variation of threshold wavelength and frequency with the applied bias field for detector V0207 is shown in Table 2. As shown, the increasing field decreases the band bending in the barrier which decreases the threshold frequency.

Terahertz Detectors from Nitride Heterojunctions

The GaAs/AlGaAs system has been the subject of intense research for developing infrared (IR) devices, and well studied focusing the every aspects in the material system. IR detectors were developed covering the range from near- to far-IR (THz) based on GaAs/AlGaAs system. Based on the rapid development of arsenide materials during past two decades, the optimization of the devices has almost reached its limit. This emphasizes the use of other material systems which are expected to be advantageous over GaAs/AlGaAs system. A THz HEIWIP detector based on GaN/AlGaN heterostructure has been developed and researchers have demonstrated GaN/AlGaN QWIPs[26] operating in NIR or MIR regions. Here a GaN/AlGaN FIR or THz detector is reported, and the successful results promises the feasibility of substituting As with N. The higher electron effective mass in GaN compared to GaAs would reduce the low dark current and increasing operating temperature. In addition, the reported detector would be radiation hard and could act as a solar blind UV/IR dual band detector.

Figure 14A:
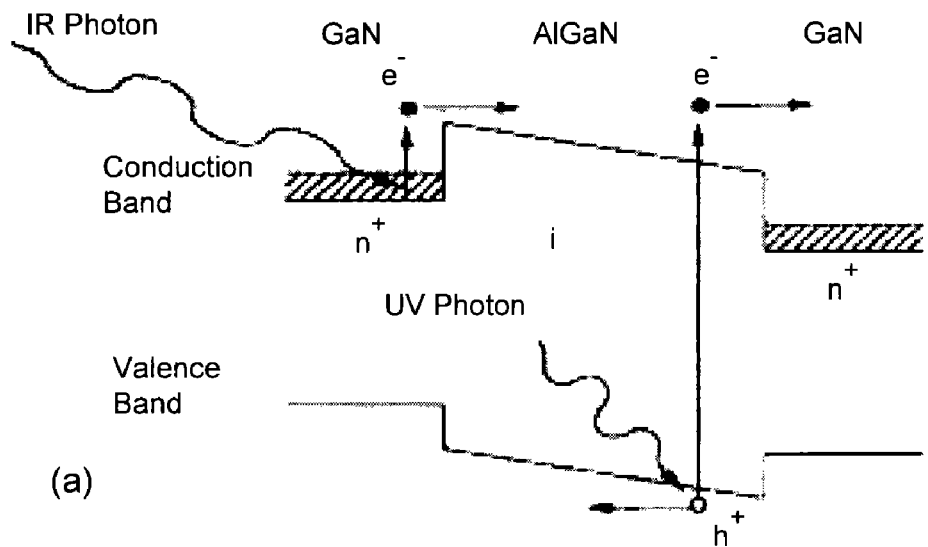
FIG. 14a shows a band diagram for the GaN detector showing the intraband (IR) process and a possible intraband transition providing UV detection which will give a dual band detector.
Figure 14B:
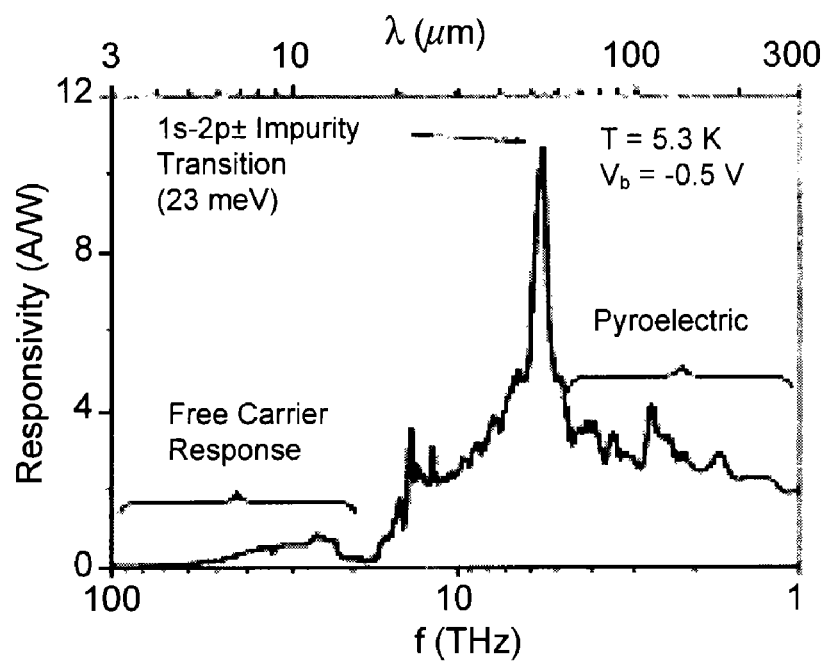
FIG. 14b shows the IR response with an FIR threshold of ~300 µm at 5.3 K under −0.5 V bias.
Figure 15A:
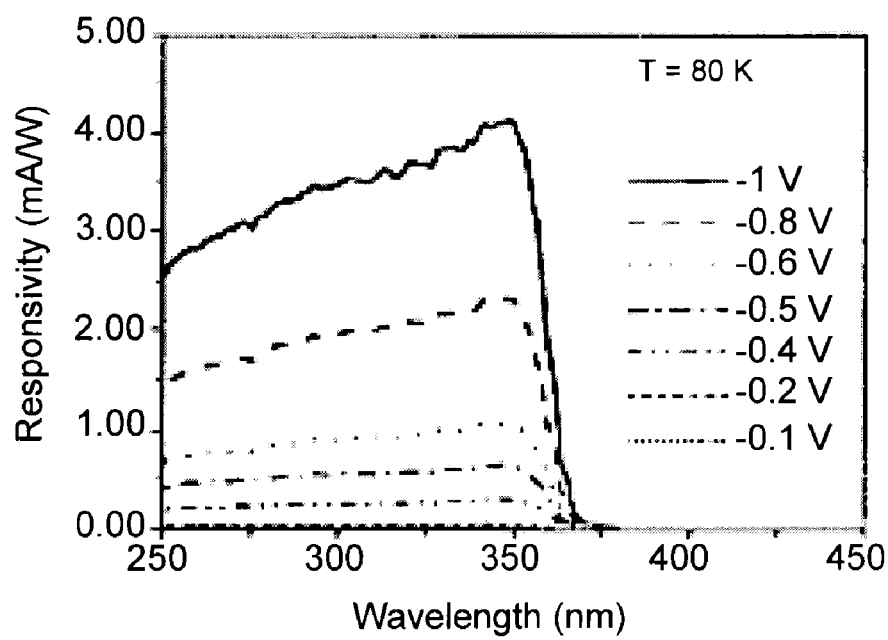
FIGS. 15a and 15b show the UV response with bias voltage of mesa $E_a$ for (a) reverse and (b) forward biases taken at 80 K. The threshold corresponds to the AlGaN bandgap. The reverse bias response is much stronger than the forward bias response.
Figure 15B:
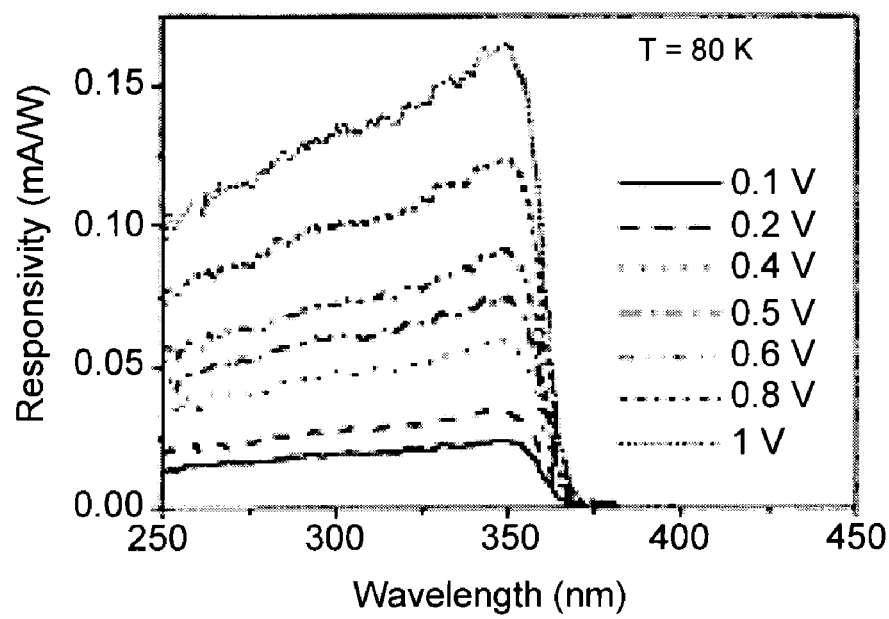

In one example, the GaN/AlGaN HEIWIP structure is grown by MOCVD on sapphire substrate, and n-doped GaN and undoped AlGaN are used for the emitter and the barrier, respectively. A doped GaN layer is used as the bottom contact, while the emitter itself acts as the top contact. The thickness and the doping concentration of the GaN emitter, and the GaN bottom contact are 0.2 μm, $5 \times 10^{18}$ cm$^{-3}$, 0.7 μm, $5 \times 10^{18}$ cm$^{-3}$, respectively, and the thickness of the undoped AlGaN barrier is 0.6 μm. The Al fraction of AlGaN is set to 0.026 to give a 15 μm threshold. The sample was annealed under a $N_2$ gas flow at 700° C. for two minutes. The devices were processed and a 400×400 μm device was used for characterization. FIG. 14B shows the calibrated spectral response of the detector at 5.3 K under −0.5 V bias. As indicated, there are three features in the spectral response curve. The region below ~15 μm is the free carrier response and the threshold is in good agreement with the band offset of the structure. The sharp peak at 53.6 μm (23 meV) is due to the transitions of impurity states of Si in GaN, and this is closely related to the reported 1s-2p donor (Si) excitation in GaN (21.7 meV). The broad response from 65-300 μm is due to thermal excitations or pyroelectric effects in the structure. The response in the range 20-300 μm provides the evidence for obtaining a broad range in this region. This is an advantage over GaAs/AlGaAs system since the reststrahlen band in GaAs lies at about 37 μm.

Exemplary p-GaAs Dual Band Detector

In yet another embodiment, the present invention comprises a dual band HIWIP detector which responds in both near- and far-infrared (NIR and FIR) regions. In the p$^+$-i-p$^+$ detector structure, the emitter is carbon doped to $1.5 \times 10^{19}$ cm$^{-3}$, and a 1 μm thick GaAs layer acts as the barrier followed by another highly p-doped GaAs contact layer. The NIR response is due to the interband transition in GaAs barrier layer and the threshold wavelength observed at 0.82 μm is in good agreement with the 1.51 eV band gap of GaAs at 4.2 K. The intraband transition giving rise to FIR response is observed up to 70 μm. Interband responsivity was (under 100 mV reverse bias at 20 K) ~8 A/W at 0.8 μm, while the intraband responsivity was ~7 A/W. The detector has peak detectivities, D* ~$6 \times 10^9$, and $5 \times 10^9$ cmHz$^{1/2}$/W at 0.8, and 57 μm wavelengths respectively, under 100 mV reverse bias at 20 K.

In addition to space astronomy applications, multiband detectors can be useful in numerous other applications. While recently reported dual band[31,32] and multiband[33, 34, 35] detectors can detect near-infrared (NIR) and mid-infrared (MIR) radiation, the reported detector has the ability to detect NIR, MIR and far-infrared (FIR) radiation up to 70 μm. In applications such as mine detection, the use of images in two different spectral bands can aid in the detection and reduce the number of false positives. Also the NIR portion of the detector could be used to detect the muzzle flash to locate the position of enemy troops, while the FIR radiation is useful for determining troops and operating vehicles. Moreover, a multiband detector can be used as a remote thermometer by taking the difference in the spectral information of the signal for the two bands.

The reported HIWIP detector is comprised of $1.5 \times 10^{19}$ cm$^{-3}$ Carbon-doped emitter layer and a barrier layer which is placed in between two conducting layers used as the top contact and the bottom contact. The Fermi level in the emitter layer lies above the valence band edge of the barrier layer and produces an interfacial workfunction that determines the FIR threshold wavelength. Reported HIWIP FIR detectors[36, 37] have been mainly focused on the intraband transitions within the structure. In the present invention, a GaAs based HIWIP detector is presented which can be operated in NIR and MIR/FIR regions due to interband and intraband transitions in the detector structure, respectively. By replacing the As with N, i.e., using GaN material system, the NIR response can be extended up to ultra-violet (UV).

Figure 16A:
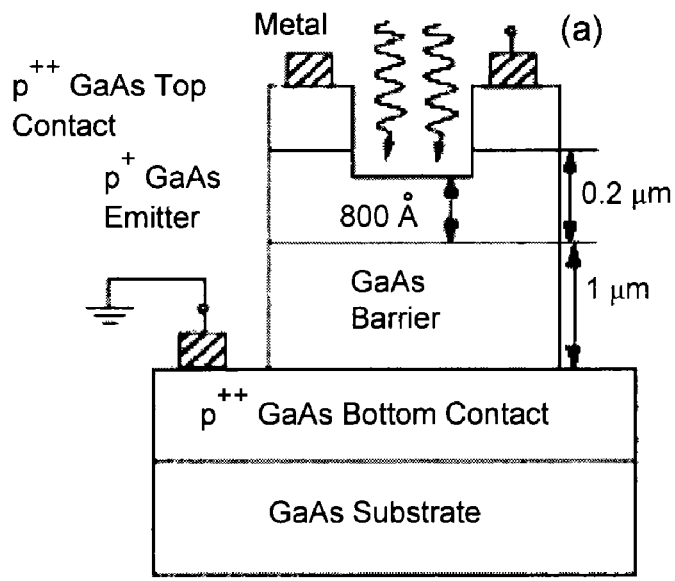
FIG. 16a shows a schematic of p-GaAs single emitter HIWIP dual-band detector after processing. The top contact, emitter, barrier, and bottom contact have thickness of 120 nm, 200 nm, 1.0 µm, and 1 µm respectively. A window on the top of the device is made for front side illumination, leaving only about 800 Å as the emitter thickness.

The HIWIP sample was grown by the metal organic chemical vapor deposition technique at 610° C. on a semi-insulating GaAs (100) substrate. The structure is comprised of a bottom contact (p++) layer with 1.0 μm thickness, a barrier layer with 1.0 μm thickness, an emitter (p+) layer with 0.2 μm thickness, and a top contact layer. However, the top contact and a part of the emitter layer are etched out to leave about 800 Angstroms thick emitter region (out of 0.2 μm) as shown in FIG. 16a, in order to process mesas for characterization. The layer parameters (thickness and doping level) of the sample was confirmed by secondary ion mass spectrometry (SIMS). The mesas have different sizes of optical windows and the spectral measurements were carried out on a mesa with about a 460 μm×460 μm optical window.

Figure 16B:
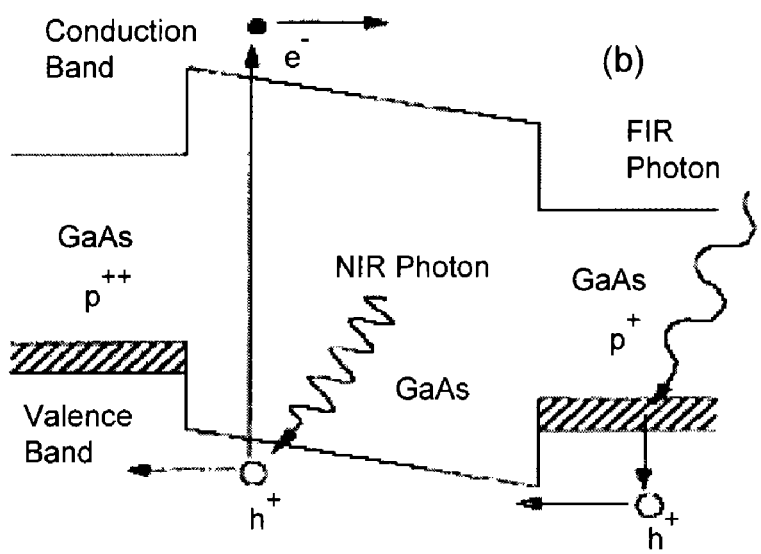
FIG. 16b shows a band diagram for HIWIP dual-band detector indicating both interband and intraband transitions leading to NIR and MIR/FIR responses.

The band diagram of the structure is shown in FIG. 16(b). The photons with energy above the band gap (NIR) are absorbed in the barrier giving rise to a transition of carriers (electron-hole pair) between the conduction and valence band of the GaAs barrier. The electron-hole pairs generated in the emitter would have to undergo internal photoemission before being collected. This process is same as MIR generated carriers (intraband transition) in the emitter. Incident photons with energy below the band gap (MIR/FIR), absorbed in the emitter layer (free carrier absorption), photo-excite carriers which then undergo internal photoemission across the barrier. The offset between the Fermi level in p-doped emitter layer and the valence band of GaAs barrier is defined as the interfacial workfunction (Δ) which determines the FIR threshold wavelength. The photoexcited carriers are finally swept out of the active region and collected at the contact by the applied electric field. The detector is characterized by current-voltage (IV) and spectral responsivity measurements from 4.6 K to 20 K. The spectra were obtained using a System 2000 Perkin Elmer Fourier Transform Infrared spectrometer with three beam splitters. The calibration of spectra was done by using a spectrum obtained with a Si composite bolometer with the same combination of optical components. Since the detector responds in both bands under the same conditions, it is not tunable without exterior optical filtering.

Figure 17:
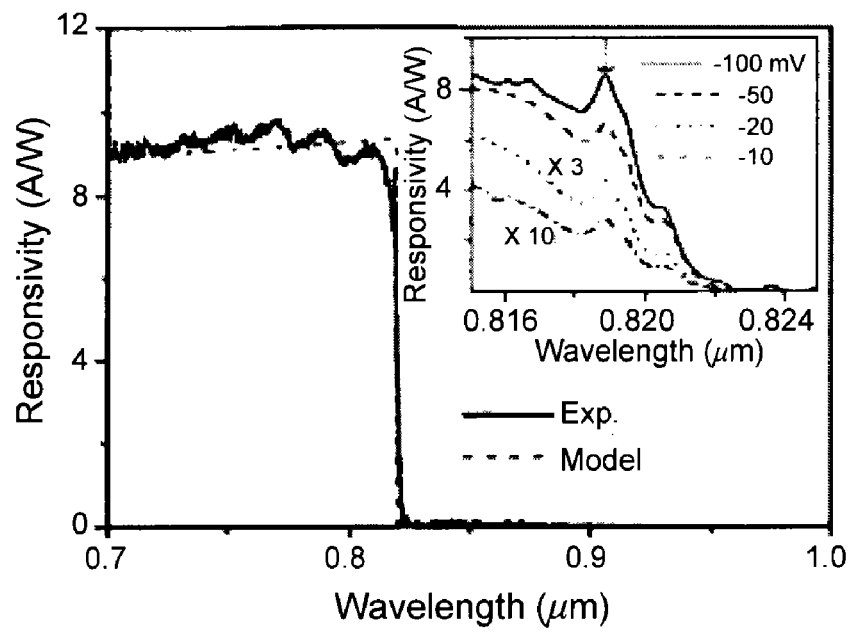
FIG. 17 shows the interband response fitted with a model for 100 mV reverse bias. The inset shows the bias dependence of the exciton peak at the threshold end of the experimental response curve. The two curves for 10 and 20 mV reverse bias have been multiplied by 10 and 3 for clarity.

The NIR spectral response due to interband transition of carriers in GaAs barrier layer is shown in FIG. 17. The solid line represents the experimental curve for 100 mV reverse bias while the dashed line represents the calculated curve based on a model[37] in which the absorption coefficient for interband was calculated using the permittivity model described in Ref. [38]. With the band gap in GaAs being 1.51 eV, the threshold wavelength observed at 0.82 μm confirms the interband transition in GaAs. The optimum responsivity at 0.8 μm is ~9 A/W while the detectivity is ~2.7×10$^{11}$ cmHz$^{1/2}$/W under 100 mV reverse bias at 4.6 K. The oscillations seen in the NIR region diminishes with the applied electric field and the temperature. As shown in the inset to FIG. 17, the small peak at 0.819 μm (1.514 eV) is due to excitons[39] in GaAs and the amplitude of this peak increases with increasing bias.

Figure 18A:
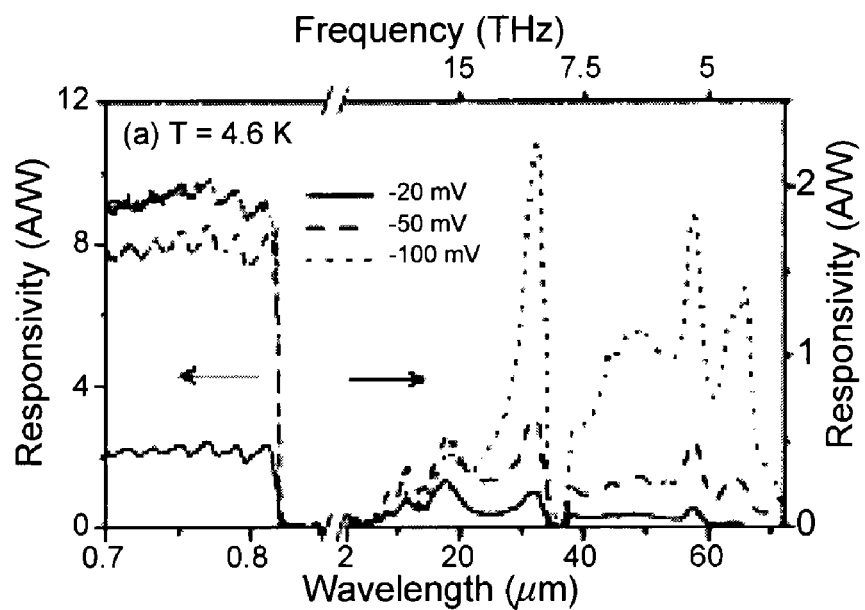
FIG. 18a shows both interband and intraband response at 4.6 K under different reverse bias values.

The spectral response for different bias voltages in both NIR and FIR regions at 4.6 K is given in FIG. 18a. The response due to intraband transition is observed up to 70 μm and it has a responsivity of ~1.8 A/W and a detectivity of ~5.6×10$^{10}$ cmHz$^{1/2}$/W at 57 μm under 100 mV reverse bias. Since the interband response is optimum at 100 mV reverse bias, FIG. 18a shows the spectra for both bands only up to 100 mV reverse bias. The oscillations in the MIR region observed are due to Fabry-Perot interference arising from the 1 μm thick GaAs barrier layer in the device structure. The sharp drop around 37 μm is due to the strong absorption around the reststrahlen band of GaAs. The two peaks at 57 and 63 μm are due to transitions of hydrogenic like impurity atoms in the barrier region from the impurity ground state to the excited states[37]. These transitions show a strong bias dependence due to the fact that the carriers excited to upper states undergo tunneling through the barrier, formed by the Coulomb potential of acceptors, with the support of the external applied field.

Figure 18B:
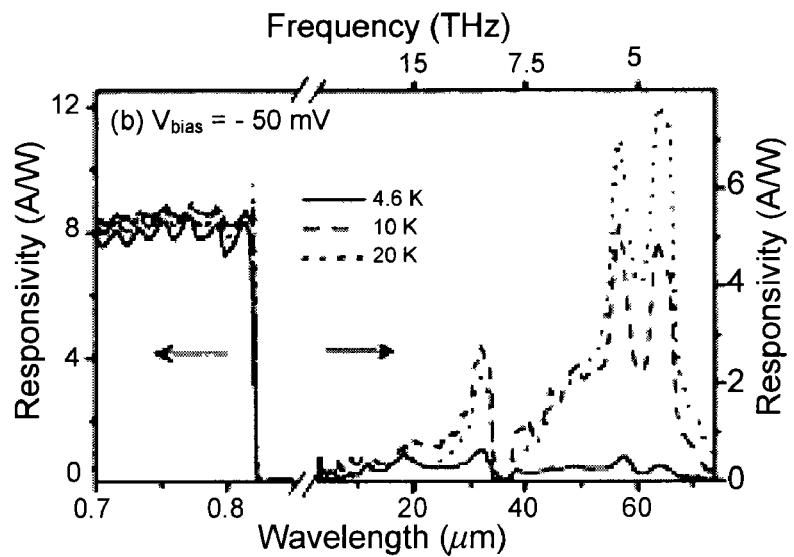
FIG. 18b shows both interband and intraband response at different temperatures under −50 mV bias. The left and right axes are corresponding to NIR and FIR responsivity respectively and a break on wavelength axis at 2 µm has been made in order to expand the view in both regions.

The spectral responsivity curves due to both interband and intraband transitions measured from 4.6 K to 20 K are shown in FIG. 18b. An optimum responsivity of ~8 A/W and a detectivity of ~6×10$^9$ cmHz$^{1/2}$/W were obtained at 0.8 μm for interband response, while a responsivity of 7 A/W and a detectivity of 5×10$^9$ cmHz$^{1/2}$/W were reported at 57 μm, under 100 mV reverse bias at 20 K. The responsivity of 63 μm and 57 μm peaks show strong dependence with the temperature and the 63 μm peak is relatively high at higher temperatures. This is caused presumably by the increased rate of collecting carriers excited to the upper states from the impurity ground state. If the rate of collection of excited carriers by the external circuit is low, the excited carriers either will relax back in to the ground state or can occupy the excited states resulting in a high population density. At high temperature, the rate of collection of excited carriers over the barrier can be enhanced by the thermal energy leading to enhanced responsivity.

Figures 19A, 19B, 19C:
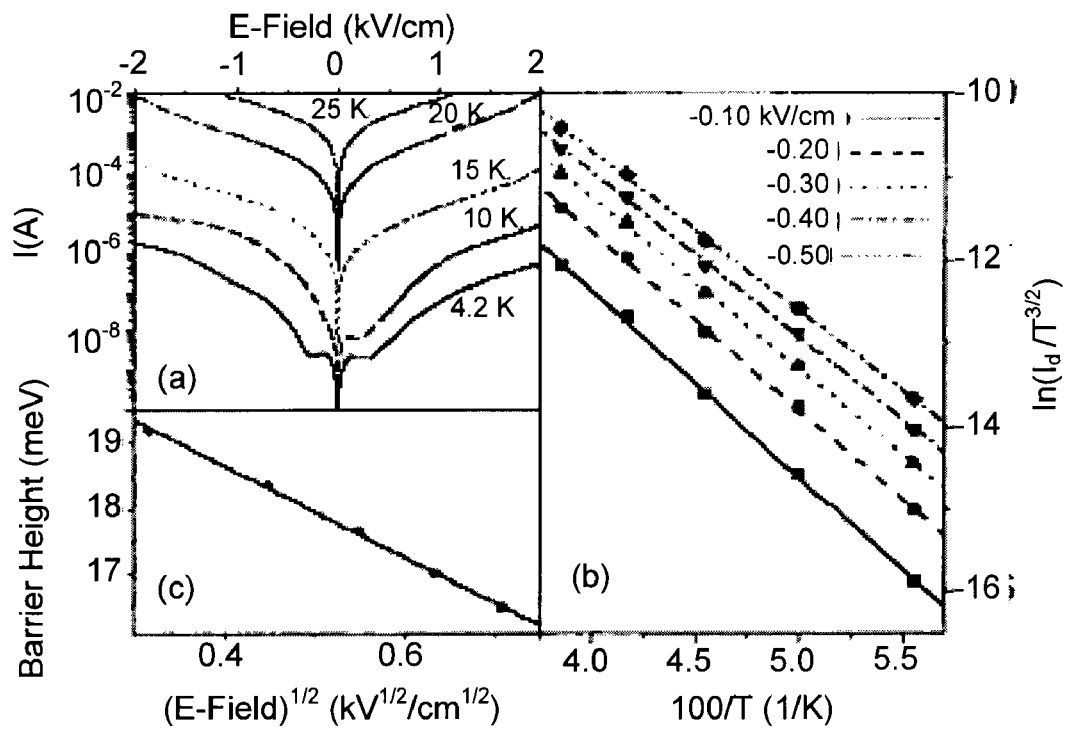
FIG. 19a shows an IV curves at different temperatures under dark condition. The asymmetry in the IV is probably due to the asymmetry in the structure.
FIG. 19b shows the Arrhenius curves under different reverse electric fields.
FIG. 19c shows the variation of calculated effective barrier height based on Arrhenius plot with the square root of applied electric field.

The variation of the dark current at different temperatures are given in FIG. 19a. The asymmetry in the IV curve is due to the asymmetry in the structure. Arrhenius plots under different reverse electric fields are shown in FIG. 19b and the dots represent the experimental data while lines represent the linear fit. The effective barrier height (Δ) can be calculated from the slope of the fitted lines. FIG. 19c shows the dependence of effective barrier height on square root of applied field and the fitted line denotes that the effective barrier height has a linear relationship with the square root of applied electric field. Δ increases with the applied bias[6] giving rise to an increasing threshold with bias. At 0.20 kV/cm field, Δ is 18.4 meV which is corresponding to 67.5 μm threshold and similarly at 0.50 kV/cm field, the Δ is 16.5 meV giving 75 μm threshold. These results are consistent with the spectral response curves shown in FIG. 18a.

In order to detect UV along with IR, a modification of the HIWIP structure with GaN/AlGaN is also feasible. Using an n$^+$-i-n$^+$ structure, a GaN/AlGaN/GaN UV detector can detect UV radiation by interband absorption in the AlGaN layer. UV detectors have already been demonstrated by several groups [40,41] using a GaN/AlGaN system. Intraband transitions giving rise to IR absorption in GaN/AlGaN will be similar to that in GaAs/AlGaAs HIWIP detectors [42]. The IR photons will be absorbed in heavily doped GaN emitter layer photo-exciting the electrons within the conduction band. Due to strong TO phonon-photon interaction and phonon absorption, a deep valley at ~18 μm in the responsivity curve of a GaN/AlGaN detector (~37 μm for GaAs/AlGaAs) is expected. Compared to the GaAs/AlGaAs system, GaN/AlGaN has advantages in controlling the Al fraction over a wide range and the broad continuous spectral response range.

Thus, the disclosed GaAs structure gives rise to the stated NIR and MIR/FIR response. High performance of the detector demonstrate the potential applications where the detection in both NIR and MIR/FIR are desired. By using different material system such as, for example, GaN/GaN instead of GaAs/AlGaAs, the detection capability of the detector can be extended into the UV range, thereby providing a dual band detector covering UV and FIR regions.

Exemplary GaN/AlGaN UV/IR Dual Band Heterojunction Detector

Yet other embodiments according to the present invention comprise GaN/AlGaN ultraviolet/infrared dual-band detectors configured to detect UV and IR. In a first embodiment, a HEIWIP detector based on a GaN/AlGaN heterostructure configured to be operable in both UV and IR (8-14 µm) regions is provided. UV/IR dual band detectors may be used in applications where the detection of both UV and IR radiation is challenging. For example, fire and flame detection where fires emit radiation from UV to IR and different flames such as hydrogen and coal have significant intensity variation in the emission spectrum in the UV and IR regions.

Figures 20A, 20B:
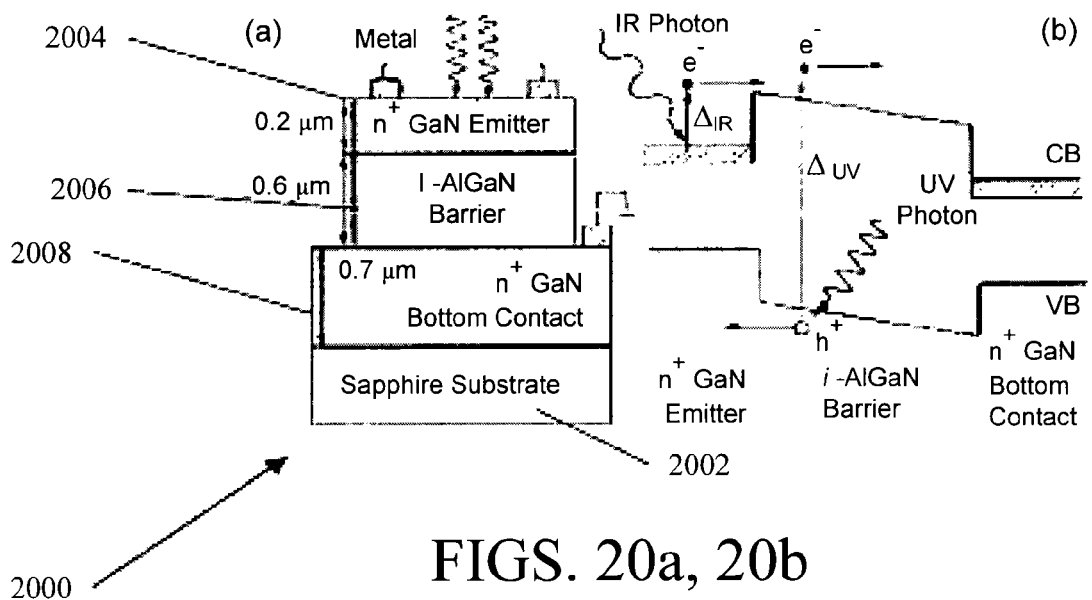
FIG. 20a is an exemplary embodiment of a HEIWIP detector based on a GaN/AlGaN heterostructure.
FIG. 20b is an exemplary energy band diagram indicating the transitions due to both mechanisms of UV detection is based on interband transitions of carriers in the $Al_{0.026}Ga_{0.974}N$ barrier, and IR detection based on intraband transitions of free carriers in the emitter.

FIG. 20a is an exemplary embodiment of a HEIWIP detector based on a GaN/AlGaN heterostructure. The HEIWIP structure 2000 was grown by organometallic chemical vapor deposition on sapphire substrate 2002 and comprises a n$^+$GaN emitter layer (also serving as the top contact) 2004, an undoped $Al_{0.026}Ga_{0.974}N$ barrier 2006, and a GaN n$^+$ bottom contact layer 2008. The sample was annealed under a $N_2$ gas flow at 700° C. for 2 min.

The dual-band detection mainly involves two detection mechanisms. The UV detection is based on interband transitions of carriers in the $Al_{0.026}Ga_{0.974}N$ barrier 2006, while the IR detection is due to intraband transitions of free carriers in the emitter 2004. The energy band diagram indicating the transitions due to both mechanisms is depicted in FIG. 20b. The intraband detection (IR) mechanism involves free carrier absorption in the emitter, followed by the internal photoemission of photoexcited carriers across the junction barrier, and then the collection of carriers by the applied electric field at the contacts. The offset between the Fermi level in the emitter layer and the valance band edge of the barrier layer forms the interfacial work function (Δ), which arises due to the band offset of different materials[51] and the band gap narrowing [4] of the highly doped emitter layer. The threshold wavelength $\lambda_0$ (in micrometers) is given by 1240/Δ, where Δ is in meV.

Figure 21:
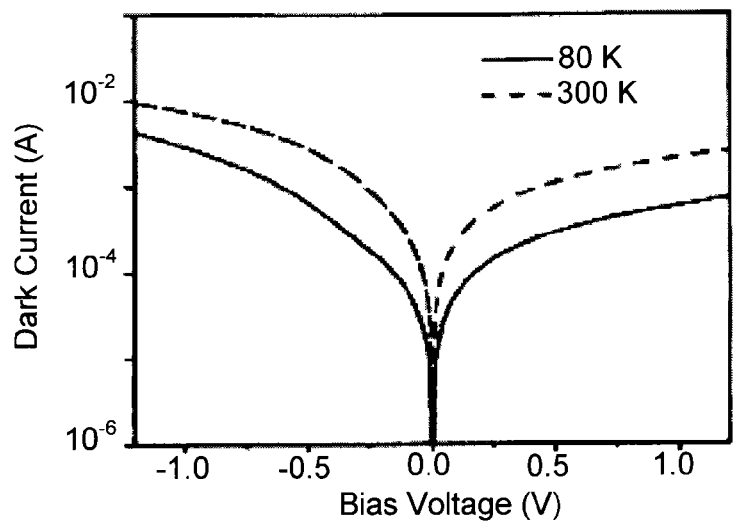

Current-voltage (IV) measurements were carried out by using a Keithley 2400 source meter. The dark IV characteristics of the detector 2000 are shown in FIG. 21. The higher dark current of the detector compared to other detectors operating in the similar regions is possibly ascribed to hopping conductivity of Si impurity electrons in the barrier. The presence of Si impurities has been confirmed by the response peaks corresponding to impurity photoionization of impurity atoms, which is discussed later.

Figures 22A, 22B:
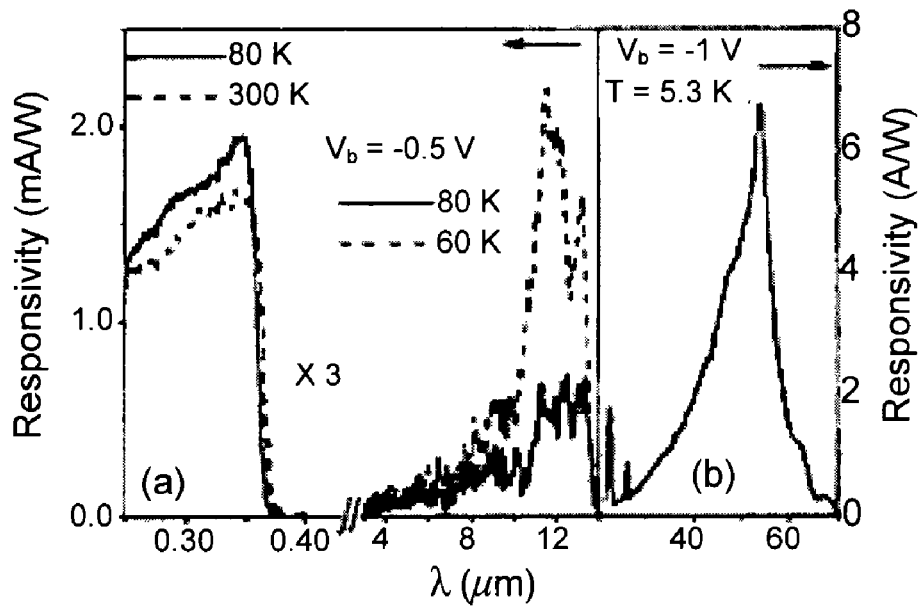
FIG. 22a is an illustration of UV/IR dual-band response of an exemplary detector.
FIG. 22b is an illustration of a sharp peak at 54 µm (5.5 THz) observed in the response spectrum due to the transition between 1s and 2p± impurity levels of Si in GaN.

The UV/IR dual-band response of this embodiment of a detector is shown in FIG. 22aa. The UV spectra were obtained using, for example, an Oriel Deuterium UV source, UV/visible (VIS) monochromator, and neutral density filters, and spectra were calibrated using a background spectrum obtained by a Hamamatsu photomultiplier tube with a known sensitivity. As shown in FIG. 20b, UV photons excite the valance electrons in the $Al_{0.026}Ga_{0.974}N$ barrier layer, and the generated electron-hole pairs are separated by the applied electric field before recombination. The UV threshold wavelength observed at 360 nm matches the band gap of $Al_{0.026}Ga_{0.974}N$ alloy. The IR spectral response of the detector was obtained for normal incidence radiation using a Perkin Elmer System 2000 Fourier transform infrared spectrometer. The spectra were calibrated by using a background spectrum obtained with a Si composite bolometer with the same set of optical components. The free carrier absorption occurs in the emitter layer and carriers undergo photoemission across the barrier (see FIG. 20b). The detector shows a 14 µm free carrier threshold and peaks at 12 µm.

Figure 23:
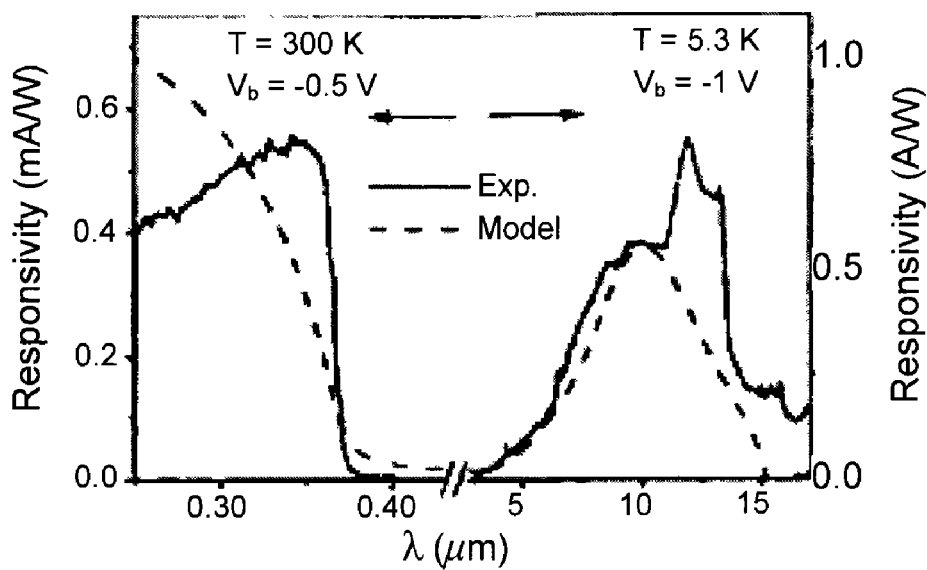
FIG. 23 illustrates experimental responsivities (solid line) of the detector in both UV and IR regions fitted to theoretically expected responses (dashed line)

FIG. 23 illustrates the experimental responsivities (solid line) of the detector in both UV and IR regions fitted to theoretically expected responses (dashed line). The calculation is based on a model[51] in which the complex permittivities for interband and intraband transitions are calculated using the model dielectric function[52] and the Lorentz-Drude theory, respectively. The light propagation in the structure is derived from the transfer matrix method. The responsivity is given by $R=\eta g_p q\lambda/hc$, where η is the total quantum efficiency, $g_p$ is the photoconductive gain, q is the electron charge, λ is the wavelength, h is Planck's constant, and c is the speed of light. The enhanced UV response near the band edge is probably due to high carrier concentration near the band edge, which is not taken into account in the model. The IR response comprises a free carrier response, which matches with the calculated response, and an impurity-related response.

The broad peak in the 11-13.6 µm region superimposed on the free carrier response is tentatively assigned to transitions related to carbon or nitrogen states. The reported donor ionization energy of carbon[53] falls in the 110-140 meV range, while the binding energy of N vacancy[54] is about 100 meV. Assuming that the two peaks observed at 11.9 µm (104.2 meV) and 13.3 µm (93.2 meV) are due to transitions of excited carbon states, the ionization energies were calculated to be 139 and 124 meV, respectively. These ionization energy values in the 140-110 meV range support the assumption that the corresponding transitions are carbon donor related impurity transitions.

As shown in FIG. 22b, a sharp peak at 54 µm (5.5 THz) is observed in the response spectrum. The corresponding energy for transitions leading to this peak is 23 meV. Based on earlier reports and investigations (Wang et al.[55] and Moore et al.[56]), it is concluded that the sharp response peak observed at 23 meV can be identified as 1s-2p± transition of Si donors in GaN. As evident from the results, GaN provides the advantage of developing a 5.5 THz (54 µm) detector, based on the 1s-2p± transition of Si in GaN. On the other hand, the Si impurity-related transition can lead to an increased dark current for a detector designed to operate in a shorter wavelength region. The dual-band detection approach as described herein can be used to develop dual-band detectors tailored to specific applications. By adjusting the material composition in the layers, the thresholds for the interband and intraband responses can be tailored separately. For example, in an AlGaN based detector, if the Al fraction is varied in both the emitter and barrier by the same amount, only the interband threshold will change, while the intraband threshold remains constant. Alternatively, varying only the emitter Al fraction, the intraband threshold could be varied without changing the interband threshold. Moreover, the resonant cavity effects can be used to tailor the IR response peak to the desired wavelength.

In summary, a GaN/AlGaN HEIWIP dual-band detector responding in UV and IR regions based on interband and intraband transitions in the structure is described. In one embodiment, the UV threshold is observed at 360 nm and the IR response is in the 8-14 µm region. By adjusting the material or the alloy fraction, the threshold of the interband and intraband responses can be tailored. Based on theoretical models and experimental data, the transitions leading to each band are explained. The detector also demonstrates the development of detectors responding in several wavelength regions by changing the material system.

Exemplary UV/IR Simultaneous Dual-Band Detector

Figure 24A:
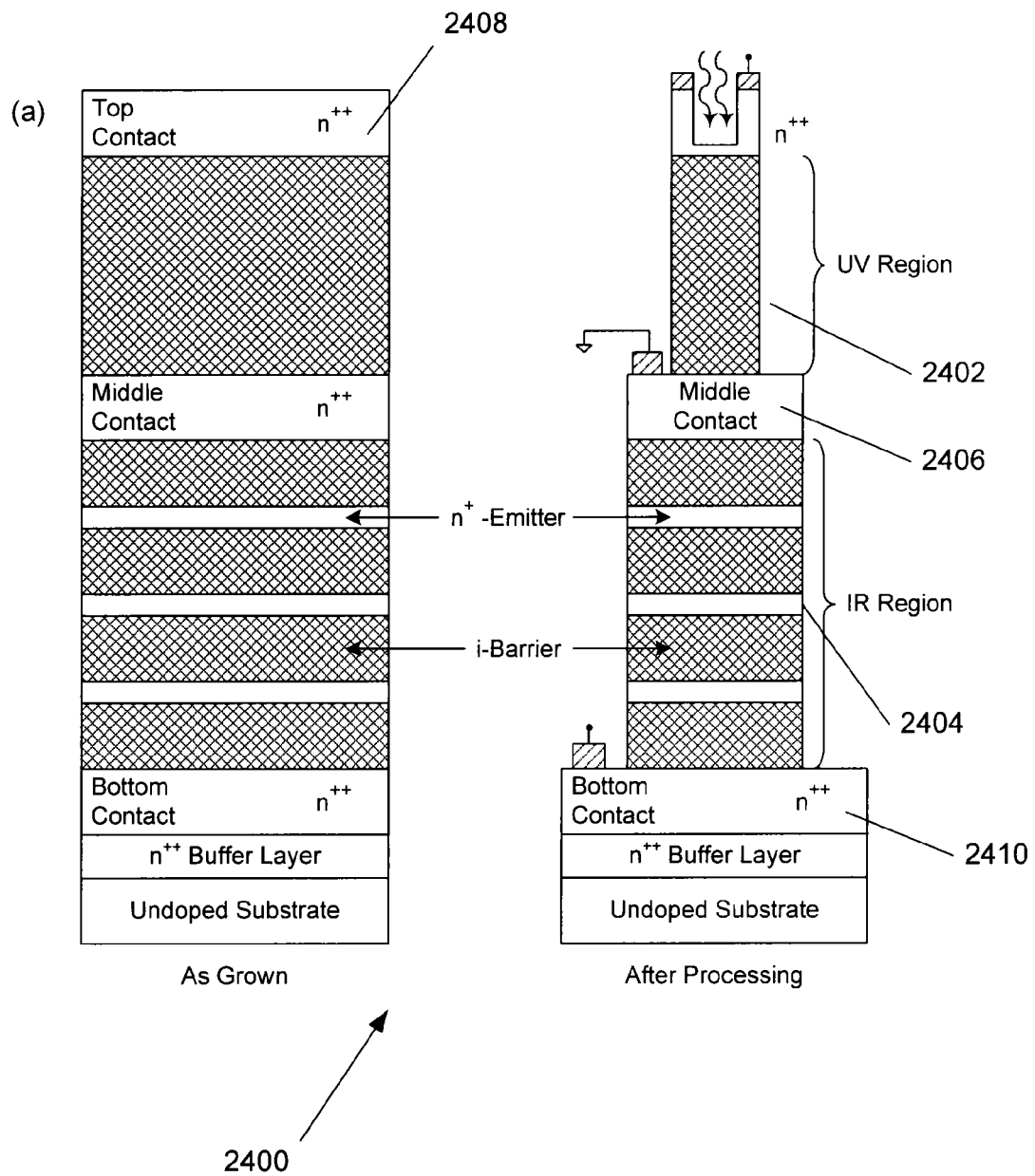
FIG. 24a illustrates the device structure as grown and after processing for an advanced dual band detector.
Figures 24B, 24C:
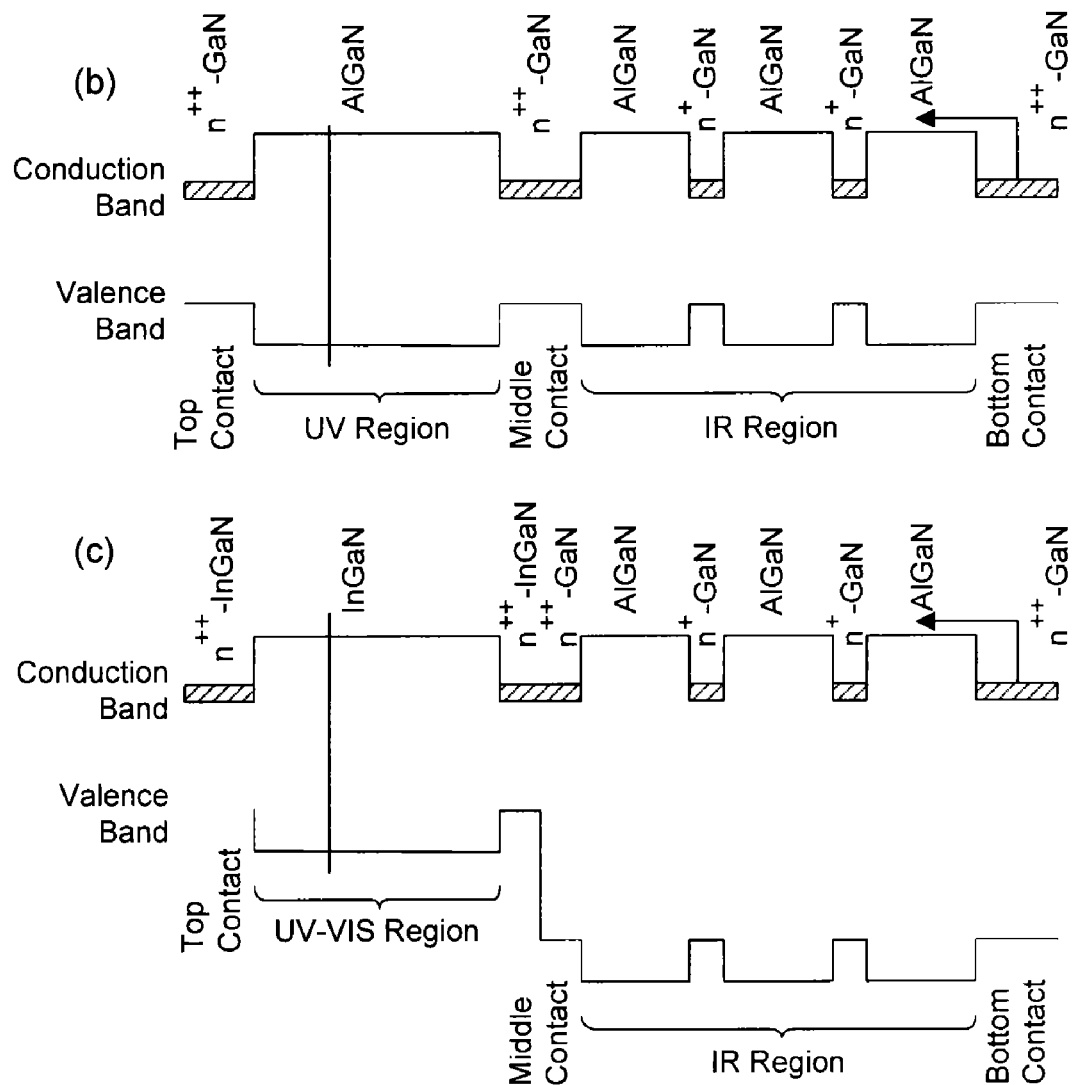

By adjusting the materials, it is possible to tune the interband threshold from the UV to NIR and the intraband threshold from the MIR to FIR. That is, the dual band approach with HEIWIP detectors can be observed in materials such as InN, InGaN, GaN, AlGaN, and AlN in various embodiments. InN could give an interband response in the NIR region, while InGaN could respond in the VIS-NIR regions. A UV interband response could be expected from an AlN based detector. Bias voltage could select the required operating regions, UV-IR, VIS-IR, or UV-VIS. Also, as the response for the two processes originates at different locations, it is possible to design a device that is capable of separately measuring both components simultaneously. The idea is to use three contacts to measure two separate currents simultaneously and then, from these currents, to separate the UV and IR contributions. This can be done by separating the UV and IR active regions of a detector into separate layers of the device. In addition to allowing simultaneous measurement of the UV and IR components, this approach allows the regions to be individually optimized for the specific wavelength ranges. FIGS. 24a, 24b and 24c illustrate an exemplary UV/IR dual-band detector according to an embodiment of the present invention. FIG. 24a illustrates the device structure as grown and after processing for the advanced dual band detector 2400. The top contact is etched down to the barrier on most of the device to reduce IR response in the UV region. FIG. 24b illustrates a band diagram for the dual band detector 2400. As shown, UV response is by interband excitation from the valence to conduction band and IR detection is by intraband absorption in the conduction band. The arrows in FIG. 24b indicate the carrier transitions (interband in the UV region and intraband in the IR region) which are used for detection. The middle contact 2406 serves both as the bottom contact for the UV region 2402 and the top contact for the IR region 2404. FIG. 24c illustrates another embodiment of a band diagram for a dual band detector using InGaN in the UV region 2402. The smaller band gap of InGaN extends the UV response into the visible range, giving a UV-VIS-IR detector.

As shown in FIG. 24a, the geometry for the detector 2400 is a two stack design in which the UV active region 2402 is grown on top of the IR active region 2404. An advantage of this design is that the band gap and band offset can be tailored separately in the two regions to make them respond only in the desired range. The device uses three contacts, with the middle contact 2406 common, and both the top 2408 and bottom contacts 2410 biased so that photoexcited electrons are transported to the common contact 2406. This allows separate biasing of the two regions to obtain optimal response.

In this device, an n-type HEIWIP detector is grown on a substrate followed by a layer of undoped AlGaN and then an n-type top contact. During processing, electrical connections are made to all three contact regions. The lower (HEIWIP) region serves as the IR detector with only a small UV response, while the upper region acts as a UV detector. By etching out most of the top emitter layer inside the ring contact, the IR response from the top layer can be minimized. Generally, it is anticipated that <2% of IR radiation is absorbed in the UV active region 2402. This response is used to calculate a correction to the response in the IR active region 2404 due to UV radiation which passes through the top layer and is absorbed in the IR active region 2404.

In the embodiment of FIG. 24a, the middle contact 2406 is used as a common ground and the top 2408 and bottom 2410 contacts for bias and to connect to the readout circuitry. The excited electrons in both regions sweep towards the middle contact 2406. This generally prevents current from spilling over from one region to the other, which would contaminate the response. By using this approach, the necessary corrections for the UV response measured in the IR region can be obtained from both the theoretical and experimental approaches.

An advantage of the design shown in FIGS. 24a-24c is that as the UV 2402 and IR 2404 active regions are separated, therefore they can be separately optimized for any desired ranges by using designs with AlGaN as both the emitter and barrier. Exemplary embodiments include a GaN/AlGaN detector, a device with $Al_xGa_{1-x}N$ emitters and $Al_yGa_{1-y}N$ barriers, and an embodiment where the short wavelength threshold is moved into the visible by using InGaN instead of AlGaN in the short wavelength active region, as shown in FIG. 24c.

For an exemplary GaN/AlGaN detector, when one threshold is selected, the other is also determined. For example, selecting the IR threshold as 15 µm with x=0.026 fixes the UV threshold at 358 nm. Adjusting x in this case can increase or decrease both the IR and UV thresholds simultaneously.

For an exemplary device with $Al_xGa_{1-x}N$ emitters and $Al_yGa_{1-y}N$ barriers, the thresholds could move freely such that the UV threshold (set by y) decreases slowly as y increases. Conversely, if y is fixed and x is adjusted, the IR threshold is varied without changing the UV threshold. Here increasing x increases the IR threshold. (Note that x<y in order to have IR response).

Figure 25A:
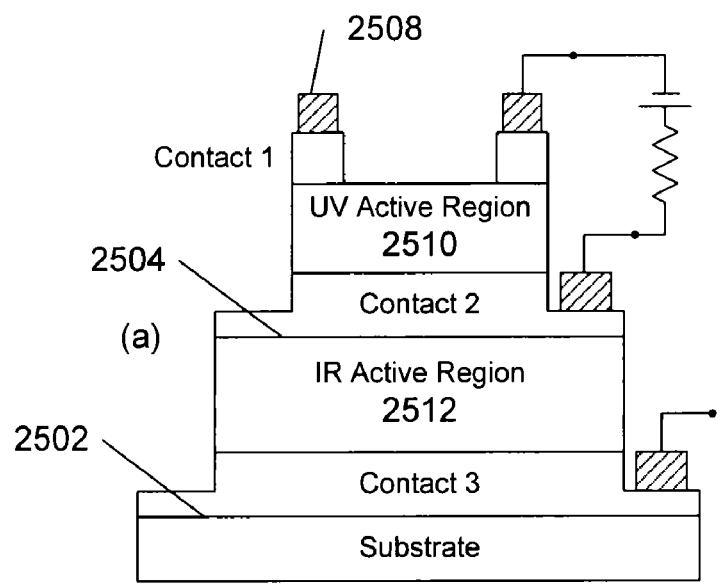
FIGS. 25a, 25b and 25c illustrate exemplary processing and measurement connections for an embodiment of a dual band detector configured for simultaneous measurements.
Figure 25B:
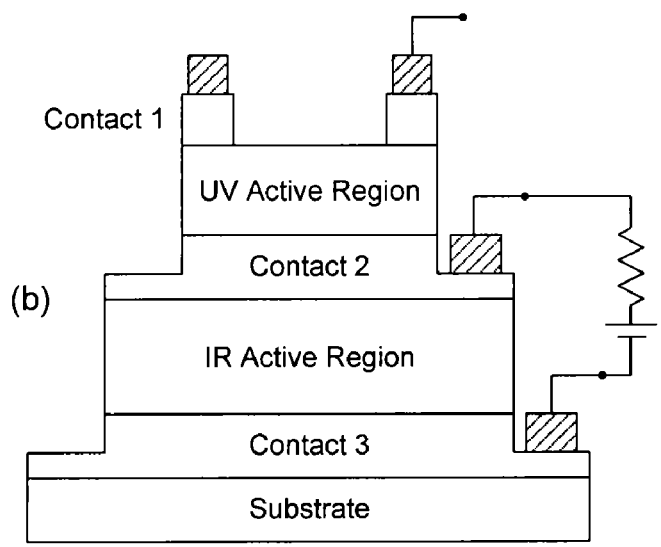
Figure 25C:
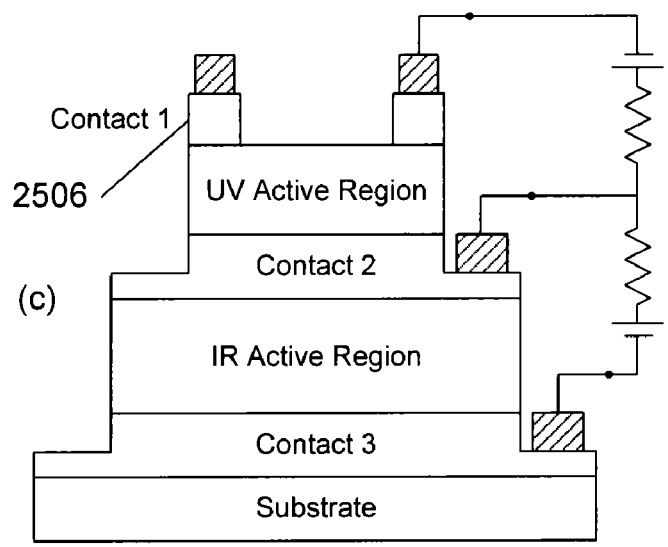

FIGS. 25a, 25b and 25c illustrate exemplary processing and measurement connections for an embodiment of a dual band detector configured for simultaneous measurements. FIG. 25a illustrates standard processing connected to measure only the UV active region. FIG. 25b illustrates standard processing connected to measure only the IR active region. FIG. 26c illustrates standard processing connected to allow measurements of both regions simultaneously. The detector processing as shown in FIGS. 25a, 25b, and 25c involves etching down to contact 3 2502 to produce isolated mesas. A portion of each mesa is etched down to contact 2 2504. Metal contacts 2508 are deposited onto all three contacts 2502, 2504, 2506. Finally the part of contact 1 2506 not covered by the metal 2508 is etched to a thin layer. This processing method allows either detector (UV and IR) to be measured separately, or both to be measured simultaneously allowing three different measurement configurations. When contacts 1 2506 and 2 2504 are connected as shown in FIG. 25a, only the UV-active region 2510 is measured. This approach may be used to optimize the UV response. When contacts 2 2504 and 3 2502 are connected as in FIG. 25b, only the IR active region 2512 is measured. This approach may be used to optimize the IR response. When contact 2 2504 is connected to both contacts 1 2506 and 3 2502, as shown in FIG. 25c, the UV 2510 and IR regions 2512 can be measured simultaneously. This approach effectively combines the connections of the previous two cases.

In the device 2400 of FIG. 24a, IR response is increased by using multiple emitter and barrier layers in the structure to increase the absorption, though it is to be appreciated that a detector having a single emitter and barrier layer are contemplated within the scope of this invention. For example, with a detector using 300 Angstrom $5 \times 10^{18}$ cm$^{-3}$ n-doped GaN emitters and 1000 Angstrom $Al_{0.07}Ga_{0.93}N$ barriers, increasing the number of periods from 5 to 25 increases calculated responsivity at 10 µm from 34 to 130 mA/W. The maximum value corresponds to ~60% absorption of the radiation reaching the IR active region so further improvements are contemplated within the scope of this invention as the absorption rate increases. The band gap offset in the heterostructure leads to traps for the minority carriers arising from the interband absorptions, reducing any UV response. In addition, if the UV active region is above the IR active region 2404, any UV radiation reaching the IR region 2404 passes through the entire UV active region 2402. The UV absorption in the UV active region 2402 is approximately near 100%, so the UV response in the a active region 2404 is negligible. Approximately 85% of the incident IR radiation passes through the UV active region 2402 and the middle contact (contact 2) to enter the IR active region 2404. The IR active region is then similar to the HEIWIP designs and can be optimized using the same basic approaches used in optimizing the HEIWIP detectors.

Figure 26:
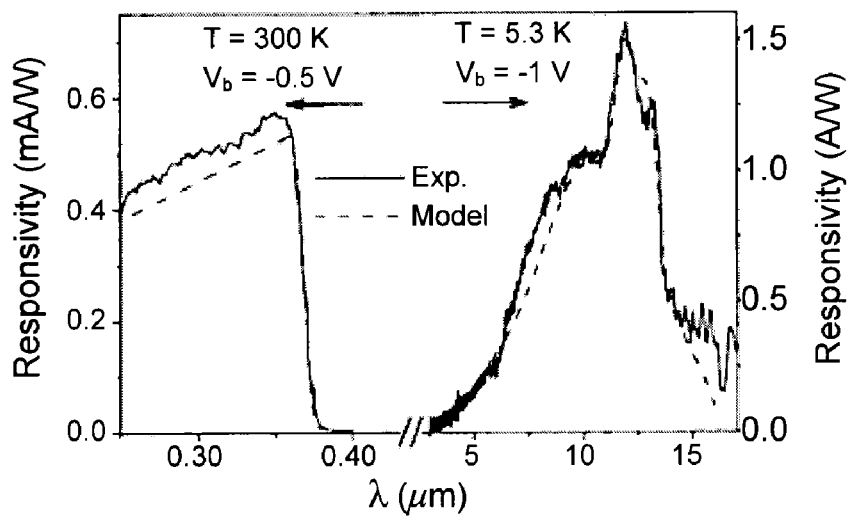
FIG. 26 illustrates calculated UV/IR responses of the detector as compared to those determined by experimentation of an actual detector.

FIG. 26 illustrates the calculated UV/IR responses of the detector as compared to those determined by experimentation of an actual detector.

Exemplary Si Dual-Band Homojunction Detector

Another embodiment according to the present invention is an Si dual-band detector configured to respond in both near- and very-long-wavelength-infrared regions. This embodiment comprises a p-type Si homojunction detector configured to respond in both the near- and very-long-wavelength-infrared (NIR and VLWIR) ranges. The detector comprises a $p^{++}$-Si top contact layer, a $p^+$-Si emitter, an undoped Si barrier, and a $p^{++}$-Si bottom contact layer grown on a Si substrate. Interband and intraband transitions lead to NIR and VLWIR responses, respectively. The responsivity, quantum efficiency, and detectivity at approximately −1 V bias and 4.6 K are ~0.024 A/W, 3.7%, and ~$1.7\times10^9$ cm $Hz^{1/2}$/W at approximately 0.8 µm, while they are approximately 1.8 A/W, 8.8%, and ~$1.2\times10^{11}$ cm $Hz^{1/2}$/W at approximately 25 µm, respectively. The background limited infrared performance temperature at ±0.9 V bias is approximately 25 K. The combination of NIR and VLWIR responses together has applicability in, for example, astronomy, where infrared technology plays a dominant role in observing celestial objects, the NIR response of the detector can be used to observe cooler red objects and VLWIR can detect cold objects such as comets, planets, etc.

Figures 27A, 27B:
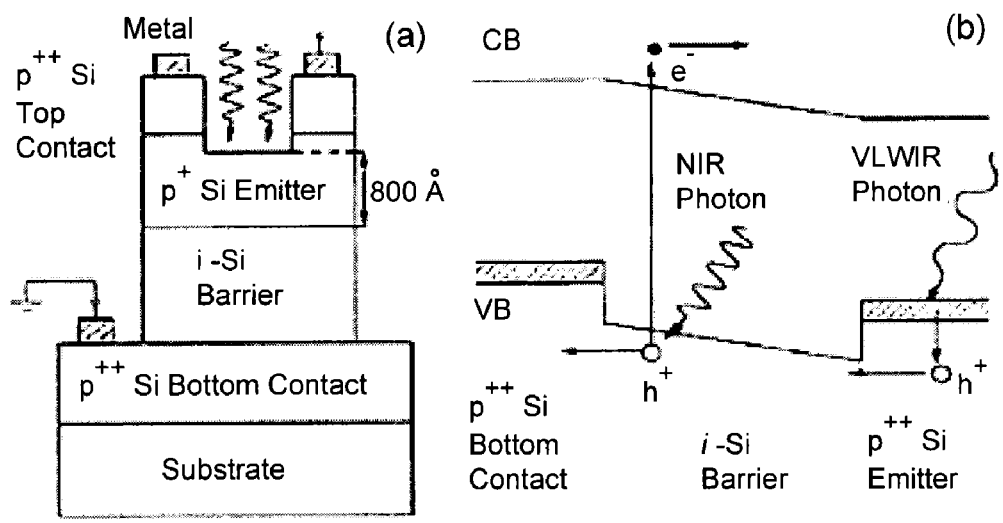
FIGS. 27a and 27b illustrate an exemplary embodiment of a Si dual-band detector and a band diagram showing the conduction and valence band profiles of the dual-band detector.

FIGS. 27a and 27b illustrate an exemplary embodiment of a Si dual-band detector and a band diagram showing the conduction and valence band profiles of the dual-band detector. The Si based HIWIP detector shown in FIG. 27a is grown by metalorganic chemical-vapor deposition on Si substrate and is comprised of a p-doped Si bottom contact, an undoped Si barrier, a p-doped Si emitter layer, and a p-doped Si top contact layer. Boron is used as the p-type dopant in this embodiment. The device was processed and a 400×400 µm² device was used for characterization. As shown in FIG. 27b, the dual-band detection is based on interband transitions in the undoped barrier (NIR), and intraband transition within the emitter (VLWIR). Incident NIR photons are absorbed by the Si barrier layer, and an electron-hole pair is generated. Excited carriers are then collected by the applied electric field and both electrons and holes contribute to the photocurrent. The wavelength threshold is determined by the band gap of the barrier material. The detection mechanism leading to VLWIR detection involves free carrier absorption in the emitter, followed by the internal photoemission of photoexcited carriers, and then the collection of carriers by the applied electric field at the contacts. When the emitter is doped above the Mott transition level, an impurity band is formed and the Fermi level goes below the valence band edge (for p type), making a metallic emitter layer. However, the Fermi level in the emitter still can be above the valence band edge of the barrier due to the band gap narrowing in the emitter from the high doping. The offset between the Fermi level in the emitter layer and the valence band edge of the barrier layer forms the interfacial workfunction ($\Delta$). If the shift of the valence band edge of the emitter with respect to that of the barrier due to band gap narrowing is $\Delta E_V$, and the Fermi level with respect to the valence band edge of the emitter is $E_F$, then $\Delta=\Delta E_V - E_F$.[15] The threshold wavelength $\lambda_0$ (in µm) is calculated by $1240/\Delta$, where $\Delta$ is in meV. Although the Si barrier is not intentionally doped, a slight doping is expected due to dopant migration from the emitter. These hydrogenic impurities give rise to a series of transitions leading to photoresponse peaks. [43]

Figures 29A, 29B:
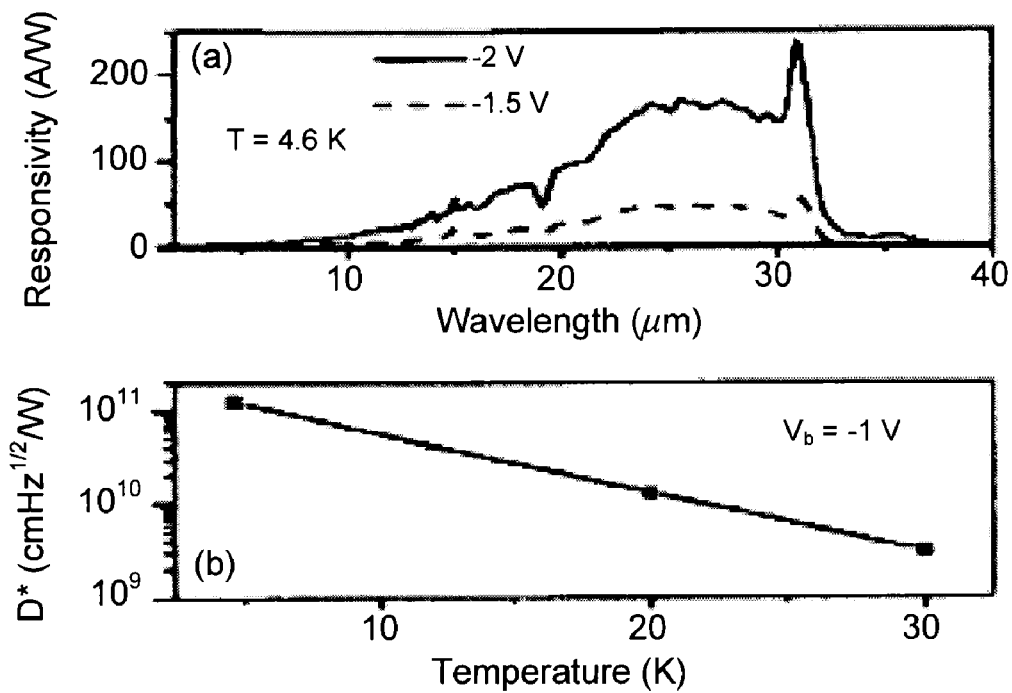
FIG. 29a is an exemplary illustration showing the effect of increased bias such that the detector has a responsivity of 157 A/W at 25 µm at −2 V bias, which translates to an efficiency-gain product of approximately 7.8.
FIG. 29b shows the variation of the detectivity with temperature at 25 µm at different temperatures and under −1 V bias.

The NIR response at −1 V bias shows a threshold at ~1.05 µm, which is in accordance with ~1.17 eV band gap of Si at 4.6 K, as shown in FIG. 29a. The two arrows in the figure mark the position of the $E1^{TO}$ and $E2^{TO}$ absorption bands that are due to TO-phonon assisted exciton transitions at the band edge.[44] $E1^{TO}$ is observed at 1.21 eV and the separation between $E1^{TO}$ and $E2^{TO}$ is less than 2 meV. Hence $E2^{TO}$ cannot be observed clearly in the photoresponse curve. A NIR responsivity of 0.024 A/W is obtained at 0.8 µm with a detectivity of ~$1.7\times10^9$ cm $Hz^{1/2}$/W at 0.8 µm under −1 V bias at 4.6 K.

Figures 28A, 28B, 28C:
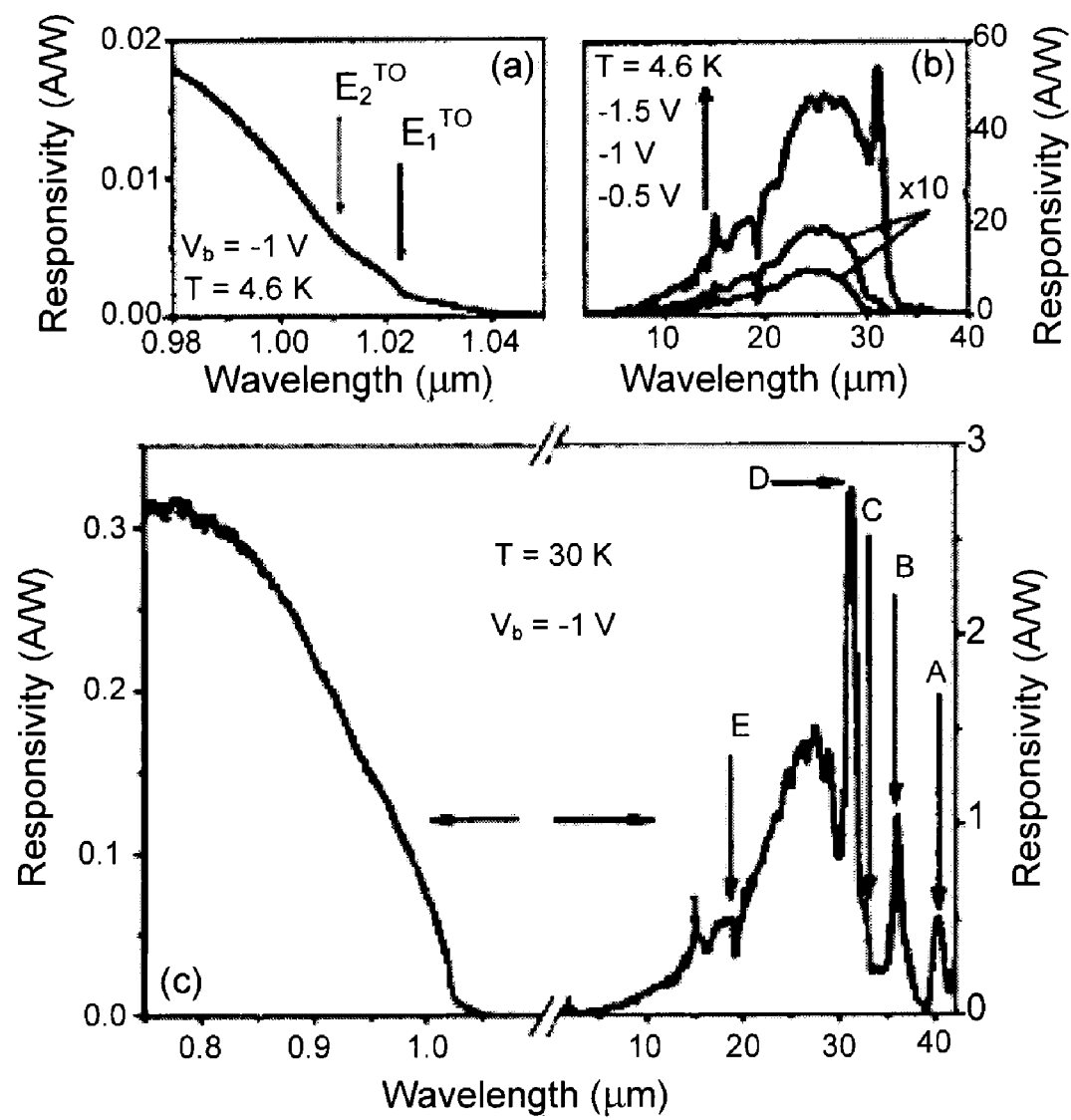
FIG. 28a is an exemplary illustration showing NIR response at −1 V bias, which shows a threshold at ~1.05 µm that is in accordance with ~1.17 eV bandgap of Si at 4.6 K.
FIG. 28b is the VLWIR response arising from intraband transitions at 4.6 K is in the range of 5-35 µm.
FIG. 28c illustrates an exemplary dual band response at T=30 K.

As shown in FIG. 28b, the VLWIR response arising from intraband transitions at 4.6 K is in the range of 5-35 µm. The threshold wavelength observed at −0.5 V bias is 32 µm, and the corresponding value of $\Delta=38.7$ meV is in good agreement with the theoretical model.[45] Arrhenious calculations based on the dark current also confirm this value of $\Delta$. The threshold wavelength increases with the applied bias, as shown in FIG. 28b. This is a result of decreasing $\Delta$ with increasing bias.[15] The photoresponse shows a strong bias dependence mainly due to field-assisted tunneling of photoexcited carriers. At 25 µm responsivity values at −0.5, −1, and −1.5 V biases are 0.90, 1.78, and 31.0 A/W, respectively. When the bias is increased further, a rapid improvement of the photoresponse can be observed, and FIG. 29a shows a responsivity of 157 A/W at 25 µm at −2 V bias, which translates to an efficiency-gain product of about 7.8. Highly sensitive NIR detectors with high internal gain have been observed previously. [46,47] Applying a high electric field across the structure enhances the process of impact ionization within the barrier, introducing a gain into the photocurrent. [48] This type of gain mechanism is possible if the barrier contains impurity atoms. The observation of impurity transition peaks to be discussed later is evidence for the existence of impurities in the barrier. Despite the high responsivity obtained at high bias voltages, the optimum detectivity observed is ~$1.5\times10^{11}$ cm $Hz^{1/2}$/W at −1 V bias. This is due to an increase of the noise current with bias. Moreover, FIG. 29b shows the variation of the detectivity with temperature at 25 µm under −1 V bias. This behavior of the detectivity with temperature is typical for most of infrared devices since the noise current increases with temperature.

The dual-band response has been obtained up to 30 K, as shown in FIG. 28c. At −1 V bias and 30 K, the responsivity, quantum efficiency, and detectivity at 0.8 µm are ~0.30 A/W, 46%, and ~$6.7\times10^8$ cm $Hz^{1/2}$/W, while at 25 µm they are 1.4 A/W, 7%, and ~$3.1\times10^9$ cm $Hz^{1/2}$/W, respectively. The quantum efficiency can be improved by using a multiperiod design and incorporating a resonant cavity[49] into the structure. The sharp peaks (labeled as A-D) superimposed on the free carrier response become dominant at 30 K. These peaks can be well fitted with the impurity transitions of boron in Si. The intensity of the transition increases with temperature[49] as the efficiency of the photothermal mechanism leading to the excitations increases with temperature. The enhanced response at 30 K and the vanishing of peak A (30.7 meV) at 4.6 K confirm that the relative intensity of the impurity peaks increases with temperature. Merlet et al.[43] compared the positions of the peaks reported by several other researchers. In FIG. 28c, peaks A, B, C, and D observed at 30.7, 34.4, 38.3, and 39.6 meV have been previously reported at 30.37, 34.50, 38.38, and 39.63 meV, respectively, by Merlet et al. The deviation of the energy values falls within the spectral resolution. A theoretical calculation of acceptor states of Si along with experimental results have been presented by Onton et al.[50] Furthermore, the small absorption dip around 19 μm is due to the optical phonon of Si reported at 63 meV (19.6 μm).

Figures 30A, 30B:
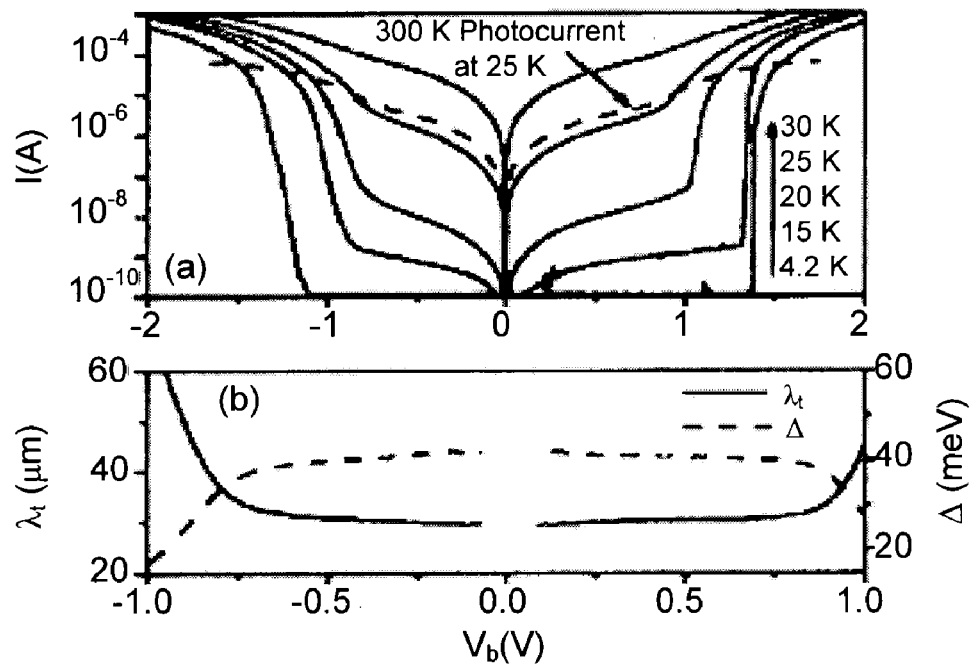
FIG. 30a is an illustration of dark current-voltage (IV) characteristics at different temperatures, also showing the 300 K background photocurrent measured at 25 K.
FIG. 30b shows the activation energy ($\Delta$) as was calculated by using the Arrhenius model, and the variation of the calculated $\Delta$ and the corresponding $\lambda_0$ with bias.

The dark current-voltage (IV) characteristics at different temperatures, and the 300 K background photocurrent measured at 25 K are shown in FIG. 30a. The current increases drastically due to hopping conduction[3] beyond a bias of +1 V (an electric field of 10 kV/cm). Based on the dark and the photocurrent measurements, performed using a closed cycle refrigerator with a cold shield at 70 K and under 60° field of view, the BLIP temperature at ±0.9 V is determined as 25 K. The activation energy ($\Delta$) was calculated by using the Arrhenius model, and the variation of the calculated $\Delta$ and the corresponding $\lambda_0$ with bias is shown in FIG. 30b. The calculated $\lambda_0$ is in good agreement with the observed threshold in the bias range from −0.75 to 0.75 V. Beyond this region, the dark current from tunneling dominates the thermal current, as seen in IV curves, and the Arrhenius model diverges, resulting in invalid values for $\Delta$.

In summary, a Si HIWIP dual-band detector responding in both NIR and VLWIR regions was reported. The NIR response can be explained in terms of interband transition in the undoped Si barrier layer in the structure. The NIR wavelength threshold corresponds to the band gap of Si. The VLWIR response arises due to free carrier absorption and intraband transitions within the structure. In addition, the impurity transitions of boron in Si were confirmed. Good performance of the detector demonstrates potential for applications, especially where detection in both the NIR and MIR/VLWIR regions is required.

Figure 31:
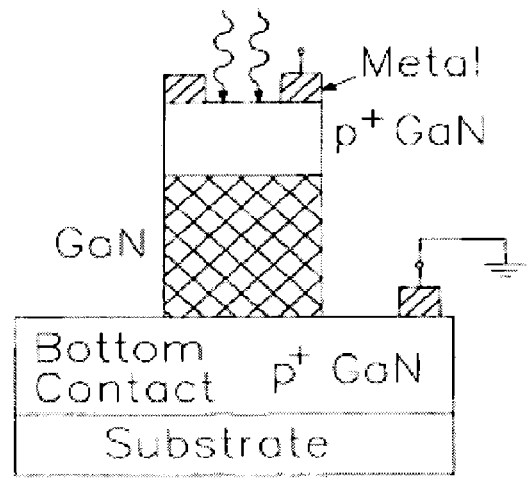
FIG. 31 is an exemplary embodiment of a dual band HIWIP detector which responds in both ultraviolet and infrared (UV and IR) regions comprising in the $p^+$-1-$p^+$ detector structure, the emitter is magnesium doped to $5 \times 10^{18}$ cm$^{-3}$, and a 1 µm thick GaN layer acts as the barrier followed by another highly p-doped GaN contact layer.

In yet another embodiment according to the present invention, a dual band HIWIP detector which responds in both ultraviolet and infrared (UV and IR) regions is described. An exemplary embodiment of such a detector is shown in FIG. 31. In the $p^+$-i-$p^+$ detector structure, the emitter is magnesium doped to $5\times10^{18}$ cm$^{-3}$, and a 1 μm thick GaN layer acts as the barrier followed by another highly p-doped GaN contact layer. The UV response is due to the interband transition in GaN barrier layer and the threshold wavelength expected at observed at 385 nm. The photons with energy above the band gap (UV) are absorbed in the barrier giving rise to a transition of carriers (electron-hole pair) between the conduction and valence band of the GaN barrier. The electron-hole pairs generated in the emitter would have to undergo internal photoemission before being collected. The intraband transition giving rise to IR response is expected to be observed up to 50 μm. Incident photons with energy below the band gap (IR), absorbed in the emitter layer (free carrier absorption), photoexcite carriers which then undergo internal photoemission across the barrier. The offset between the Fermi level in p-doped emitter layer and the valence band of GaN barrier is defined as the interfacial workfunction ($\Delta$) which determines the FIR threshold wavelength. The photoexcited carriers are finally swept out of the active region and collected at the contact by the applied electric field.

Exemplary GaN/AlGaN Dual-Band Heterojunction IR Detector

Another embodiment according to the present invention is a GaN/AlGaN heterojunction interfacial work function internal photoemission (HEIWIP) IR detector[51] that responds in the approximately 8-14 and 20-70 μM ranges. The wide band gap of GaN reduces interband tunneling relative to GaAs, and the higher effective mass reduces the thermal emission, leading to improved performance.

Figures 32A, 32B:
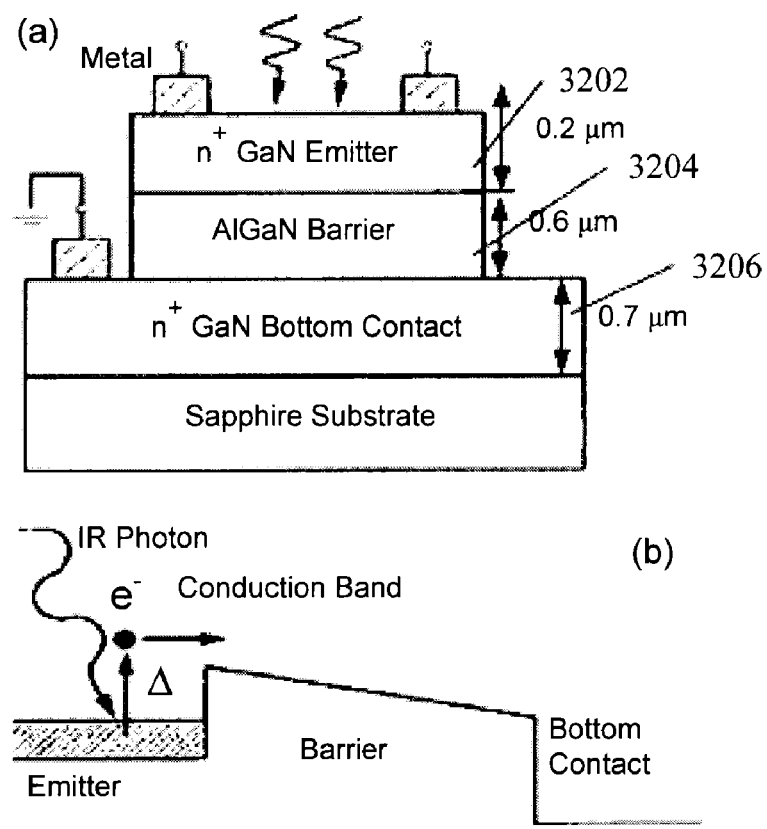

The HEIWIP structure was grown by metal-organic chemical-vapor deposition on a sapphire substrate. As shown in the embodiment of FIG. 32a, GaN/AlGaN HEIWIP structure is comprised of an n-doped GaN emitter layer 3202 (which also serves as the top contact in this embodiment), an undoped $Al_xGa_{1-x}N$ barrier layer 3204 with x of 0.026, and a n-doped GaN bottom contact 3206 layer. In this embodiment, Si is used as the n-type dopant, though it is to be appreciated that other elements or combination of elements may be used. In the exemplary embodiment of FIGS. 32a and b, the doping concentration of the GaN emitter 3202 is $5\times10^{18}$ cm$^{-3}$, while the GaN bottom contact 3206 is doped to $5\times10^{18}$ cm$^{-3}$. The AlGaN barrier 3204 is not intentionally doped. By design, the Al fraction of AlGaN is set to 0.026 in order to have a 14 μm wavelength threshold.

In FIG. 32b, the band diagram shows the conduction band profile. The band offset $\Delta$ determines the wavelength threshold. The band diagram indicates the conduction band profile and the transition of electrons leading to free carrier response. The detection mechanism[51] involves free carrier absorption in the emitter 3202, followed by internal photoemission of photoexcited carriers across the interfacial barrier, and then collection of carriers by the applied electric field at the contacts. The offset between the Fermi level in the emitter layer and the conduction band edge of the barrier layer forms the interfacial work function ($\Delta$), which arises due to band offset of different materials and band gap narrowing[4] of the highly doped emitter layer. The threshold wavelength $\lambda_0$ (in micrometers) is given by $1240/\Delta$, where $\Delta$ is in meV.

Figures 33A, 33B:
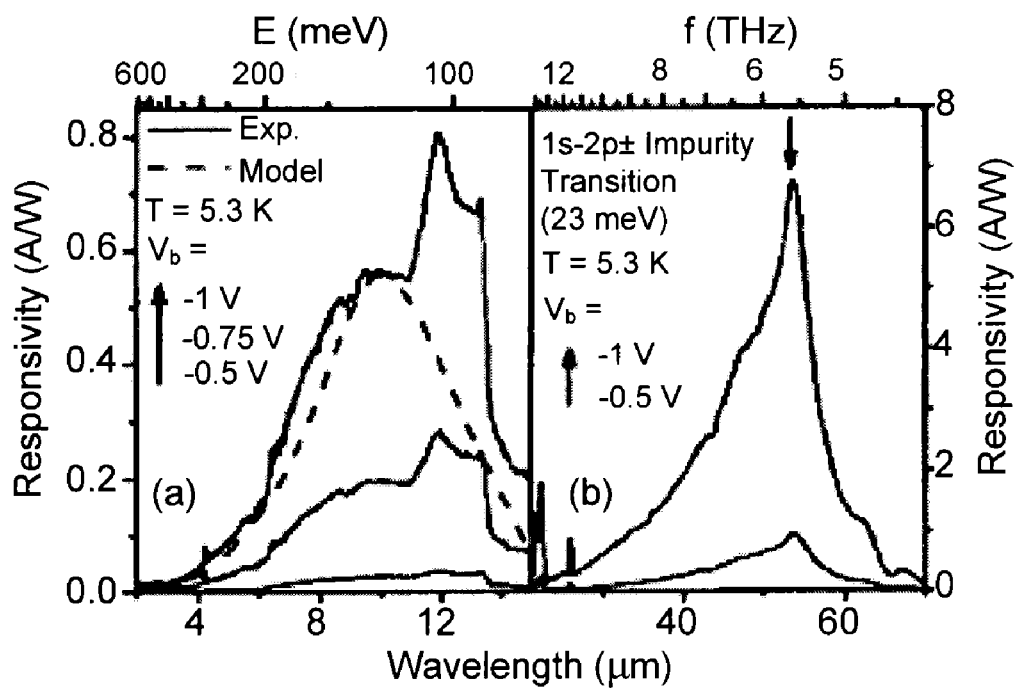
FIG. 33a shows the variation of the response of detector of FIG. 32a in the 8-14 µm range with bias at 5.3 K.
FIG. 33b illustrates a sharp peak that is observed at approximately 54 µm (5.5 THz) in the response of the detector of FIG. 32a, which may be identified as 1s-2p± transition of Si donors in GaN.

The variation of the detector response in the 8-14 μm range with bias at 5.3 K is shown in FIG. 33a. The calculated response at −1 V bias is also shown in the figure. The detector has a 14 μm zero response threshold ($\lambda_0$) with a peak at 12 μm. The reststrahlen absorption of GaN falls in the 14-20 μm region, reducing the photoresponse, as evident from the figure. The spectral measurements performed on several mesas confirm that the detector response is consistent. The response in the 8-14 μm region is due to free carrier absorption, as expected from theoretical calculations. The calculation is based on a model[51] in which the complex permittivity is calculated by the Lorentz-Drude theory, and the light propagation in the structure is derived from the transfer matrix method. The responsivity R is given by $R=\eta g_p q\lambda/hc$, where $\eta$ is the total quantum efficiency, $g_p$ is the photoconductive gain, q is the electron charge, $\lambda$ is the wavelength, h is Planck's constant, and c is the speed of light. The detector has a peak responsivity of 0.8 A/W and a detectivity of $2.5\times10^{10}$ Jones at 5.3 K. The responsivity decreases with decreasing bias, and zero response was observed at 0 V bias, confirming no photovoltaic effect exists. A similar but slightly weaker response is observed for the detector under forward bias. The photoconductive gains at −1, −0.75, and −0.5 V biases are 1.3, 0.7, and 0.4, respectively. The broad peak superimposed on the free carrier response in the 11-13.6 μm region may be due to carbon impurities or nitrogen vacancies. The reported donor ionization energy of carbon[53] falls in the 0.11-0.14 eV range, while the binding energy of N vacancy[54] is about 0.1 eV. As the donors in the barrier are widely scattered, they act as a hydrogenic atom, and the standard hydrogenic energy level model can be used to determine the location of absorption peaks associated with a given transition. Carbon can be unintentionally introduced into GaN during the growth, either as a donor at a Ga site or as an acceptor at a N site, mainly through the organic precursors. Assuming that the two peaks observed at 11.9 μm (104.2 meV) and 13.3 μm (93.2 meV) are due to transitions to the first impurity excited state, the ionization energies were calculated to be 139 and 124 meV, respectively. These ionization energy values in the 140-110 meV range support the assumption that the corresponding transitions are carbon donor related impurity transitions. Transitions related to carbon acceptors (0.89 eV of ionization energy)[53] fall out of the spectral range reported here (below 1.4 μm), although the carbon acceptors are preferred in GaN. [57] The measurements performed on different devices provide consistent results. For detectors with a threshold above 14 μm, these impurity transitions enhance the response. Detectors designed to have shorter thresholds (below 14 μm) operating at high temperatures do not show the expected performance at the designed temperature, because the thermal excitations take place through impurity states. However, to reduce the incorporation of carbon, which affects the IR detector response, alternative group III precursors may also be used.

As shown in FIG. 33b, a sharp peak at approximately 54 μm (5.5 THz) is observed. The corresponding energy for the transition leading to this peak is 23 meV. Researchers[55] have found the donor binding energy of Si in GaN to be 29 meV, and the transition from 1s to 2p± level occurs at 21.9 meV. Moore et al. [56] reported the 1s-2p± transition of Si in GaN at 23.3 meV and donor effective mass binding energy of 31.1 meV. Hence, the sharp response peak observed at 23 meV can be identified as 1s-2p± transition of Si donors in GaN. Infrared absorption measurement is a well known technique to identify the shallow impurities such as Si in GaN, which confirms the 1s-2p± transition of Si in GaN.

Figure 34:
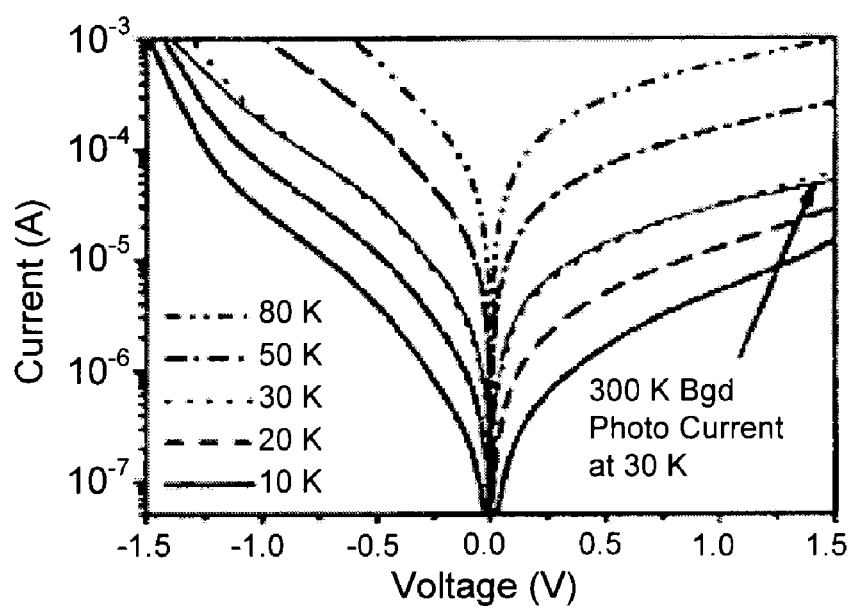
FIG. 34 illustrates the dark current-voltage (IV) characteristics of the embodiment of a detector shown in FIG. 32a at different temperatures, along with the 300 K background photocurrent curve measured at 30 K.
Figures 35A, 35B:
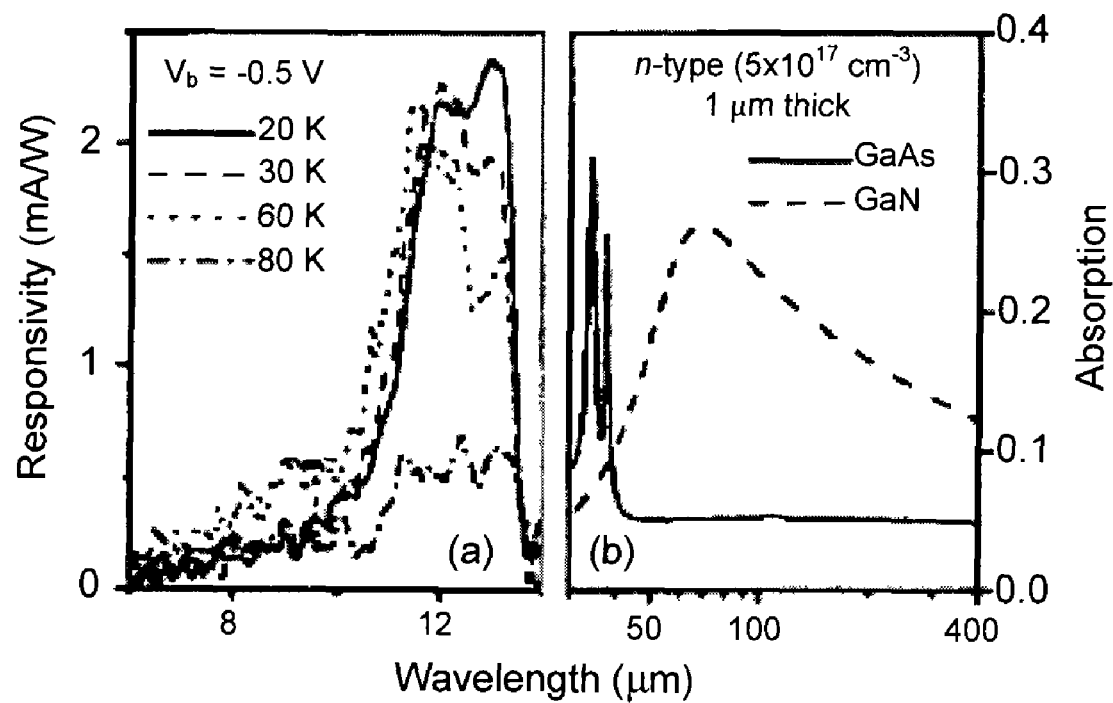
FIG. 35a shows the responsivity at 20, 30, 60, and 80 K under −0.5 V bias.
FIG. 35b shows a comparison between the absorption of FIR radiation by a 1 µm thick GaAs film and a GaN film, where both films are n-doped to a density of $5 \times 10^{17}$ cm$^{-3}$.

FIG. 34 illustrates the dark current-voltage (IV) characteristics of the embodiment of a detector shown in FIG. 32a at different temperatures, along with the 300 K background photocurrent curve measured at 30 K. Based on the dark and the photocurrent measurements, the background limited infrared performance (BLIP) temperature is obtained to be 30 K. The BLIP temperature may have been reduced due to the terahertz response which is visible at low temperature. The response below approximately 14 μm can be obtained up to approximately 80 K, and FIG. 35a shows the responsivity at 20, 30, 60, and 80 K under −0.5 V bias. The response at 80 K is weak, only showing the signature of the response in the 10-14 μm region.

A comparison between the absorption of FIR radiation by a 1 μm thick GaAs film and a GaN film is shown in FIG. 35b. Both films are n-doped to a density of $5 \times 10^{17}$ $cm^{-3}$. Due to higher absorption in the region above 40 μm, an embodiment of a GaN detector may also be used as a FIR detector. In one embodiment, the response of the single period detector shown in FIG. 32a is enhanced by incorporating multiperiods of emitter/barrier layers.

In summary, an embodiment of a GaN/AlGaN HEIWIP detector responding in the 8-14 and 20-70 μm regions is provided. The response in the 8-14 μm range is due to free carrier absorption in the structure, while the response at 54 μm (5.5 THz) is based on the 1s-2p± transition of Si donors in GaN. Some minor response contributions associated with impurity states in the system may also be observed.

Other aspects of the invention may be found from the attached drawings and other related materials such as text in the drawings, which are an integral part of this disclosure. Moreover, other embodiments of the invention will be apparent to those skilled in the art from consideration of the specification and practice of the invention disclosed herein. Additionally, more background information can be found in the attached list of references. It is intended that the specification and examples be considered as exemplary only.

While there has been shown preferred and alternate embodiments of the present invention, it is to be understood that certain changes can be made in the form and arrangement of the elements of the system and steps of the method as would be know to one skilled in the art without departing from the underlying scope of the invention as is particularly set forth in the Claims. Furthermore, the embodiments described above are only intended to illustrate the principles of the present invention and are not intended to limit the claims to the disclosed elements.

REFERENCES

[1] E. E. Haller, M. R. Hueschen, and P. L. Richards, Appl. Phys. Lett. 34, 495 (1979).
[2] I. C. Wu, J. W. Beeman, P. N. Luke, W. L. Hansen, and E. E. Haller, Appl. Phys. Lett. 58, 1431 (1991).
[3] A. G. U. Perera, W. Z. Shen, H. C. Liu, M. Buchanan, M. O. Tanner, and K. L. Wang, Appl. Phys. Lett. 72, 2307 (1998).
[4] W. Z. Shen, A. G. U. Perera, H. C. Liu, M. Buchanan, and W. J. Schaff, Appl. Phys. Lett. 71, 2677 (1997).
[5] A. G. U. Perera, Physics and Novel Device Applications of Semiconductor Homo Junctions, Academic Press, The Physics of Thin Films, 21, 1, 1995.
[6] A. G. U. Perera and W. Z. Shen, Opto-Electronics Review 7, 153 (1999).
[7] A. G. U. Perera, H. X. Yuan, S. K. Gamage, W. Z. Shen, M. H. Francombe, H. C. Liu, M. Buchanan, W. J. Schaff, J. Appl. Phys. 81, 3316 (1997).
[8] A. G. U. Perera, S. G. Matsik, H. C. Liu, M. Gao, M. Buchanan, W. J. Schaff and W. Yeo, Appl. Phys. Lett 77, 741 (2000).
[9] A. L. Korotkov, A. G. U. Perera, W. Z. Shen, H. C. Liu, M. Buchanan, submitted to Solid State Electronics.
[10] M. J. Kane, S. Millidge, M. T. Emeny, D. Lee, D. R. P. Guy and C. R. Whitehouse, in Intersubband transitions in Quantum Wells, E. Rosenchenr, B. Vinter and B. Levine, ed. Plenum, 1992.
[11] H. C. Liu, A. G. Steele, M. Buchanan, and Z. R. Wasilewski, J. Appl. Phys. 73, 2029 (1993).
[12] Keller et al., SPIE Proc. 4014, 86 (2000).
[13] Rosenthal et al., SPIE Proc. 4014, 156 (2000).
[14] D. Rosenthal, J. W. Bosman, N. Geis, L. Looney, A. Poglitsch, W. K. Park, W. Raab, A. Urban, SPIE Proc. 4014, 156 (2000).
[15] A. G. U. Perera, H. X. Yuan and M. H. Francombe, J. Appl. Phys. 77, 915 (1995).
[16] A. G. U. Perera, S. G. Matsik, B. Yaldiz, H. C. Liu, A. Shen, M. Gao, Z. R. Wasilewski and M. Buchanan, Appl. Phys. Lett. 78, 2241 (2001).
[17] D. G. Esaev, M. B. M. Rinzan, S. G. Matsik, and A. G. U. Perera, J. Appl. Phys. 96, 4588 (2004).
[18] D. J. Bergman and M. I. Stockman, Phys. Rev. Lett. 90, 027402 ("2003").
[19] M. I. Stockman, Phys. Rev. Lett. 93, 137404 (2004).
[20] M. L. Huberman, A. Ksendzov, A. Larsson, R. Terhune, and J. Maserjian, Phys. Rev. B 44, 1128 (1991).

[21] A. G. U. Perera, S. G. Matsik, M. B. M. Rinzan, A. Weerasekara, M. Alevli, H. C. Liu, M. Buchanan, B. Zvonkov, and V. Gavrilenko, Infrared Phys. Technol. 44, 347 (2003).

[22] F. D. Shepherd, Proc. SPIE 1735, 250 (1992).

[23] A. G. U. Perera, H. X. Yuan, S. K. Gamage, W. Z. Shen, M. H. Francombe, H. C. Liu, M. Buchanan, W. J. Schaff, J. Appl. Phys. 81, 3316 (1997).

[24] R. Mosca, P. Bussei, S. Franchi, P. Frigeri, E. Gombia, A. Camera, and M. Peroni, J. Appl. Phys. 93, 9709 (2003).

[25] A. Van der Ziel, *Noise in Solid State Devices and Circuits*, Wiley-Interscience, New York, 1986.

[26] Claire Gmachl, Hock M. Ng, and Alfred Y. Cho, Appl. Phys. Lett. 77, 334 (2000).

[27] S. Krishna, G. von Winckel, S. Raghavan and A. Stintz, G. Ariyawansa, S. G. Matsik and A. G. U. Perera, Appl. Phys. Lett. 83, 2745 (2003).

[28] S. Krishna, S. Raghavan, G. von Winckel, P. Rotella, A. Stintz, D. Le, C. Morath and S. W. Kennerly, Appl. Phys. Lett. 82, 2574 (2003).

[29] A. Amtout, S. Raghavan, P. Rotella, G. von Winckel, A. Stintz, and S. Krishna, J. Appl. Phys. 96, 3782 (2004).

[30] S. Chakrabarti, X. H. Su, P. Bhattacharya, G. Ariyawansa, and A. G. U. Perera, IEEE Photon. Technol. Lett. 17, 178 (2005).

[31] Arnold Goldberg, Parvez N. Uppal, Michael Winn, Infrared Physics & Technology 44, 427 (2003).

[32] H. C. Liu, P. H. Wilson, M. Lamm, A. G. Steele, Z. R. Wasilewski, Jianmerng Li, M. Buchanan, and J. G. Simmonsa, Appl. Phys. Lett. 64, 475 (1994).

[33] S. Raghavan, P. Rotella, A. Stintz, B. Fuchs, S. Krishna, C. Morath, D. A. Cardimona, and S. W. Kennerly, Appl. Phys. Lett. 81, 1369 (2002).

[34] S. Krishna, G. von Winckel, S. Raghavan and A. Stintz, G. Ariyawansa, S. G. Matsik and A. G. U. Perera, Appl. Phys. Lett. 83, 2745 (2003).

[35] S. Chakrabarti, X. H. Su, P. Bhattacharya, G. Ariyawansa, and A. G. U. Perera, IEEE Photon. Technol. Lett. 17, 178, (2005).

[36] W. Z. Shen, A. G. U. Perera, H. C. Liu, M. Buchanan, and W. J. Schaff, Appl. Phys. Lett. 71, 2677 (1997).

[37] D. G. Esaev, M. B. M. Rinzan, S. G. Matsik, A. G. U. Perera, H. C. Liu, B. N. Zhonkov, V. I. Gavrilenko, and A. A. Belyanin, J. Appl. Phys. 95, 512 (2003).

[38] Sadao Adachi, Physical Review B 35, 3454 (1986).

[39] M. D. Sturge, Physical Review 127, 768 (1962).

[40] S. K. Zhang, W. B. Wang, I. Shtau, F. Yun, L. He, H. Morko, X. Zhou, M. Tamargo, and R. R. Alfano, Appl. Phys. Lett. 81, 4862 (2002).

[41] F. Binet, J. Y. Duboz, E. Rosencher, F. Scholz, and V. Harle, Appl. Phys. Lett. 69, 1202 (1996).

[42] S. G. Matsik, M. B. M. Rinzan, D. G. Esaev, A. G. U. Perera, H. C. Liu, M. Buchanan, Appl. Phys. Lett. 84, 3435 (2004).

[43] F. Merlet, B. Pajot, Ph. Arcas, and A. M. Jean-Louis, Phys. Rev. B 12, 3297 (1975).

[44] P. J. Dean, Y. Yafet, and J. R. Haynes, Phys. Rev. 184, 837 (1969).

[45] D. G. Esaev, M. B. M. Rinzan, S. G. Matsik, A. G. U. Perera, H. C. Liu, B. N. Zhonkov, V. I. Gavrilenko, and A. A. Belyanin, J. Appl. Phys. 95, 512 (2004).

[46] F. Raissia and N. A. Sheenib, Sens. Actuators, A 104, 117 (2003).

[47] Aaron R. Hawkins, Thomas E. Reynolds, Derek R. England, Dubravko I. Babic, Mark J. Mondry, Klaus Streubel, and John E. Bowers, Appl. Phys. Lett. 68, 3692 (1996).

[48] M. D. Petroff, M. G. Stapelbroek, and W. A. Kleinhans, Appl. Phys. Lett. 51, 406 (1987).

[49] R. F. Kirkman, R. A. Stradling, and P. J. Lin-Chung, J. Phys. C 11, 419 (1978).

[50] A. Onton, P. Fisher, and A. K. Ramdas, Phys. Rev. 163, 686703 (1967).

[51] D. G. Esaev, M. B. M. Rinzan, S. G. Matsik, and A. G. U. Perera, J. Appl. Phys. 96, 4588 (2004).

[52] Takahiro Kawashima, Hisashi Yoshikawa, Sadao Adachi, Shunro Fuke, and Kohji Ohtsuka, J. Appl. Phys. 82, 3528 (1997).

[53] V. Bougrov, M. Levinshtein, S. Rumyantsev, and A. Zubrilov, in Properties of Advanced Semiconductor Materials GaN, AlN, InN, BN, SiC, SiGe, edited by M. E. Levinshtein, S. L. Rumyantsev, and M. S. Shur (Wiley, New York, 2001), p. 1.

[54] M. Sumiya, K. Yoshimura, K. Ohtsuka, and S. Fuke, Appl. Phys. Lett. 76, 2098 (2000)

[55] Y. J. Wang, R. Kaplan, H. K. Ng, K. Doverspike, D. K. Gaskill, T. Ikedo, I. Akasaki, and H. Amono, J. Appl. Phys. 79, 8007 (1996).

[56] W. J. Moore, J. A. Freitas, Jr., and R. J. Molnar, Phys. Rev. B 56, 12073 (1997).

[57] P. Bogusawski, E. L. Briggs, and J. Bernholc, Appl. Phys. Lett. 69, 233 (1996).

What is claimed is:

1. A dual band heterojunction photodetector comprising:
   a. at least N barriers, with N being an integer greater than or equal to one, each of said N barriers comprised of one or more Group III elements or Group V elements, and each said at least N barriers characterized by a barrier bandgap;
   b. at least one emitter and if N is greater than one then N emitters, each emitter comprised of one or more Group III or Group V elements doped with one or more Group II, Group IV, or Group VI elements to cause free carriers in the emitter to be responsive to optical signals and said at least one emitter characterized by an emitter bandgap different from that of the barrier bandgap, wherein each said at least one emitter is comprised of material different from that of the at least N barriers and the at least one emitter is substantially adjacent to at least one of said at least N barriers so as to form a heterojunction at each interface between an emitter and a barrier,
   wherein said N barriers and said N emitters are substantially between a first contact and a second contact, said first contact substantially in contact with one of said N barriers and said second contact substantially in contact with one of said N barriers and functioning as one of the emitters,
   c. a single top barrier substantially between the first contact and a third contact, said top barrier comprised of one or more Group III elements or Group V elements doped with one or more Group II, Group IV, or Group VI elements,
   wherein said first contact is a common contact and said second and third contacts are separately biased with respect to the common contact so that photoexcited electrons are transported to said first contact, and
   wherein said photodetector is configured for responsivity in at least first and second spectral bands, said first spectral band includes light having a wavelength in the ultraviolet (UV) range, and said second spectral band includes light having a wavelength in the infrared (IR) range.

2. The dual band heterojunction photodetector of claim 1, wherein each of said at least N barriers is comprised of AlGaN and said at least one emitter is comprised of GaN.

3. The dual band heterojunction photodetector of claim 1, wherein said at least one emitter is n-doped with Si.

4. The dual band heterojunction photodetector of claim 1, wherein said at least one emitter is n-doped with Si to a doping concentration of $5 \times 10^{18}$ cm$^{-3}$.

5. The dual band heterojunction photodetector of claim 1, wherein each of said at least N barriers are comprised of $Al_{0.026}Ga_{0.974}N$.

6. The dual band heterojunction photodetector of claim 1, wherein said photodetector is configured for responsivity in the first spectral band to include light having a UV threshold wavelength of 360 nanometers (nm).

7. The dual band heterojunction photodetector of claim 1, wherein said photodetector is configured for responsivity in the second spectral band to include light having an IR range beginning at 8 μm up to 14 μm, beginning and ending values included.

8. The dual band heterojunction photodetector of claim 1, wherein said photodetector is configured for responsivity in the first spectral band to include light having a UV threshold wavelength of 360 nm and in the second spectral band to include light having an IR range beginning at 8 μm up to 14 μm, beginning and ending values included.

9. The dual band heterojunction photodetector of claim 1, wherein said first contact is comprised of one or more Group III or Group V elements.

10. The dual band heterojunction photodetector of claim 1, wherein said first and second contacts are comprised of GaN.

11. The dual band heterojunction photodetector of claim 1, wherein said first and second contacts further comprise electrical connections.

12. The dual band heterojunction photodetector of claim 1, wherein each of said N barriers comprises a Group III element and a Group V element.

13. The dual band heterojunction photodetector of claim 1, wherein said top barrier is comprised of AlGaN.

14. The dual band heterojunction photodetector of claim 1, wherein said top barrier is comprised of InGaN.

15. The dual band heterojunction photodetector of claim 1, wherein a center portion of said third contact is etched down to said top barrier.

16. The dual band heterojunction photodetector of claim 1, wherein said third contact is comprised of one or more Group III or Group V elements.

17. The dual band heterojunction photodetector of claim 1, wherein said first, second, and third contacts further comprise electrical connections.

* * * * *